United States Patent
Lu

(10) Patent No.: US 11,196,329 B2
(45) Date of Patent: Dec. 7, 2021

(54) METHODS AND SYSTEMS FOR CONTROLLABLY MOVING ONE OR MORE MOVEABLE STAGES IN A DISPLACEMENT DEVICE

(71) Applicant: The University of British Columbia, Vancouver (CA)

(72) Inventor: Xiaodong Lu, Vancouver (CA)

(73) Assignee: The University of British Columbia, Vancouver (CA)

( * ) Notice: Subject to any disclaimer, the term of this patent is extended or adjusted under 35 U.S.C. 154(b) by 0 days.

(21) Appl. No.: 16/941,475

(22) Filed: Jul. 28, 2020

(65) Prior Publication Data

US 2021/0013787 A1   Jan. 14, 2021

Related U.S. Application Data

(63) Continuation of application No. 15/853,632, filed on Dec. 22, 2017, now Pat. No. 10,763,733, which is a
(Continued)

(51) Int. Cl.
*G05B 11/32* (2006.01)
*H02K 41/02* (2006.01)
(Continued)

(52) U.S. Cl.
CPC .............. *H02K 41/02* (2013.01); *H02K 3/26* (2013.01); *H02K 11/20* (2016.01); *H02P 25/06* (2013.01);
(Continued)

(58) Field of Classification Search
CPC .......... H02K 41/02; H02K 11/20; H02K 3/26; H02K 1/12; H02K 2201/18; H02P 25/06; H01L 21/68
See application file for complete search history.

(56) References Cited

U.S. PATENT DOCUMENTS

| 3,376,578 A | 4/1968 | Sawyer |
| 3,894,276 A | 7/1975 | Janssen |

(Continued)

FOREIGN PATENT DOCUMENTS

| CN | 201956875 | 8/2011 |
| EP | 1357434 | 10/2003 |

(Continued)

OTHER PUBLICATIONS

Xiaodong Lu et al.: 6D direct-drive technology for planar motion stages, CIRP Annals, vol. 61, No. 1, pp. 359-362, XP028511153, ISSN: 0007-8506, DOI: 10.1016/J.CIRP.2012.03.145.
(Continued)

*Primary Examiner* — Muhammad S Islam
(74) *Attorney, Agent, or Firm* — Todd A. Rattray; Oyen Wiggs Green & Mutala LLP

(57) ABSTRACT

Aspects of the invention provide methods and systems for moving moveable stages relative to a stator. A stator is operationally divided into multiple stator tiles. The movement of the one or more moveable stages is controlled by a plurality of controllers (each assigned particular control responsibilities). A controller is provided for each stator sector, where each stator sector comprises a group of one or more stator tiles. Controllers from neighboring sectors share various information to facilitate controllable movement of one or more moveable stages relative to the stator.

20 Claims, 29 Drawing Sheets

Related U.S. Application Data continuation of application No. PCT/CA2016/050790, filed on Jul. 6, 2016.

(60) Provisional application No. 62/189,131, filed on Jul. 6, 2015.

(51) Int. Cl.
  *H02P 25/06* (2016.01)
  *H02K 11/20* (2016.01)
  *H02K 3/26* (2006.01)
  *H01L 21/68* (2006.01)
  *B65G 54/02* (2006.01)
  *H02K 1/12* (2006.01)

(52) U.S. Cl.
  CPC .............. *B65G 54/02* (2013.01); *H01L 21/68* (2013.01); *H02K 1/12* (2013.01); *H02K 2201/18* (2013.01)

(56) References Cited

U.S. PATENT DOCUMENTS

| | | | |
|---|---|---|---|
| 4,535,278 A | 8/1985 | Asakawa | |
| 4,654,571 A | 3/1987 | Hinds | |
| 4,835,424 A | 5/1989 | Hoffman et al. | |
| 5,125,347 A * | 6/1992 | Takahashi | B60L 13/03 |
| | | | 104/298 |
| 5,196,745 A | 3/1993 | Trumper | |
| 5,334,892 A | 8/1994 | Chitayat | |
| 5,925,956 A | 7/1999 | Ohzeki | |
| 6,003,230 A | 12/1999 | Trumper et al. | |
| 6,005,309 A | 12/1999 | Chitayat | |
| 6,069,418 A | 5/2000 | Tanaka | |
| 6,072,251 A | 6/2000 | Markle | |
| 6,097,114 A | 8/2000 | Hazelton | |
| 6,144,119 A | 11/2000 | Hazelton | |
| 6,208,045 B1 | 3/2001 | Hazelton et al. | |
| 6,252,234 B1 | 6/2001 | Hazelton et al. | |
| 6,297,610 B1 * | 10/2001 | Bauer | H02P 6/04 |
| | | | 318/562 |
| 6,304,320 B1 | 10/2001 | Tanaka et al. | |
| 6,339,266 B1 | 1/2002 | Tanaka | |
| 6,437,463 B1 | 8/2002 | Hazelton et al. | |
| 6,441,514 B1 | 8/2002 | Markle | |
| 6,445,093 B1 | 9/2002 | Binnard | |
| 6,452,292 B1 | 9/2002 | Binnard | |
| 6,495,934 B1 | 12/2002 | Hayashi et al. | |
| 6,531,793 B1 | 3/2003 | Frissen et al. | |
| 6,590,355 B1 | 7/2003 | Kikuchi et al. | |
| 6,650,079 B2 | 11/2003 | Binnard | |
| 6,710,495 B2 | 3/2004 | Lipo et al. | |
| 6,720,680 B1 | 4/2004 | Tanaka | |
| 6,777,896 B2 | 8/2004 | Teng | |
| 6,835,941 B1 | 12/2004 | Tanaka | |
| 6,847,134 B2 | 1/2005 | Frissen et al. | |
| 6,876,105 B1 * | 4/2005 | Faizullabhoy | H02K 41/03 |
| | | | 310/12.19 |
| 6,879,063 B2 | 4/2005 | Frissen et al. | |
| 6,885,430 B2 | 4/2005 | Tanaka et al. | |
| 6,949,844 B2 | 9/2005 | Cahill et al. | |
| 6,987,335 B2 | 1/2006 | Korenaga | |
| 7,025,005 B2 | 4/2006 | Shinozaki et al. | |
| 7,057,370 B2 | 6/2006 | Touzov | |
| 7,075,198 B2 | 7/2006 | Korenaga | |
| 7,084,534 B2 | 8/2006 | Ohishi | |
| 7,170,241 B1 * | 1/2007 | Faizullabhoy | H02P 25/06 |
| | | | 318/135 |
| 7,199,493 B2 | 4/2007 | Ohishi | |
| 7,224,252 B2 | 5/2007 | Meadow, Jr. et al. | |
| 7,227,284 B2 | 6/2007 | Korenaga | |
| 7,436,135 B2 | 10/2008 | Miyakawa | |
| 7,550,890 B2 | 6/2009 | Kloeppel et al. | |
| 7,696,653 B2 | 4/2010 | Tanaka | |
| 7,808,133 B1 | 10/2010 | Widdowson et al. | |
| 7,948,122 B2 | 5/2011 | Compter et al. | |
| 8,031,328 B2 | 10/2011 | Asano et al. | |
| 8,046,904 B2 | 11/2011 | Kloeppel et al. | |
| 8,129,984 B2 | 3/2012 | Hosek et al. | |
| 8,134,688 B2 | 3/2012 | Shibazaki | |
| 8,384,317 B2 | 2/2013 | Shikayama et al. | |
| 8,593,016 B2 | 11/2013 | Pelrine et al. | |
| 8,686,602 B2 | 4/2014 | Pelrine et al. | |
| 8,736,133 B1 | 5/2014 | Smith et al. | |
| 9,030,057 B2 | 5/2015 | Binnad et al. | |
| 9,202,719 B2 | 12/2015 | Lu et al. | |
| 9,685,849 B2 | 6/2017 | Lu et al. | |
| 9,748,886 B1 | 8/2017 | McDonald et al. | |
| 2002/0149270 A1 | 10/2002 | Hazelton | |
| 2002/0149271 A1 | 10/2002 | Bartolotti | |
| 2002/0180395 A1 | 12/2002 | Binnard | |
| 2003/0085627 A1 | 5/2003 | Lipo et al. | |
| 2004/0007920 A1 | 1/2004 | Teng | |
| 2004/0140780 A1 | 7/2004 | Cahill et al. | |
| 2004/0263108 A1 * | 12/2004 | Lim | B23Q 1/621 |
| | | | 318/640 |
| 2005/0001579 A1 | 1/2005 | Touzov | |
| 2005/0090902 A1 | 4/2005 | Masini | |
| 2005/0093378 A1 | 5/2005 | Ohishi | |
| 2005/0194843 A1 | 9/2005 | Korenaga | |
| 2005/0194918 A1 | 9/2005 | Takeuchi | |
| 2006/0175993 A1 | 8/2006 | Shibata et al. | |
| 2006/0214518 A1 | 9/2006 | Ohishi | |
| 2007/0035267 A1 | 2/2007 | Gao et al. | |
| 2007/0046127 A1 | 3/2007 | Kloeppel et al. | |
| 2007/0046221 A1 | 3/2007 | Miyakawa | |
| 2007/0145831 A1 | 6/2007 | Antonius Theodorus Dams | |
| 2008/0024038 A1 * | 1/2008 | Chen | H02N 10/00 |
| | | | 310/317 |
| 2008/0142733 A1 * | 6/2008 | Zywno | H01L 21/68771 |
| | | | 250/491.1 |
| 2008/0203828 A1 | 8/2008 | Cornelis et al. | |
| 2008/0285005 A1 | 11/2008 | Gery et al. | |
| 2008/0290741 A1 | 11/2008 | Cardon et al. | |
| 2009/0058199 A1 | 3/2009 | Ito | |
| 2009/0195195 A1 | 8/2009 | Huang | |
| 2009/0251678 A1 | 10/2009 | Ohishi | |
| 2009/0315413 A1 | 12/2009 | Iwatani et al. | |
| 2010/0090545 A1 | 4/2010 | Binnard et al. | |
| 2010/0167556 A1 | 7/2010 | Totsu et al. | |
| 2010/0238425 A1 | 9/2010 | Binnard | |
| 2010/0253930 A1 | 10/2010 | Ito | |
| 2011/0050007 A1 | 3/2011 | Kubo | |
| 2011/0062901 A1 | 3/2011 | Busch | |
| 2011/0101896 A1 | 5/2011 | Shikayama et al. | |
| 2012/0113405 A1 | 5/2012 | Yang et al. | |
| 2012/0127447 A1 | 5/2012 | Yang et al. | |
| 2012/0139455 A1 | 6/2012 | Tojo et al. | |
| 2012/0300186 A1 | 11/2012 | Butler et al. | |
| 2013/0140372 A1 | 6/2013 | Mahadeswaraswamy et al. | |
| 2013/0164687 A1 | 6/2013 | Binnard et al. | |
| 2013/0241575 A1 | 9/2013 | Finkler | |
| 2014/0285122 A1 | 9/2014 | Lu et al. | |
| 2015/0097498 A1 | 4/2015 | Hemati et al. | |
| 2015/0137624 A1 | 5/2015 | Wu et al. | |
| 2015/0338750 A1 | 11/2015 | Yang et al. | |
| 2016/0065043 A1 | 3/2016 | Lu et al. | |
| 2016/0161288 A1 | 6/2016 | Lu | |
| 2018/0212481 A1 | 7/2018 | Semken et al. | |

FOREIGN PATENT DOCUMENTS

| | | |
|---|---|---|
| JP | 4008006642 | 1/1996 |
| JP | 2002112526 | 4/2002 |
| JP | 2003209963 | 7/2003 |
| JP | 2004047981 | 2/2004 |
| JP | 2004254489 | 9/2004 |
| JP | 2012160408 | 8/2012 |
| TW | 201330485 | 7/2013 |
| WO | 2001018944 | 3/2001 |
| WO | 20050909202 | 9/2005 |
| WO | 2013059934 | 5/2013 |
| WO | 2015017933 | 2/2015 |
| WO | 2015179962 | 12/2015 |

(56) References Cited

FOREIGN PATENT DOCUMENTS

| WO | 2015184553 | 12/2015 |
| WO | 2015188281 | 12/2015 |
| WO | 2016012157 | 1/2016 |
| WO | 2016012158 | 1/2016 |
| WO | 2016012159 | 1/2016 |
| WO | 2016012160 | 1/2016 |
| WO | 2016012171 | 1/2016 |
| WO | 2016091441 | 6/2016 |

OTHER PUBLICATIONS

Cho et al., "Magnetic Field Analysis of 2-D Permanent Magnet Array for Planar Motor", IEEE Tran. On Magnetics, 2001, vol. 37 No. 5, pp. 3762-3766.

Filho, A.F.F., "Investigation of the Forces Produced by a New Electromagnetic Planar Actuator", Electric Machines and Drives Conference, IEMDC 2001. IEEE International, pp. 8-13.

Filho, A.F., "Analysis of a DC XY-Actuator", XIX International Conference on Electrical Machines—ICEM 2010, Rome.

Filho, A.F., "Development of a novel planar actuator", Ninth International Conference on Electrical Machines and Drives, Conference Publication No. 468, 1999.

Fujii et al., "X-Y Linear Synchronous Motors Without Force Ripple and Core Loss for Precision Two-Dimensional Drives", IEEE Transactions on Magnetics, vol. 38, No. 5, Sep. 2002.

Buckley et al., "Step-and-scan lithography using reduction optics", J. Vae. Sci. Technol. B 7 (6), Nov./Dec. 1989.

Hesse et al., "Interferometric Controlled Planar Nanopositioning System With 100 MM Circular Travel Range", ASPE 2011 Annual Meeting, Denver, Co.

Tomita et al., "Study on a surface-motor driven precise positioning system", Journal of Dynamic Systems, Measurement, and Control Sep. 1995, vol. 117/311-319.

Ueda et al., "A planar actuator with a small mover traveling over large yaw and translational dispalcements", IEEE Transactions on Magnetics, vol. 44, No. 5, May 2008.

Kajiyama et al., "Development of ironless type surface motor", XIX International Conference on Electrical Machines—ICEM 2010, Rome.

Shinno et al., "A Newly Developed Linear Motor-Driven Aerostatic X-Y Planar Motion Table System for Nano-Machining", Annals of the CIRP, 2007, 56/1:369-372.

Gao et al., "A surface motor-driven planar motion stage integrated with an XYθZ surface encoder for precision positioning", Precision Engineering, 2004, 28/3:329-337.

In et al., "Design of a planar-type high speed parallel mechanism positioning platform with the capability of 180 degrees orientation", Annals of the CIRP, 2008, 57/1:421-424.

Lee et al., "Dynamic Modeling and Control of a Ball-Joint-Like Variable-Reluctance Spherical Motor", Journal of Dynamic Systems, Measurement, and Control, 1996, 118/1:29-40.

Weck et al., "Design of a Spherical Motor with Three Degrees of Freedom", Annals of the CIRP, 2000, 49/1:289-294.

Hollis et al., "A six-degree-of-freedom magnetically levitated variable compliance fine-motion wrist: Design, modeling, control", IEEE Trans. Robot. Automat, 1991, 7/3:320-332.

Verma et al., "Six-axis nanopositioning device with precision magnetic levitation technology", IEEE Tran. On Mechatronics, 2004, 9/2:384-391.

Kim et al., "High-precision magnetic levitation stage for photolithography", Precision Engineering, 1998, 22/2:66-77.

Holmes et al., "The Long-Range Scanning Stage: a Novel Platform for Scanned-Probe Microscopy", Precision Engineering, 2000, 24/3:191-209.

Etxaniz et al., "Magnetic Levitated 2D Fast Drive", IEEJ Transactions on Industry Applications, 2006, 126/12:1678-1681.

Compter, J., "Electro-dynamic planar motor", Precision Engineering, 2003, 28/2: 171-180.

Jansen et al., "Modeling of magnetically levitated planar actuators with moving magnets", IEEE Tran. Magnetic, 2007, 43/1:15-25.

Trumper et al., "Magnet arrays for synchronous machines", IEEE Industry Applications Society Annual Meeting, 1993, 1:9-18.

Jansen et al., "Magnetically Levitated Planar Actuator with Moving Magnets", IEEE Tran. Ind. App.,vol. 44, No. 4, 2008.

Kim, W.J., "High-Precision Planar Magnetic Levitation", Massachusetts Institute of Technology, Jun. 1997.

Jansen, J.W., "Magnetically levitated planar actuator with moving magnets: Electromechanical analysis and design", IOP-EMVT, SenterNovem, an agency of the Dutch Ministry of Economic Affairs, 2007.

Khan et al., "A Long Stroke Electromagnetic XY Positioning Stage for Micro Applications", IEEE/ASME Transactions on Mechatronics, vol. 17, No. 5, Oct. 2012, pp. 866-875.

* cited by examiner

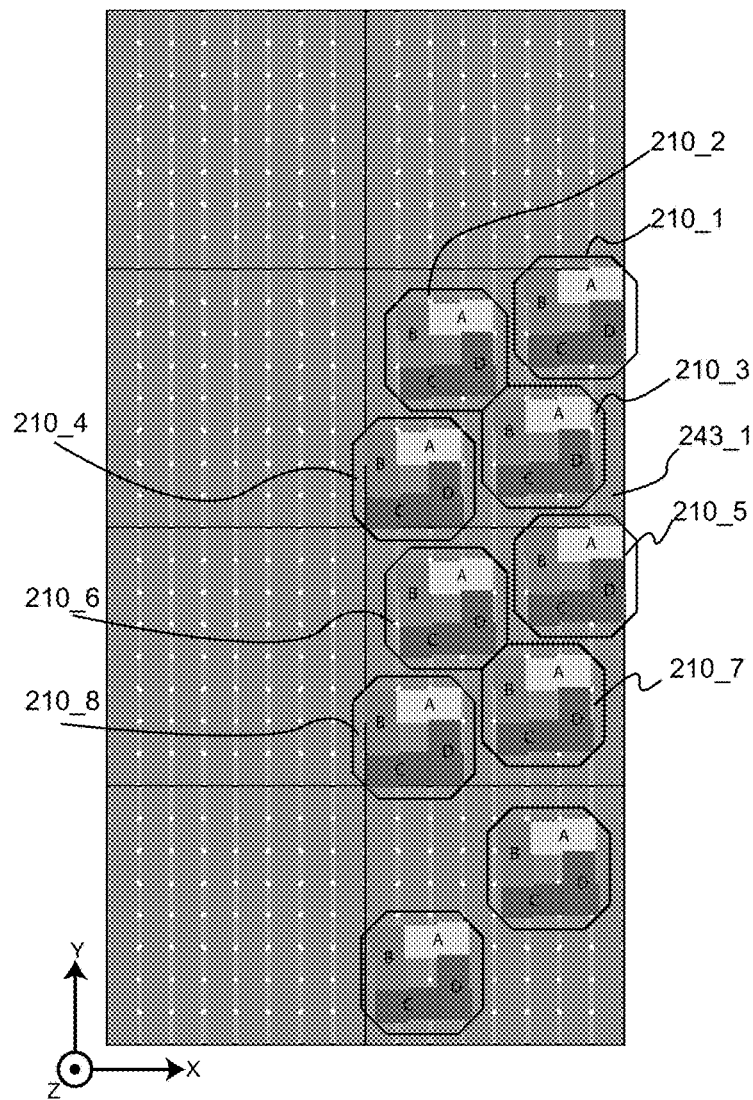
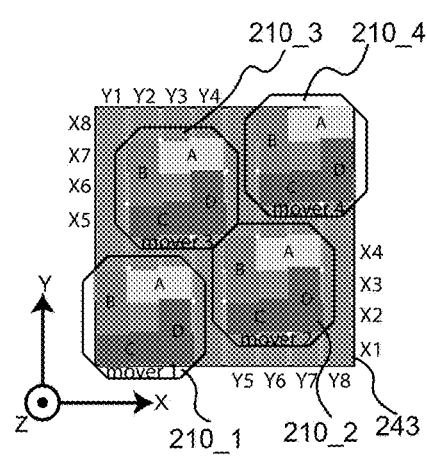
FIGURE14A
FIGURE14B

METHODS AND SYSTEMS FOR CONTROLLABLY MOVING ONE OR MORE MOVEABLE STAGES IN A DISPLACEMENT DEVICE

RELATED APPLICATIONS

This application is a continuation of U.S. application Ser. No. 15/853,632 filed 22 Dec. 2017 and entitled METHODS AND SYSTEMS FOR CONTROLLABLY MOVING ONE OR MORE MOVEABLE STAGES IN A DISPLACEMENT DEVICE, which in turn is a continuation of Patent Cooperation Treaty (PCT) application No. PCT/CA2016/050790 having an international filing date of 6 Jul. 2016 and entitled METHODS AND SYSTEMS FOR CONTROLLABLY MOVING ONE OR MORE MOVEABLE STAGES IN A DISPLACEMENT DEVICE, which in turn claims priority from, and the benefit under 35 USC 119 of, U.S. application Ser. No. 62/189,131 filed 6 Jul. 2015 and entitled METHODS AND SYSTEMS FOR CONTROLLABLY MOVING MULTIPLE MOVEABLE STAGES IN A DISPLACEMENT DEVICE. All of the applications referred to in this paragraph are hereby incorporated herein by reference in their entireties.

TECHNICAL FIELD

The invention relates to displacement devices. Particular embodiments provide systems and corresponding methods for moving multiple moveable stages relative to a stator.

BACKGROUND

Motion stages (XY tables and rotary tables) are widely used in various manufacturing, inspection and assembling processes. A common solution currently in use achieves XY motion by stacking two linear stages (i.e. a X-stage and a Y-stage) together via connecting bearings.

A more desirable solution involves having a single moving stage capable of XY motion, eliminating additional bearings. It might also be desirable for such a moving stage to be able to provide at least some Z motion. Attempts have been made to design such displacement devices using the interaction between current-carrying coils and permanent magnets. Examples of efforts in this regard include the following: U.S. Pat. Nos. 6,003,230; 6,097,114; 6,208,045; 6,441,514; 6,847,134; 6,987,335; 7,436,135; 7,948,122; US patent publication No. 2008/0203828; W. J. Kim and D. L. Trumper, High-precision magnetic levitation stage for photolithography. *Precision Eng.* 22 2 (1998), pp. 66-77; D. L. Trumper, et al, "Magnet arrays for synchronous machines", IEEE Industry Applications Society Annual Meeting, vol. 1, pp. 9-18, 1993; and J. W. Jansen, C. M. M. van Lierop, E. A. Lomonova, A. J. A. Vandenput, "Magnetically Levitated Planar Actuator with Moving Magnets", IEEE Tran. Ind. App., Vol 44, No 4, 2008.

More recent techniques for implementing displacement devices having a moveable stage and a stator are described in:

PCT application No. PCT/CA2012/050751 (published under WO/2013/059934) entitled DISPLACEMENT DEVICES AND METHODS FOR FABRICATION, USE AND CONTROL OF SAME; and
PCT application No. PCT/CA2014/050739 (published under WO/2015/017933) entitled DISPLACEMENT DEVICES AND METHODS AND APPARATUS FOR DETECTING AND ESTIMATING MOTION ASSOCIATED WITH SAME.

There is a general desire to provide displacement devices having characteristics that improve upon those known in the prior art. One area where there is room for improvement over existing displacement devices is in the controllable movement of multiple (two or more) moveable stages in a displacement device (e.g. relative to a single stator). It will be appreciated that there are multiple applications where it may be desirable (e.g. for efficiency or any other reasons) why it might be advantageous to be able to move multiple moveable stages in a displacement device. A challenge associated with controllably moving multiple moveable stages in a displacement device involves cross-coupling between the forces generated to move the multiple moveable stages. For example, forces generated by the displacement device to move a first moveable stage may cross-couple into one or more other moveable stages. There is a desire to move multiple moveable stages in a displacement device.

The foregoing examples of the related art and limitations related thereto are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIGS. 14A and 14B respectively show queuing formations for multiple moveable stages of the FIG. 10 displacement device and methods for moving moveable stages into and out of such queuing formations according to particular embodiments.

DESCRIPTION

Figure 1A:
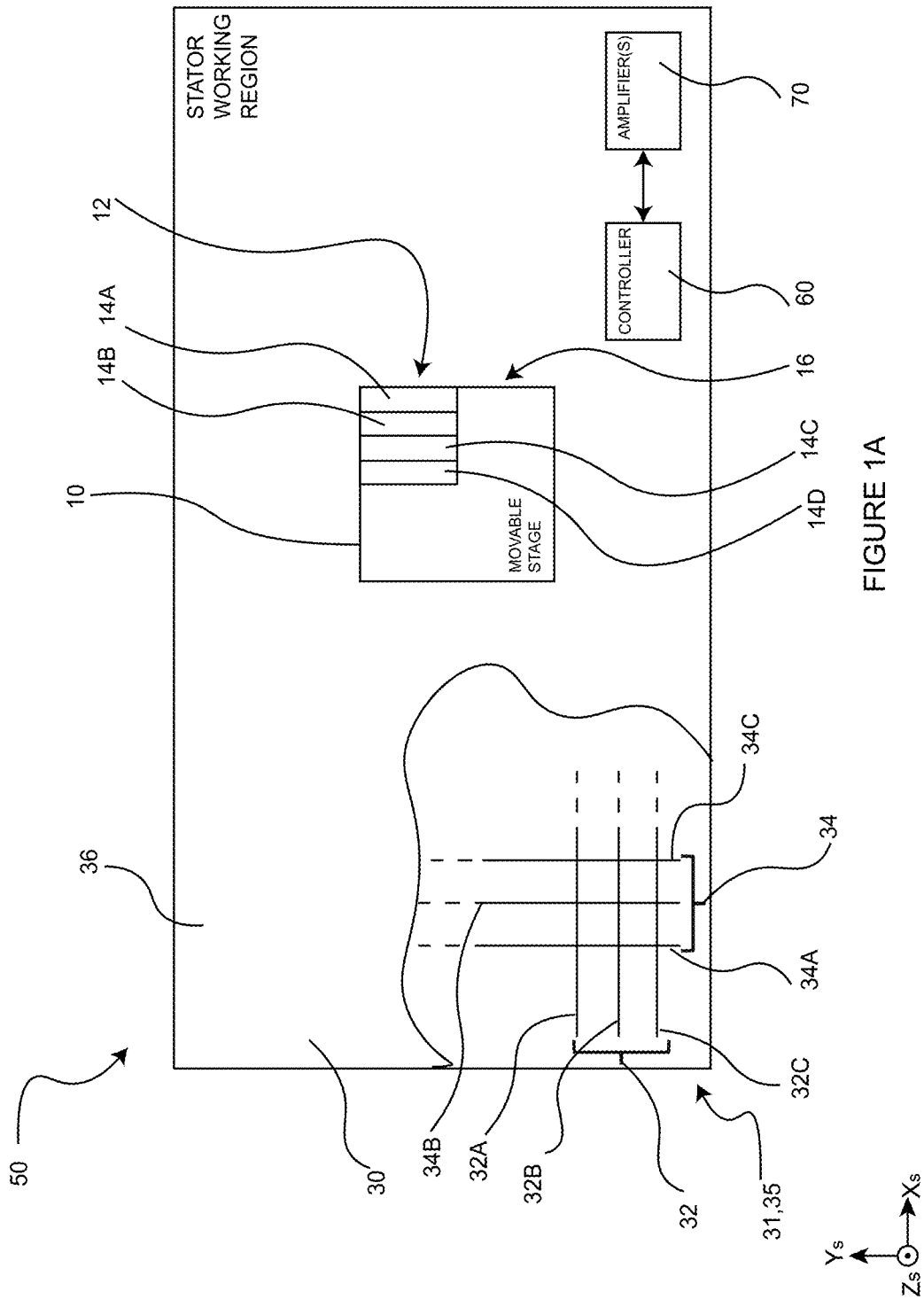
FIGS. 1A and 1B (together, FIG. 1) respectively depict a schematic partially cut-away top view and side cross-sectional views of a displacement device according to a particular embodiment of the invention.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Aspects of the invention provide methods and systems for moving a one or more of moveable stages relative to a stator. The stator comprises a plurality of coils shaped to provide pluralities of coil trace groups. Each coil trace group may comprise one or more coil traces into which current can be independently driven—e.g. each coil trace group is independently addressable. In some embodiments, each coil trace group comprises a corresponding one or more generally linearly elongated coil traces which extend across a stator tile, although this is not necessary. Each moveable stage comprises one or more magnetization elements which may be arranged to provide one or more magnet arrays. A magnetization element comprises a magnetic region having a single corresponding magnetization direction. Magnetization segments described at various locations herein represent non-limiting examples of magnetization elements. Methods and apparatus are provided for controllably moving one or more moveable stages relative to the stator.

Aspects of the invention provide displacement devices which comprise a stator and one or more moveable stages. For brevity, moveable stages may also be referred to herein as movers. The stator comprises a plurality of electrically conductive coils shaped to provide pluralities of coil traces. Such coil traces may be generally linearly elongated, but this is not a requirement. Each moveable stage may be moveable relative to the stator within a two-dimensional working region of the displacement device. Each moveable stage may comprise a one or more magnetization elements (each having its own magnetization direction) that may be arranged to provide one or more magnet arrays. Magnetization segments described at various locations herein represent non-limiting examples of magnetization elements. A plurality of amplifiers may be connected to drive a plurality of currents into independently addressable coil trace groups within the plurality of coil traces. A plurality of controllers may be configured to determine final current references for the coil trace groups Amplifiers and controllers (and optionally current feedback control modules) may be connected or otherwise configured to attempt to drive currents in the individual coil trace groups which will cause the currents to track the current references. The currents controllably driven into the at least some of the plurality of coil traces create magnetic fields which cause corresponding magnetic forces on the magnetization elements of the moveable stage, thereby moving the moveable stage relative to the stator (e.g. within the working region). In some embodiments, the magnetic forces associated with the interaction between the magnetic fields created by the currents in the at least some of the coil traces and the magnetic fields associated with the magnetization elements may attract the moveable stage toward the stator at all times when the controller(s) is/are controlling the currents driven by the one or more amplifiers. In some embodiments, the magnetic forces associated with the interaction between the magnetic fields created by the currents in the at least some of the coil traces and the magnetic fields associated with the magnetization element may force the moveable stage away from the stator to balance gravitational forces with an air gap at all times when the controller(s) is/are controlling the currents driven by the one or more amplifiers.

Figure 1B:
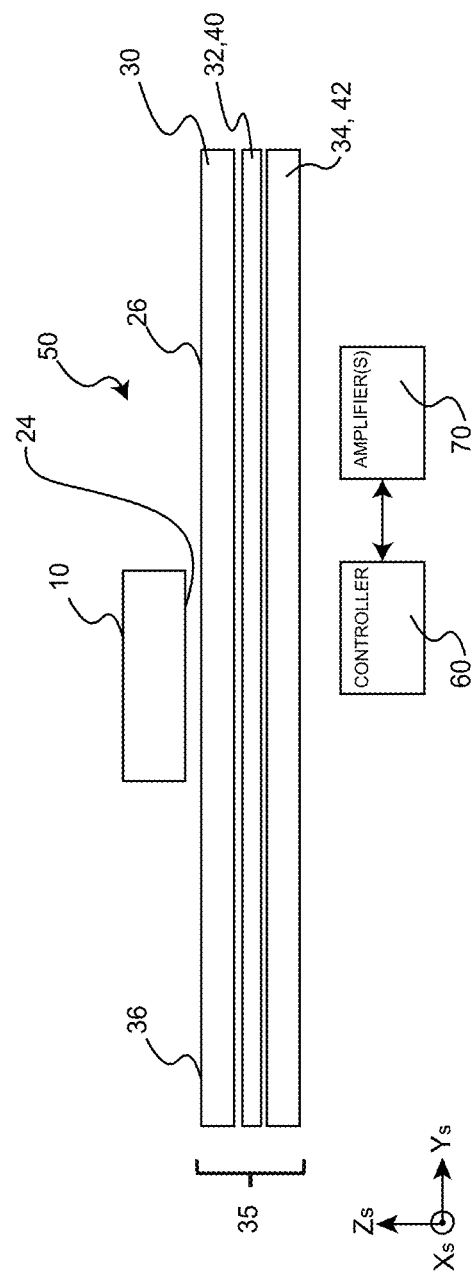

FIGS. 1A and 1B (together FIG. 1) respectively depict a partially cut-away top view and a side cross-sectional view of a displacement device 50 according to a particular embodiment. Displacement device 50 comprises a stator 30, a moveable stage 10, a controller 60 and one or more amplifiers 70. Moveable stage 10 may be controllably moved relative to stator 30 about a working region 36 of displacement device 50.

For purposes of describing the displacement devices disclosed herein, it can be useful to define a pair of coordinate systems—a stator coordinate system which is fixed to the stator (e.g. to stator 30 of FIG. 1A); and a stage coordinate system which is fixed to the moveable stage (e.g. moveable stage 10 of FIG. 1A) and moves with the moveable stage relative to the stator and the stator coordinate system. This description may use conventional Cartesian coordinates (x, y, z) to describe these coordinate systems, although, it will be appreciated that other coordinate systems could be used. For convenience and brevity, in this description and the associated drawings, the directions (e.g. x, y, z directions) in the stator coordinate system and the directions in the stage coordinate system may be shown and described as being coincident with one another—i.e. the stator-X, stator-Y and stator-z directions may be shown as coincident with stage-X, stage-Y and stage-z directions, respectively. Accordingly, this description and the associated drawings may refer to directions (e.g. x, y, and/or z) to refer to directions in both or either of the stator and stage coordinate systems. However, it will be appreciated from the context of the description herein that in some embodiments and/or circumstances, the moveable stage (e.g. moveable stage 10) may move relative to the stator (e.g. stator 30) such that these stator and stage directions are no longer coincident with one another. In such cases, this disclosure may adopt the convention of using the terms stator-X, stator-Y and stator-z to refer to directions and/or coordinates in the stator coordinate system and the terms stage-X, stage-Y and stage-z to refer to directions and/or coordinates in the stage coordinate system. In this description and the associated drawings, the symbols Xm, Ym and Zm may be used to refer respectively to the stage-X, stage-Y and stage-z directions, the symbols Xs, Ys and Zs may be used to refer respectively to the stator-X, stator-Y and stator-z directions and the symbols X, Y and Z may be used to refer respectively to either or both of the stage-X, stage-Y and stage-z and/or stator-X, stator-Y and stator-z directions. In some embodiments, during normal operation, the stage-z and stator-z directions are approximately in the same direction (e.g. within ±30° in some embodiments; within ±10° in some embodiments; and within ±2° in some embodiments).

In some embodiments, the stator-X and stator-Y directions are non-parallel. In particular embodiments, the stator-X and stator-Y directions are generally orthogonal. In some embodiments, the stage-X and stage-Y directions are non-parallel. In particular embodiments, the stage-X and stage-Y directions are generally orthogonal.

Controller 60 and amplifiers 70 may be configured and connected for controllably moving moveable stage 10 relative to stator 30 in working region 36. For example, controller 60 may be configured to generate control signals and connected to provide such control signals to amplifiers 70. Amplifiers 70 may be connected to drive currents in coil traces 32, 34. In response to the control signals from controller 60, amplifiers 70 may drive current in coil traces 32, 34 of stator 30 to effect movement of moveable stage 10 relative to stator 30. In some embodiments, controller 60 is configured to move moveable stage 10 to a desired position, $(x_r, y_r)$ or on a desired trajectory (e.g. comprising a series of desired positions, $(x_r, y_r)$), within working region 36, where $x_r$ is a desired position of moveable stage 10 in the stator-X direction and $y_r$ is a desired position of the moveable stage in the stator-Y direction. Unless the context dictates otherwise, throughout this disclosure and the accompanying claims, when referring to a position of a moveable stage, a location of a moveable stage, movement of a moveable stage generally within a working region and/or the like, such position, location, movement and/or the like should be understood to refer to the position, location, movement and/or the like of a reference point on the moveable stage. Such reference point may be, but is not limited to, a point at the center of the magnet array assembly of the moveable stage. Such reference point could be some other location on the moveable stage. Generally, the desired position $(x_r, y_r)$ is a function of time, t, and represents where a moveable stage should be ideally located at each time, t.

The FIG. 1 displacement device 50 and its components (e.g. moveable stage 10, stator 30, controller 60, amplifiers 70 and/or the like) represent generalized embodiments of a displacement device and its components which is useful for describing the principles of operation of displacement devices according to the various embodiments described herein. Further embodiments of displacement devices and/or their components described herein may use similar reference numerals (e.g. with a preceding digit, a trailing symbol, a trailing letter and/or a trailing number) to those used to describe displacement device 50 and/or its components. Unless the context or description dictates otherwise, such displacement devices and/or their components may exhibit features and/or characteristics which may be similar to the features and characteristics of displacement device 50 and/or its components (or vice versa). For example, moveable stages 110A, 210_2 described in more detail below are moveable stages according to particular embodiments of the invention. Unless the context or description dictates otherwise, moveable stages 110A, 210_2 may have features and/or characteristics similar to those discussed herein for moveable stage 10 (or vice versa). As another example, stators 130, 230 described in more detail below are stators according to particular embodiments of the invention. Unless the context or description dictates otherwise, stators 130, 230 may have features and/or characteristics similar to those discussed herein for stator 30. Further, unless the context or description dictates otherwise, it should also be understood that when referring to features and/or characteristics of displacement device 50 and/or its components, the corresponding description should be understood to apply to any of the particular embodiments of displacement devices and/or their components.

Moveable Stage

Figure 2:
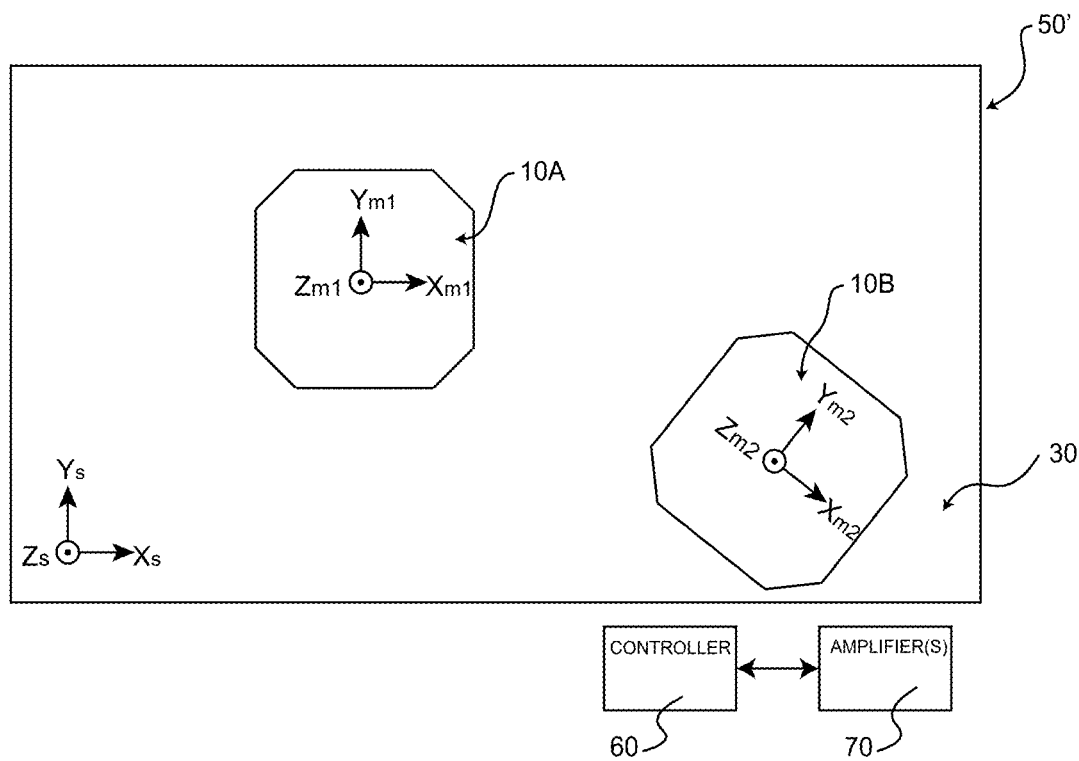
FIG. 2 is a top view of a displacement device which comprises a plurality of moveable stages.

In the FIG. 1 embodiment, displacement device 50 is shown with a single moveable stage 10. In general, however, displacement device 50 may comprise a plurality of moveable stages, each of which may be similar to moveable stage 10 and each of which may be controlled by controller 60 using amplifier(s) 70 to drive currents in coil traces 32, 34 as described herein. FIG. 2 shows a top view of displacement device 50', which comprises a plurality (e.g. two) moveable stages 10A, 10B. Controller 60 may be configured to generate control signals for controllably moving both moveable stages 10A, 10B. In other respects, displacement device 50' may be substantially similar to the FIG. 1 displacement device 50. By way of non-limiting example, each of moveable stages 10A, 10B may have similar features and/or characteristics to moveable stage 10 of displacement device 50 and stator 30 of displacement device 50' may have similar features and/or characteristics to stator 30 of displacement device 50. FIG. 2 shows that moveable stages 10A, 10B need not be aligned with one another. Consequently, each moveable stage 10A, 10B may be described using its own corresponding stage coordinate system. In the case shown in FIG. 2, the stage directions $X_{m1}/Y_{m1}/Z_{m1}$ define the stage coordinate system for moveable stage 10A and the stage directions $X_{m2}/Y_{m2}/Z_{m2}$ define the stage coordinate system for moveable stage 10B. Displacement device 50' can be built to operate with any suitable number of moveable stages 10. In some embodiments, displacement device 50' comprises three moveable stages. In some embodiments, displacement device 50' may comprise dozens to hundreds of moveable stages. In some embodiments still, displacement device 50' may comprise thousands of moveable stages.

Referring back to FIG. 1, moveable stage 10 comprises a magnet array assembly 16 which comprises one or more magnet arrays 12. Magnet array assembly 16 should be understood to comprise the combination of the one or more individual magnet arrays 12. Each magnet array 12 may comprise a corresponding plurality of magnetization segments 14A, 14B, 14C, 14D . . . (collectively, magnetization segments 14), each magnetization segment 14 having a corresponding magnetization direction. In some embodiments, the magnetization segments 14 of a particular magnet array 12 have at least two magnetization directions that are different from one another. In the FIG. 1 embodiment, moveable stage 10 comprises a first magnet array 12 having a plurality of corresponding first magnetization segments 14. Moveable stage 10 may be located adjacent to (e.g. atop) stator 30. As discussed above, in some embodiments, moveable stage 10 may be attracted toward (and bear against) stator 30 when controller 60 is controlling the currents driven by amplifiers 70; and, in some embodiments, moveable stage 10 is forced away from stator 30 (e.g. to provide an air gap between stator 30 and moveable stage 10) when controller 60 is controlling the currents driven by amplifiers 70. In the illustrated embodiment, for the sake of generality, moveable stage 10 comprises an optional stage bearing surface 24 that is generally planar (with a normal in the stage-z direction) and which may bear against an optional stator bearing surface 26 that is generally planar (with a normal in the stator-z direction) in embodiments where moveable stage is attracted toward stator 30.

One type of magnet array assembly 16 is referred to as an elongated segment magnet array assembly 16. An elongated segment magnet array assembly 16 comprises one or more elongated segment magnet arrays 12, wherein each such magnet array 12 comprises plurality of linearly elongated magnetization segments 14 (e.g. elongated in a stage-X direction or a stage-Y direction), with each magnetization segment 14 having a corresponding magnetization direction that is generally orthogonal to its elongation direction. At least two of the magnetization segments 14 in each magnet array 12 may have magnetization directions that are different from one another.

In some embodiments, moveable stage 10 comprises an elongated segment magnet array 16 which in turn comprises four elongated segment magnet arrays 12 (first, second, third and fourth magnet arrays 12). A first magnet array 12 in such an elongated segment magnet array assembly 16 may comprise a plurality of linearly elongated first magnetization segments 14 (e.g. elongated in a stage-X direction), with each first magnetization segment 14 having a corresponding magnetization direction that is generally orthogonal to the stage-X direction. At least two of the first magnetization segments 14 may have magnetization directions that are different from one another. The first magnetization directions of the first magnetization segments 14 may exhibit a first spatial period $\lambda_1$ (also referred to herein as $\lambda_y$) over a stage-Y direction width of the first magnet array 12. In some embodiments, the stage-Y direction width of the first magnet array 12 is generally equal to $\lambda_1$, so that the first magnetization directions of the first magnetization segments 14 exhibit a single first spatial period $\lambda_1$ over the stage-Y direction width of the first magnet array 12. In some embodiments, the first magnetization directions of the first magnetization segments 14 exhibit multiple (e.g. an integer number of) first spatial periods $\lambda_1$ which repeat over the stage-Y direction width of the first magnet array 12.

Similar to the first magnet array 12, the second magnet array 12 may comprise a plurality of linearly elongated second magnetization segments 14. However, the second magnetization segments 14 may be linearly elongated in the stage-Y direction (e.g. non-parallel to the stage-X direction in some embodiments or generally orthogonal to the stage-X direction in some embodiments). Each second magnetization segment 14 has a corresponding second magnetization direction that is generally orthogonal to the stage-Y direction and at least two of the second magnetization segments 14 have second magnetization directions that are different from one another. The second magnetization directions of the second magnetization segments 14 may exhibit a second spatial period $\lambda_2$ (also referred to herein as $\lambda_x$) over a stage-X direction width of the second magnet array 12. In some embodiments, the stage-X direction width of the second magnet array 12 is generally equal to $\lambda_2$, so that the second magnetization directions of the second magnetization segments 14 exhibit a single second spatial period $\lambda_2$ over the stage-X direction width. In other embodiments, the second magnetization directions of the second magnetization segments 14 exhibit multiple second spatial periods $\lambda_2$ which repeat over the stage-X direction width. In some embodiments, the first spatial period $\lambda_1=\lambda_y$ is equal to the second spatial period $\lambda_2=\lambda_x$ and they may both be referred to as the spatial period $\lambda$.

Similar to the first magnet array 12, the third magnet array 12 may comprise a plurality of third magnetization segments 14 linearly elongated in the stage-X direction, where each third magnetization segment 14 has a corresponding third magnetization direction that is generally orthogonal to the stage-X direction and at least two of the third magnetization segments 14 have third magnetization directions that are different from one another. The third magnetization directions of the third magnetization segments 14 may exhibit the first spatial period $\lambda_1=\lambda_y$ (or a unique third spatial period $\lambda_3$) over a stage-Y direction width of the third magnet array 12. In some embodiments, the stage-Y direction width of the third magnet array 12 is generally equal to $\lambda_1$ (or $\lambda_3$), so that the third magnetization directions of the third magnetization segments 14 exhibit a single first spatial period $\lambda_1$ (or single third spatial period $\lambda_3$) over the stage-Y direction width. In other embodiments, the third magnetization directions of the third magnetization segments 14 exhibit multiple first spatial periods $\lambda_1$ (or multiple third spatial periods $\lambda_3$) which repeat over the stage-Y direction width.

Similar to the second magnet array 12, the fourth magnet array 12 may comprise a plurality of fourth magnetization segments 14 linearly elongated in the stage-Y direction, where each fourth magnetization segment 14 has a corresponding fourth magnetization direction that is generally orthogonal to the stage-Y direction and at least two of the fourth magnetization segments 14 have fourth magnetization directions that are different from one another. The fourth magnetization directions of the fourth magnetization segments 14 may exhibit the second spatial period $\lambda_2=\lambda_x$ (or a unique fourth spatial period $\lambda_4$) over a stage-X direction width of the fourth magnet array 12. In some embodiments, the stage-X direction width of the fourth magnet array 12 is generally equal to $\lambda_2$ (or $\lambda_4$), so that the fourth magnetization directions of the fourth magnetization segments 14 exhibit a single second spatial period $\lambda_2$ (or single fourth spatial period $\lambda_4$) over the stage-X direction width. In other embodiments, the fourth magnetization directions of the fourth magnetization segments 14 exhibit multiple second spatial periods $\lambda_2$ (or multiple fourth spatial periods $\lambda_4$) which repeat over the stage-X direction width.

Figure 3A:
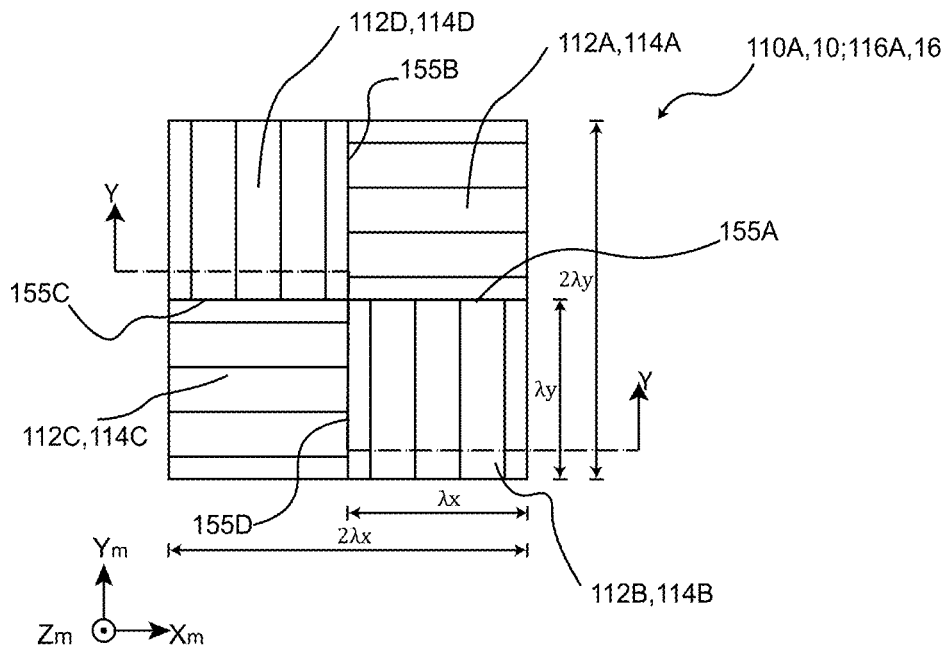
FIGS. 3A and 3B are each a schematic top view of a magnet array assembly comprising a plurality of elongated segment magnet arrays according to a particular embodiment.
Figure 3B:
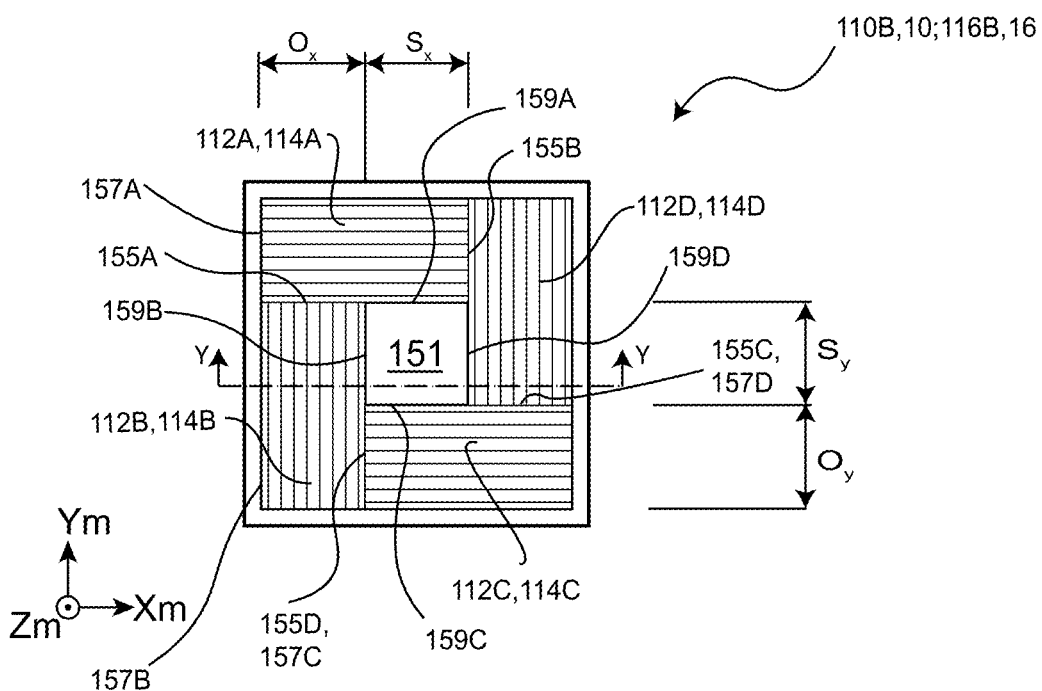

FIGS. 3A and 3B respectively depict partial schematic top views of moveable stages 110A, 110B incorporating magnet array assemblies 116A, 116B according to particular embodiments which may be used as magnet array assemblies 16 of moveable stage 10 (or any other moveable stages described herein) according to particular embodiments. Each of magnet array assemblies 116A, 116B comprises a plurality of elongated segment magnet arrays 112. In the illustrated embodiment, each of magnet array assemblies 116A, 116B comprise four elongated segment magnet arrays 112A, 112B, 112C, 112D (collectively, magnet arrays 112) which include a first magnet array 112A comprising magnetization segments 114A elongated in the stage-X direction, second magnet array 112B comprising magnetization segments 114B elongated in the stage-Y direction, third magnet array 112C comprising magnetization segments 114C elongated in the stage-X direction and fourth magnet array 112D comprising magnetization segments 114D elongated in the stage-Y direction. Because of their elongation directions, first and third magnet arrays 112A, 112C may be referred to as x-magnet arrays and their corresponding magnetization segments 114A, 114C may be referred to herein as x-magnetization segments and second and fourth magnet arrays 112B, 112D may be referred to as y-magnet arrays and their corresponding magnetization segments 114B, 114D may be referred to herein as y-magnetization segments. Other than for their locations and/or orientations, any of magnet arrays 112 in any one of magnet array assemblies 116A, 116B and/or in any one of moveable stages 110A, 110B may be substantially similar to one another. In this way, magnet array assemblies 116A, 116B and moveable stages 110A, 110B may be 90° rotationally symmetric about a stage-z oriented axis located at the stage-X-stage-Y center of magnet array assemblies 116A, 116B and/or moveable stages 110A, 110B.

Although their individual magnet arrays 112 may be similar to one another, magnet array assemblies 116A, 116B and moveable stages 110A, 110B of the FIGS. 3A and 3B embodiments have layouts which are similar to one another in some respects and differ from one another in other respects. In the case of both magnet array assemblies 116A, 116B, a stage-X oriented edge of first magnet array 112A abuts against a stage-X oriented edge of second magnet array 112B (at abutment 155A), a stage-Y oriented edge of the first magnet array 112A abuts against a stage-Y oriented edge of the fourth magnet array 112D (at abutment 155B), a stage-X oriented edge of third magnet array 112C abuts against a stage-X oriented edge of the fourth magnet array 112D (at abutment 155C), and a stage-Y oriented edge of the third magnet array 112C abuts against a stage-Y oriented edge of the second magnet array 112B (at abutment 155D). Further, in the case of both magnet array assemblies 116A, 116B, the peripheral edges of magnet arrays 112 are aligned with one another to provide magnet array assemblies 116A, 116B with a generally rectangular peripheral shape (from the top plan view). In particular, the stage-Y oriented peripheral edges of first and second magnet arrays 112A, 112B and the stage-Y oriented peripheral edges of third and fourth magnet arrays 112C, 112D are aligned with one another in the stage-Y direction. Further, the stage-X oriented peripheral edges of the first and fourth magnet arrays 112A, 112D and the stage-X oriented peripheral edges of second and third magnet arrays 112B, 112C are aligned with one another in the stage-X direction.

In some embodiments, these abutments and/or peripheral edge alignments are not necessary and magnet array assemblies 16 may comprise as few as one elongated segment magnet array 12 or a plurality of elongated segment magnet arrays 12 which are spaced apart from one another (i.e. non-abutting), which have non-aligned peripheral edges and/or which abut one another with different abutment and/or alignment relationships. For example, in some embodiments, the stage-Y oriented peripheral edges of first and second magnet arrays 112A, 112B and the stage-Y oriented peripheral edges of third and fourth magnet arrays 112C, 112D are not aligned with one another in the stage-Y direction; and in some embodiments, the stage-X oriented peripheral edges of the first and fourth magnet arrays 112A, 112D and the stage-X oriented peripheral edges of second and third magnet arrays 112B, 112C are not aligned with one another in the stage-X direction.

The layout of magnet array assembly 116B differs from the layout of magnet array assembly 116A in that, for magnet array assembly 116B: corresponding stage-Y oriented edges 157A, 157C of first and third magnet arrays 112A, 112C are offset from one another in the stage-X direction (by an offset Ox) and adjacent stage-X oriented edges 159A, 159C of first and third magnet arrays 112A, 112C are spaced apart from one another in the stage-Y direction (by a first space Sy); and corresponding stage-X oriented edges 157B, 157D of second and fourth magnet arrays 112B, 112D are offset from one another in the stage-Y direction (by an offset Oy) and adjacent stage-Y oriented edges 159B, 159D of second and fourth magnet arrays 112B, 112D are spaced apart from one another in the stage-X direction (by a second space Sx). It can be seen from FIG. 3B, that for magnet array assembly 116B, the stage-X dimensions of the first and third magnet arrays 112A, 112C are larger than their corresponding stage-Y dimensions, while the stage-Y dimensions of the second and fourth magnet arrays 112B, 112D are larger than their corresponding stage-X dimensions. These offsets Ox, Oy and spaces Sx, Sy give rise to a non-magnetized space 151 (with dimensions Sx by Sy) in the center of magnet arrays assembly 116B. The layout of magnet array assembly 116B may be advantageous (relative to the layout of magnet array assembly 116A) because active coil traces interacting closely with magnet array 112A may generate relatively little coupling force on the magnet array 112C, and vice versa in magnet array assembly 116B as compared to magnet array assembly 116A; and active coil traces interacting closely with magnet array 112B generate little coupling force on the magnet array 112D, and vice versa in magnet array assembly 116B as compared to magnet array assembly 116A.

The layout of magnet array assembly 116A differs from the layout of magnet array assembly 116B in that, for magnet array assembly 116A: the stage-X oriented edges of the first and second magnet arrays 112A, 112B (i.e. the stage-X oriented edges that provide abutment 155A) have the same stage-X dimension; the stage-Y-oriented edges of the first and fourth magnet arrays 112A, 112D (i.e. the stage-Y oriented edges that provide abutment 155B) have the same stage-Y dimension; the stage-X oriented edges of the third and fourth magnet arrays 112C, 112D (i.e. the stage-X oriented edges that provide abutment 155C) have the same stage-X dimension; and the stage-Y-oriented edges of the second and third magnet arrays 112B, 112C (i.e. the stage-Y oriented edges that provide abutment 155D) have the same stage-Y dimension. Further, with these dimensions (and the above-described abutment and peripheral edge alignment features) magnet array assembly 116A does not have a space that is analogous to space 151 of magnet array assembly 116B. The layout of magnet array assembly 116A may be advantageous (relative to the layout of magnet array 116B) because the magnet array assembly footprint (in the stage-X and stage-Y directions) is fully utilized for magnetic field generation.

Another difference between magnet array assemblies 116A, 116B is that for magnet array assembly 116A, the magnet array 112A that is furthest in the positive stage-X direction and furthest in the positive stage-Y direction comprises magnetization segments 114A which are elongated in the stage-X direction and the other magnet arrays 112B, 112C, 112D alternate between having magnetization segments 114B, 114C, 114D elongated in the stage-Y and stage-X directions. In contrast, for magnet array assembly 116B, the magnet array 112D that is furthest in the positive stage-X direction and furthest in the positive stage-Y direction comprises magnetization segments 114D which are elongated in the stage-Y direction and the other magnet arrays 112A, 112B, 112C alternate between having magnetization segments 114A, 114B, 114C elongated in the stage-X and stage-Y directions. In this description: magnet array assemblies, like magnet array assembly 116A of FIG. 3A, which have a magnet array that is furthest in the positive stage-X direction and furthest in the positive stage-Y direction and which comprises magnetization segments which are elongated in the stage-X direction may be referred to as right-handed magnet array assemblies; and magnet array assemblies, like magnet array assembly 116B of FIG. 3B, which have a magnet array that is furthest in the positive stage-X direction and furthest in the positive stage-Y direction and which comprises magnetization segments which are elongated in the stage-Y direction may be referred to as left-handed magnet array assemblies. It should be understood that many variations to magnet array assemblies 116A, 116B can be used in moveable stages 110A, 110B. In one example, magnet array assembly 116A of FIG. 3A can be changed from a right-handed to a left-handed variation. In another example, magnet array assembly 116B of FIG. 3B can be changed from a left handed to a right handed variation.

Figure 3C:
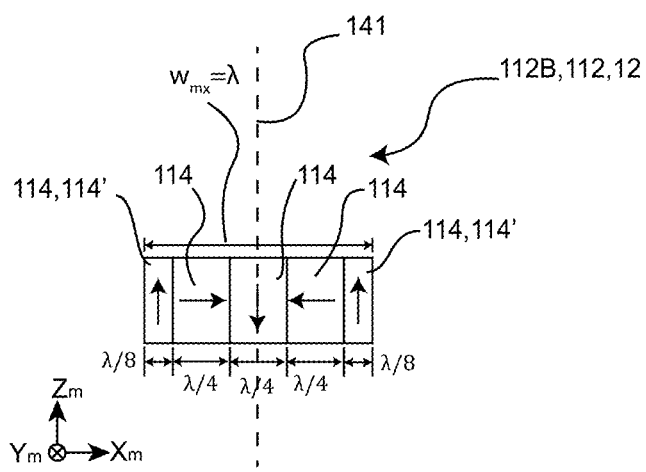
FIG. 3C is a cross-sectional view of an exemplary y-magnet array which is used in the FIG. 3A magnet array assembly and which could be used for the magnet array assemblies of FIG. 3B or any of the other elongated segment magnet array assemblies described herein.

As discussed above, other than for their orientations, the magnet arrays 112 in magnet array assemblies 116A, 116B and moveable stages 110A, 110B may be substantially similar to one another. However, the magnet arrays 112 in magnet array assemblies 116A, 116B may have a wide variety of patterns of magnetization segments 114 (and their corresponding magnetization directions). FIG. 3C is a cross-sectional view of an exemplary y-magnet array 112 (e.g. array 112B) which may be used in the FIG. 3A magnet array assembly 116A and/or in the FIG. 3B magnet array assembly 116B and/or in any of the other elongated segment magnet array assemblies described herein. Various other elongated segment magnet arrays 112 could be used in the FIG. 3A magnet array assembly 116A and/or in the FIG. 3B magnet array assembly 116B and/or in any of the other elongated segment magnet array assemblies described herein. For example, Patent Cooperation Treaty Patent application Nos. PCT/CA2012/050751, PCT/CA2014/050739 and PCT/CA2015/050157 (all of which are hereby incorporated by reference herein) disclose a number of different embodiments of elongated segment magnet arrays, each of which could be used for magnet arrays 112 in any of the elongated magnet array assemblies described herein (e.g. magnet arrays assemblies 116A, 116B).

In the illustrated cross-sectional view of FIG. 3C, magnet array 112 comprises a plurality of magnetization segments 114, each of which has a corresponding magnetization direction (where the magnetization directions of magnetization segments 114 are indicated by arrows). While the magnet array 112 of FIG. 3C is a y-magnet array, it will be appreciated that x-magnet arrays may be provided by merely altering the orientations of the illustrated magnet arrays and that the description of magnet arrays 112 described herein should be understood to apply to y-magnet arrays 112 or x-magnet arrays 112 with adjustment of orientation, as appropriate. As can be seen from FIG. 3C, the stage-X direction width of each magnetic segment 114 is generally equal to one of $$\frac{\lambda_x}{4} \text{ or } \frac{\lambda_x}{8}.$$

In the case of the FIGS. 3A and 3B embodiments, the edge magnetization segments 114' (i.e. magnetization segments 114' at the edges of arrays 112) have stage-X direction widths $$\left(\frac{\lambda_x}{8}\right)$$

that are half of the stage-X direction widths $$\left(\frac{\lambda_x}{4}\right)$$

of the other (interior) magnetization segments 114. In some embodiments, the stage-X direction widths of each magnetic segment 114 may be generally equal to one of $$\frac{\lambda_x}{N} \text{ or } \frac{\lambda_x}{2N},$$

where N is any positive integer. In some embodiments, edge magnetization segments 114' may have stage-X direction widths $$\left(\frac{\lambda_x}{2N}\right)$$

that are half of the stage-X direction widths $$\left(\frac{\lambda_x}{N}\right)$$

of the other (interior) magnetization segments 114. In some embodiments, N=N$_t$ (where N$_t$ represents the number of different magnetization directions in an array 112), as is the case in the illustrated embodiments of FIG. 3C. In the illustrated embodiments of FIG. 3C, the edge magnetization segments 114' have magnetization directions that are oriented in the stage-z direction (in the positive stage-z direction in the case of the illustrated embodiment). For any of the embodiments of magnet arrays 112 shown and/or described herein, the stage-z directions of the magnetization segments 114 may be inverted from those shown and/or described herein.

The various magnet arrays 112 shown in the illustrated embodiments of FIGS. 3A-3C exhibit a number of similar properties. The magnetization directions of magnetization segments 114 are orthogonal to the elongation directions of magnetization segments 114. At least two of magnetization segments 114 of each magnet array 112 are different from one another. In general, magnet arrays 112 may comprise magnetization segments 114 with any suitable integer number N$_t$ (N$_t \geq 2$) of magnetization directions. In the illustrated embodiment of FIG. 3C, N$_t$=4. The magnetization directions of magnetization segments 114 exhibit a spatial period $\lambda_x$ over the stage-X width of magnet arrays 112. To avoid complicating the illustration of FIG. 3C, the spatial period $\lambda_x$ is shown as $\lambda$ without loss of generality. In the FIG. 3C embodiment, the stage-X direction width (W$_{mx}$) of magnet array 112 is generally equal to $\lambda_x$, so that the magnetization directions of magnetization segments 114 exhibit a single spatial period $\lambda_x$ over the stage-X direction width W$_{mx}$ of magnet array 112. In some embodiments, the magnetization directions of first magnetization segments 114 may exhibit any positive integer number N$_m$ spatial periods $\lambda_x$ which repeat over the stage-X direction width ((W$_{mx}$=N$_m\lambda_x$) of magnet array 112. In the illustrated embodiment of FIG. 3C, the magnetization directions of magnetization segments 114 are mirror symmetric relative to a plane of symmetry (extending in the stage-Y and stage z-directions and passing through the stage-X direction center of magnet array 112 indicated by lines 141 shown in FIG. 3C).

Moveable stage 10 of displacement device 50 may comprise optional bumpers (not shown) which may protect moveable stage 10 from other moveable stages and other objects that may be introduced onto stator 30 or into working region 36. Bumpers may be made of non-magnetic materials to protect moveable stage 10 and its magnet array assembly 16. Further bumpers may prevent two or more moveable stages 10 from getting too close to one another (e.g. to a vicinity where their respective magnetization segments 14 might attract one another and might undesirably influence the forces caused by current controllably driven into coil traces 32, 34). Bumpers may also serve to prevent other objects with high magnetic permeability from getting too close to magnet array assembly 16. For example, in the absence of non-magnetic bumpers, an iron or steel washer/screw/nuts dropped onto working region 36 can be attached to magnet array assembly 16 and cause system failure. Examples of suitable bumpers which can be used for any of the moveable stages described herein are described in PCT/CA2015/050157.

In some embodiments, moveable stage 10 may comprise a stage support structure which may be fabricated from highly magnetically permeable material (e.g. with relative magnetic permeability greater than 100), such as iron, ferrite, cobalt, combinations of these materials and/or the like. High magnetic permeability helps enhance the magnetic field below (e.g. in the negative stator-z direction relative to) magnet array assembly 16, which is where the coil traces of stator 30 are typically located during operation. In some embodiments, it may be beneficial to use a stage support structure without back iron. Such embodiments may be desirable to minimize the weight of moveable stage 10, for example. Such stage support structures can be fabricated from aluminum, ceramic, carbon-fiber reinforced composite materials, combinations of these materials and/or the like. Reducing the weight of stage support layer may help to minimize moveable stage inertia.

Stator

Various embodiments and additional detail of stator 30 are now provided. Referring back to FIG. 1 described above, stator 30 comprises a stator coil assembly 35 which comprises at least the traces of a plurality of electrically conductive coils 31. Coils 31 are shaped to provide first and second pluralities of coil traces 32, 34 which are respectively elongated in non-parallel directions. In particular embodiments, such as depicted in FIG. 1A, first plurality of coil traces 32 is orthogonal to second plurality of coil traces 34. In particular embodiments, such as depicted in FIG. 1A, first plurality of coil traces 32 is distributed over at least a portion of a first layer 40 and generally elongated in a stator-X direction; and second plurality of coil traces 34 is distributed over at least a portion of a second layer 42 and generally elongated in a stator-Y direction. In some embodiments, such as depicted in FIG. 1A, the first and second layers 40, 42 over which first and second pluralities of coil traces 32, 34 are respectively distributed may be located at different (e.g. first and second) stator-z locations and layers 40, 42 may overlap one another in the stator-z direction, although this is not necessary. In some embodiments, first and second layers 40, 42 may be provided in different excitation regions (described in more detail below), but at the same stator-z location.

In some embodiments, stator 30 may comprise additional pluralities of coil traces (not shown) which may be distributed over portions of additional layers at corresponding additional stator-z direction locations. For example, stator 30 may comprise a first additional plurality of coil traces (not shown) distributed over at least a portion of a first additional layer at a corresponding first additional stator-z location and generally elongated in a stator-X direction; and a second additional plurality of coil traces (not shown) distributed over at least a portion of a second additional layer at a corresponding second additional stator-z location and generally elongated in a stator-Y direction. Additional pluralities of coil traces are not limited to being elongated in the stator-X or stator-Y directions. In some embodiments, additional pluralities of coil traces are provided which are generally elongated in angular directions between the stator-X and stator-Y directions. For example, in some embodiments, stator 30 may comprise one or both of: a first additional angular plurality of coil traces (not shown) distributed over at least a portion of a first additional angular layer at a corresponding first additional angular stator-z location and generally elongated in a direction split between the positive stator-X and positive stator-Y directions (e.g. at 45° counter-clockwise around a stator-z axis from the positive stator-X direction in some embodiments); and a second additional angular plurality of coil traces (not shown) distributed over at least a portion of a second additional angular layer at a corresponding second additional angular stator-z location and generally elongated in a direction split between the negative stator-X and positive stator-Y directions (e.g. at 45° clockwise around a stator-z axis from the negative stator-X direction in some embodiments). In other embodiments, additional pluralities of coil traces may be elongated at angles α other than 45° from the stator-X and/or stator-Y directions. Such coil traces may be referred to herein as α-oriented coil traces or α-traces, where a is their angle as measured from one of the stator-X or stator-Y axes.

In some embodiments, coil traces 32, 34 in layers 40, 42 at different stator-z locations may overlap one another in the stator-z direction. The two dimensional space over which coil traces 32, 34 overlap one another in the stator-z direction may define a working region 36 over which moveable stage 10 is moveable relative to stator 30. In some embodiments, coil traces 32, 34 in each corresponding layer 40, 42 may be distributed throughout their respective layers 40, 42, so that coil traces 32, 34 and/or layers 40, 42 may overlap in the stator-z direction at all locations in working region 36. This is not necessary. In some embodiments, coil traces 32, 34 may occupy particular excitation regions (described in more detail below) that occupy less than an entirety of a corresponding layer 40, 42. Some of coil traces 32, 34 may be connected at their ends to form a two-phase, three-phase, or multiple-phase winding configuration as described in more detail below. While working region 36 is a two-dimensional space, this description may describe working region 36 as a feature of stator 30, for convenience.

Figure 4:
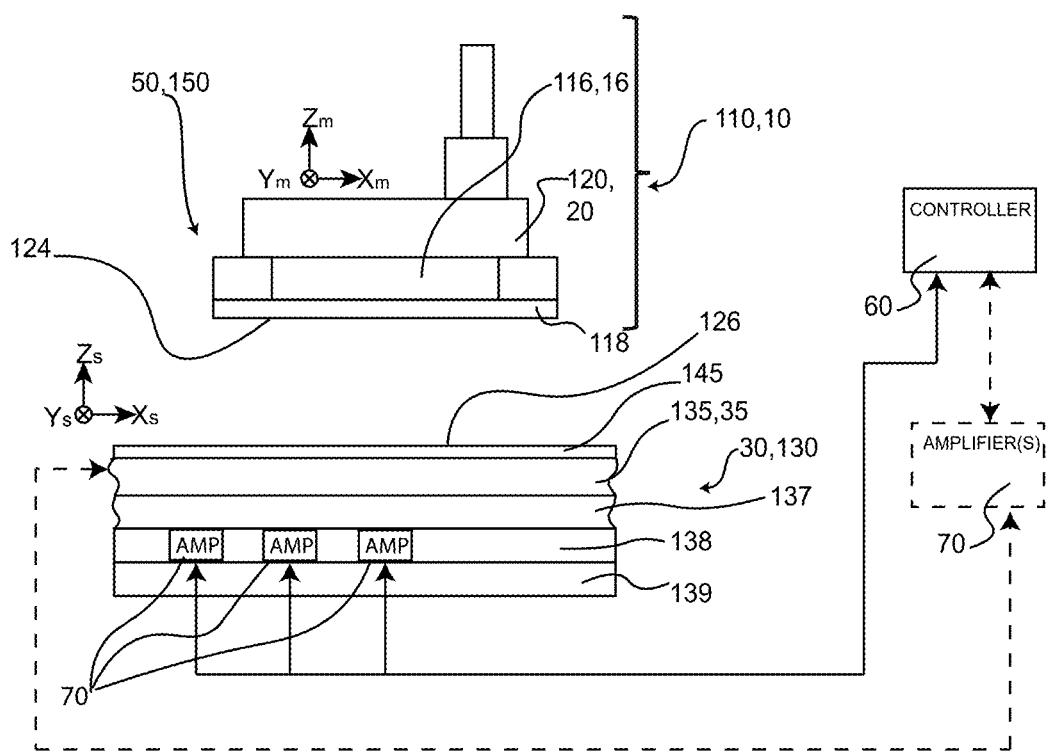
FIG. 4 is a partial schematic side cross-sectional view of a displacement device according to a particular embodiment of the invention.

FIG. 4 shows a displacement device 150 according to a particular embodiment of the invention. FIG. 4 comprises a moveable stage 110 similar to one of those shown in FIGS. 3A-3C and a stator 130. Stator 130 of the FIG. 4 embodiment comprises an optional stator bearing layer 145, stator coil assembly 135, coil supporting layer 137, power electronics layer 138, and optional cooling layer 139. Stator coil assembly 135 may comprise the aforementioned coils 31 and/or coil traces 32, 34.

Optional stator bearing layer 145 may overlap with stator coil assembly 135 in stator-z direction over the stator-X/stator-Y span of working region 36 (not shown in FIG. 4). Stator bearing layer 145 may comprise a generally planar stator bearing surface 126 which may bear against (or be separated by an air gap from) stage bearing surface 124 of stage bearing layer 118 of moveable stage 110. In the illustrated embodiment, stage bearing surface 124 faces the negative stator-z direction and stator bearing surface 126 faces the positive stator-z direction. Various stator bearing layers and restrictor layers are described in Patent Cooperation Treaty application No. PCT/CA2015/050157 and may be used with any of the embodiments of stator 30 (or 130, 230 etc.) as described herein.

Coil supporting layer 137 may provide mechanical support to stator coil assembly 135. Stator coil assembly 135 of the FIG. 3 embodiment may be substantially similar to stator coil assembly 35 of the FIG. 1 embodiment and may comprise coils 31 shaped to provide coil traces 32, 34 (and any additional coil traces) having features similar to those of the FIG. 1 embodiment. Controller 60 may be connected to deliver control signals to one or more amplifiers 70 and controller 60 may be configured to use those control signals to control the currents driven by amplifier(s) 70 into at least some of coil traces 32, 34 to thereby cause moveable stage 10, 110 to track a desired position within working region 36—e.g. a desired position, $(x_r, y_r)$, within working region 36, where $x_r$ is a desired position of moveable stage 10, 110 in the stator-X direction and $y_r$ is a desired position of moveable stage 10, 110 in the stator-Y direction.

In some embodiments, when in operation, moveable stage bearing surface 124 is in close proximity with (e.g. adjacent to) and generally parallel to stator bearing surface 126. In some embodiments, the stator-z direction gap between moveable stage 110 and stator 130 is less than 10 mm, and is typically around 1 mm. This space between stator 130 and moveable stage 110 can be maintained (at least in part) by Z-direction forces created by the interaction of the magnetic fields generated by current in coil traces 32, 34 of stator 130 with magnet arrays 112 of moveable stage 110 as discussed below. In some embodiments, this space (or air gap) between stator 130 and moveable stage 110 can be maintained using additional lifting and/or hoisting magnets, aerostatic bearings, roller bearings and/or the like (not shown), as is known in the art. In some embodiments, as discussed above, the magnetic forces generated by the interaction of currents driven into coil traces 32, 34 and magnet array(s) 112 of moveable stage 110 may be controlled (e.g. by controller 60), such that moveable stage 110 is attracted toward stator 130 whenever the currents are being controllably driven into coil traces 32, 34.

Figure 5:
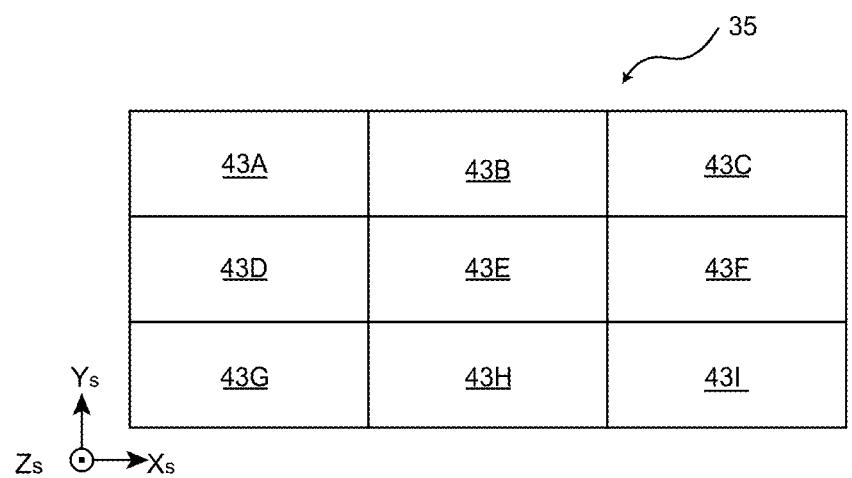
FIG. 5 shows a schematic top view of a stator coil assembly according to a particular embodiment which may be used in any of the displacement devices described herein.

FIG. 5 shows a schematic top view of a stator coil assembly 35 according to a particular embodiment which may be used in displacement device 50 (FIG. 1), displacement device 150 (FIG. 4) or any of the other displacement devices described herein. Stator coil assembly 35, as depicted, comprises a plurality of excitation regions 43A-43I (collectively, excitation regions 43). Excitation regions 43 may also be referred to herein as excitation regions 43 or, for brevity, excitation regions 43. In some embodiments, each of excitation regions 43 is rectangular in shape. In some embodiments, excitation regions 43 may have other shapes (e.g. triangular, hexagonal and/or the like). Each location in each of excitation regions 43 may overlap corresponding coil trace layers 40, 42 at different stator-z locations and corresponding coil traces 32, 34 (and any additional layers and additional coil traces) in the stator-z direction. Coil traces 32, 34 that overlap a particular one of excitation regions 43 in the stator-z direction may be said to be coil traces 32, 34 in, of, associated with or corresponding to the particular one of excitation regions 43. Each coil trace 32, 34 in each excitation region 43 can be excited with a controllable current, where such current may be controlled by controller 60 which may use control signals to control amplifier(s) 70 which in turn drive current into coil traces 32, 34. Each of excitation regions 43 may be connected to a corresponding amplifier module, which may be located in power electronics layer 138 (see FIG. 4) or may be spatially separated from stator 30 and connected to coil traces 32, 34 in its excitation region 43 using suitable electrical connections. Currents driven into the coil traces 32, 34 in each excitation region 43 can be independently controlled. In some embodiments, two or more excitation regions 43 may share a common amplifier 70 by connecting their corresponding coil traces in parallel or serially. It is not necessary that a particular stator coil assembly 35 comprise a plurality of excitation regions. In some embodiments, it is sufficient for a stator coil assembly 35 to have a single excitation region that spans the entire working region.

Figure 6A:
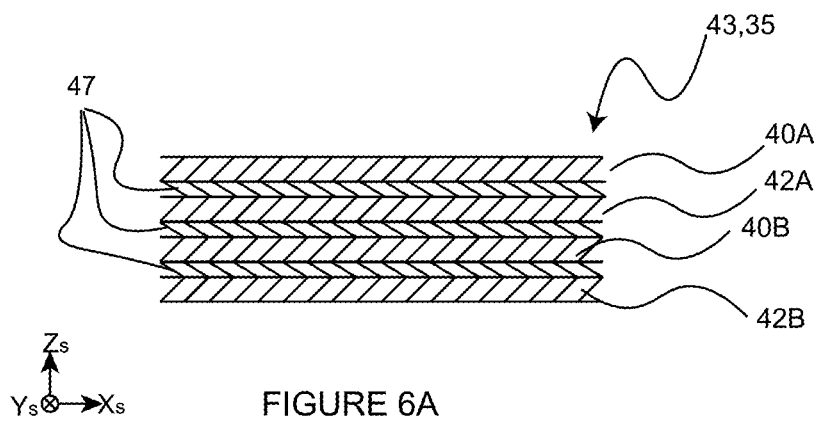
FIGS. 6A-6C each show schematic depictions of portions of coil trace layers and/or coil traces in a corresponding excitation region.
Figure 6B:
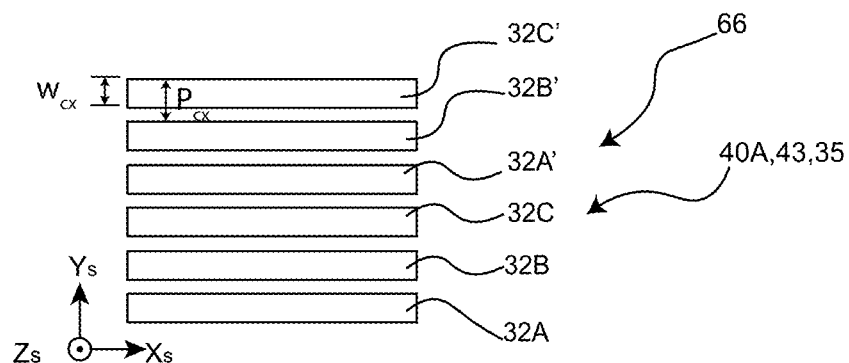
Figure 6C:
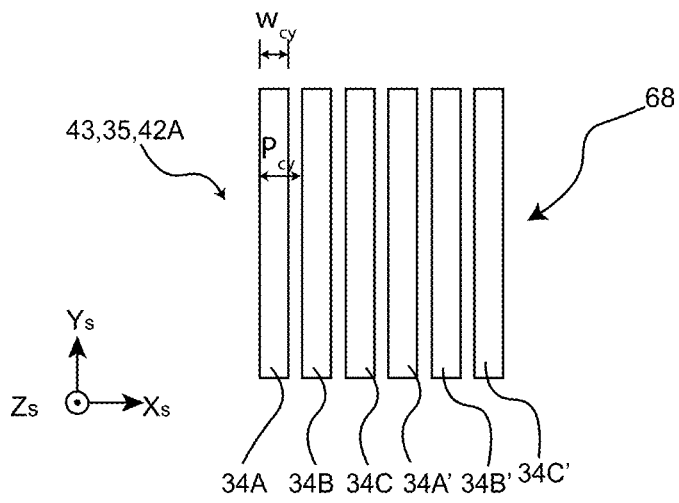

FIGS. 6A-6C each show schematic depictions of portions of coil trace layers 40, 42 and/or coil traces 32, 34 in a corresponding excitation region 43. FIG. 6A is a cross-sectional view (along a stator-X/stator-z plane) of one excitation region 43 of stator coil assembly 35 comprising a plurality of coil trace layers 40A, 40B, 42A, 42B (collectively, coil trace layers, 40, 42). In the FIG. 6A embodiment, each coil trace layer 40, 42 extends in the stator-X and stator-Y directions across corresponding excitation region 43, although this is not necessary. In the FIG. 6A embodiment, stator 30 comprises a plurality of x-trace layers 40A, 40B located at different stator-z locations and a plurality of y-trace layers 42A, 42B located at different stator-z locations in one excitation region 43 (although this is not necessary). In the FIG. 6A embodiment, each coil trace layer 40, 42 is separated from adjacent coil trace layers 42, 40 by an insulation layer 47. Insulation layer 47 prevents electrical conduction between coil trace layers 40, 42. Each coil trace layer 40, 42 extends generally in the stator-X and stator-Y directions with its normal direction generally parallel to the stator-z direction. As discussed above, each coil trace layer 40, 42 comprises a plurality of coil traces which may be distributed over at least a portion of the layer and which extend in a particular stator direction (e.g. in the stator-X direction or the stator-Y direction).

FIG. 6B is a schematic cross-sectional view (along a stator-X/stator-Y plane) of a portion of a first coil trace layer 40A according to a particular embodiment. Coil trace layer 40B may have characteristics similar to coil trace layer 40A. The portion of coil trace layer 40A shown in the FIG. 6B embodiment comprises a plurality (referred to herein as a group) 66 of coil traces 32A, 32B, 32C, 32A', 32B', 32C' (collectively, coil traces 32), with each coil trace 32 linearly elongated in the stator-X direction. Due to their elongation in the stator-X direction, coil traces 32 may be referred to herein as x-traces 32 and group 66 and coil trace layer 40A may be respective referred to as an x-trace group 66 and an x-trace layer 40 or an x-group 66 and an x-layer 40. The x-traces 32 may extend in the stator-X direction across x-trace layer 40 and/or across a corresponding excitation region 43. The x-trace layer 40 in one excitation region 43 may comprise one or more x-trace groups 66, which may be distributed across x-trace layer 40 and/or a corresponding excitation region 43 in the stator-Y direction. As explained in more detail below, in some embodiments, each x-trace group 66 may comprise a plurality of x-coil traces 32 which may be driven (by one or more connected amplifiers 70) with corresponding multi-phase currents so that one phase of the multi-phase currents is driven into each x-coil trace 32 in the x-trace group 66. In some embodiments, the multi-phase currents have a number n of effective phases and the number of x-traces 32 in each x-trace group 66 is 2n, where each x-trace 32 is connected to receive a phase of the multiphase current in one direction or in the opposing direction. FIG. 6C is a schematic cross-sectional view (along a stator-X/stator-Y plane) of a second coil trace layer 42A according to a particular embodiment. Coil trace layer 42B may have characteristics similar to coil trace layer 42A. Coil trace layer 42A of the FIG. 6C embodiment comprises a plurality (referred to herein as a group) 68 of coil traces 34A, 34B, 34C, 34A', 34B', 34C' (collectively, coil traces 34), with each coil trace 34 linearly elongated in the stator-Y direction. Due to their elongation in the stator-Y direction, coil traces 34 may be referred to herein as y-traces 34 and group 68 and coil trace layer 42A may be respective referred to as a y-trace group 68 and a y-trace layer 42 or a y-group 68 and a y-layer 42. The y-traces 34 may extend in the stator-Y direction across y-trace layer 42 and/or a corresponding excitation region 43. The y-trace layer 42 in one excitation region 43 may comprise one or more y-trace groups 68, which may be distributed across y-trace layer 42 and/or a corresponding excitation region 43 in the stator-X direction. As explained in more detail below, in some embodiments, each y-trace group 68 may comprise a plurality of y-coil traces 34 which may be driven (by one or more connected amplifiers 70) with corresponding multi-phase currents so that one phase of the multi-phase currents is driven into each y-coil trace 34 in the y-trace group 68. In some embodiments, the multi-phase currents have a number n of effective phases and the number of y-traces 34 in each y-trace group 68 is 2n, where each y-trace 34 is connected to receive a phase of the multiphase current in one direction or in the opposing direction.

It will be appreciated that the number of coil traces 32, 34 in groups 66 need not be limited to the exemplary six traces shown in FIGS. 6B, 6C although this number of traces in a group is convenient for using three-phase current as explained in more detail below. In some embodiments, coil trace layers 40, 42 adjacent to one another in the stator-z direction may comprise coil traces that are non-parallel with respect to one another. In some embodiments, coil trace layers 40, 42 adjacent to one another in the stator-z direction may comprise coil traces that are orthogonally oriented with respect to one another. It will be appreciated that the number of coil trace layers 40, 42 in stator 30 need not be limited to the four traces shown in the illustrative embodiment of FIG. 6A. In general, stator 30 may comprise any suitable number of coil trace layers 40, 42. Further, it is not a requirement that the orientations of coil traces in coil trace layers 40, 42 adjacent to one another in the stator-z direction be different from one another. In some embodiment, coil traces may be provided which extend in directions other than the stator-X or stator-Y directions. Such traces which may be referred to as a-traces are described in PCT/CA2015/050157.

Further details of stator, coil traces, excitation regions and coil trace layers are described in Patent Cooperation Treaty Patent application Nos. PCT/CA2012/050751, PCT/CA2014/050739 and PCT/CA2015/050157.

Control and Operation

In some embodiments, x-traces 32 in different x-trace layers 40, in different x-trace groups 66 and/or individual x-traces 32 may each be independently driven (by amplifiers 70 under the control of controller 60) with different power amplifier channels. Similarly, in some embodiments, y-traces 34 in different y-trace layers 42, in different y-trace groups 68 and/or individual y-traces 34 may each be independently driven (by amplifiers 70 under the control of controller 60) with different power amplifier channels. While such independent connection provides maximum flexibility of control, this configuration is not necessary in all embodiments or applications. In some embodiments, x-traces 32 in different x-trace layers 40 or in different x-trace groups 66 of one excitation region 43 may be connected serially or in parallel and y-traces 34 in different y-trace layers 42 or in different y-trace groups 68 of one excitation region 43 may be connected serially or in parallel.

Figure 7:
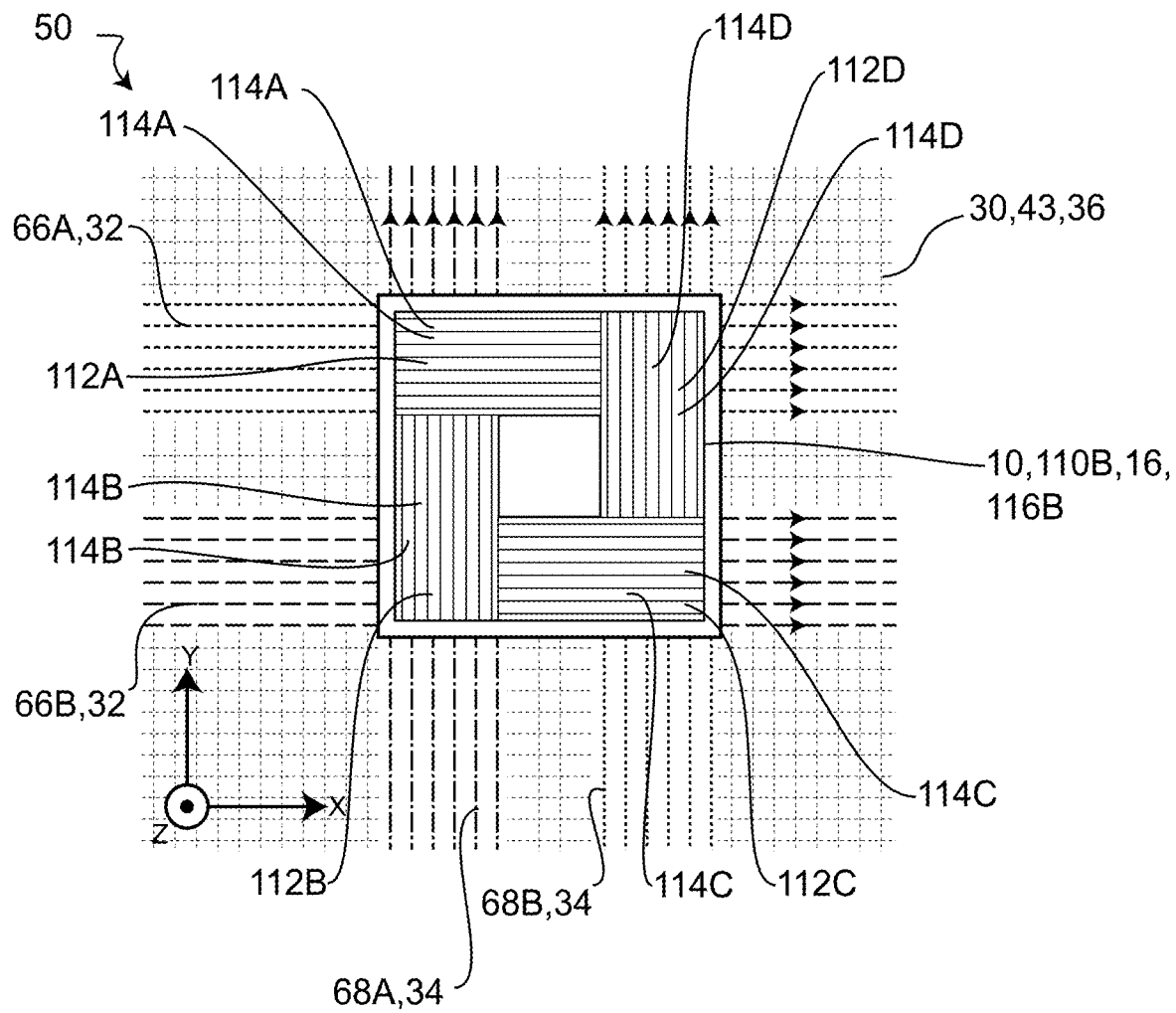
FIG. 7 is a schematic top view of the FIG. 1 displacement device incorporating a moveable stage having the FIG. 3B magnet array assembly according to a particular embodiment.

In general, current driven through the coil traces 32, 34 is used to propel moveable stage 10 to a desired position relative to stator 30 (e.g. in working region 36) and/or to a desired orientation relative to stator 30. Current driven in x-traces 32 may be used to impart force onto (and thereby propel) moveable stage 10 along a stator-Y direction to track a desired stator-Y position $y_r$; current driven in y-coil traces 34 may be used to impart force onto (and thereby propel)

moveable stage 10 along a stator-X direction to track a desired stator-X position $x_r$. Either or both of current driven in x-traces 32 and y-traces 34 may be used to pivot moveable stage 10 around a stator-z oriented axis. Either or both of current driven in x-traces 32 and y-traces 34 may be used to impart force onto (and thereby propel) moveable stage 10 in a stator-z direction. Current driven in x-traces 32 may be used to pivot moveable stage 10 around a stator-X oriented axis; current driven in y-traces 34 may be used to pivot moveable stage 10 around a stator-Y oriented axis. The schematic illustration of displacement device 50 shown in FIG. 7 is useful for explaining the particulars of the operation of displacement device 50. The FIG. 7 displacement device 50 comprises a moveable stage 10 and a magnet array assembly 16 which are similar to moveable stage 110 and magnet array assembly 116B shown in FIG. 3B, although the principles of operation are similar for other moveable stages and other magnet array assemblies 16 described herein. A portion of stator 30 (e.g. an excitation region 43 or a portion of an excitation region 43) is shown schematically in FIG. 7 by an intersecting array of lines which represent x-traces 32 and y-traces 34. To facilitate explanation, it is assumed that each x-trace 32 and each y-trace 34 is independently controllable—i.e. that the current driven into such traces 32, 34 is independently controllable. X-traces 32 include two x-trace groups 66A, 66B which are shown with bold lines to indicate that they are active (i.e. that current is being driven into the x-traces 32 of x-trace groups 66A, 66B) and y-traces 34 include two y-trace groups 68A, 68B which are shown with bold lines to indicate that they are active (i.e. that current is being driven into the y-traces 34 of y-trace groups 68A, 68B). The magnetic fields associated with the currents being driven in x-trace groups 66A, 66B interact primarily with x-magnet arrays 112A, 112C respectively; and the magnetic fields associated with the currents being driven in y-trace groups 68A, 68B interact primarily with y-magnet arrays 112B, 112D respectively. More particularly: when x-traces 32 in x-trace group 66A are carrying current, they interact with x-magnet array 112A to impart forces on moveable stage 10 in the y and z directions; when y-traces 34 in y-trace group 68A are carrying current, they interact with y-magnet array 112B to impart forces on moveable stage 10 in the x and z directions; when x-traces 32 in x-trace group 66B are carrying current, they interact with x-magnet array 112C to impart forces on moveable stage 10 in the y and z directions; and when y-traces 34 in y-trace group 68B are carrying current, they interact with y-magnet array 112D to impart forces on moveable stage 10 in the x and Z directions.

It will be appreciated that coil traces 32, 34 shown in FIG. 7 can be selectively activated (e.g. by driving current through the coil traces 32, 34) to impart desired forces on moveable stage 10 and to thereby control the motion (e.g. position) of moveable stage 10 with six degrees of freedom relating to the rigid body motion of moveable stage 10. In some embodiment, each x-trace group 66 and each y-trace group 68 can be selectively activated (e.g. by driving current through the traces corresponding to the coil trace group 66, 68) or deactivated. When a coil trace group 66, 68 is selectively activated, the coil traces corresponding to the coil trace group 66, 68 may be driven with multi-phase currents by one or more multi-phase amplifiers 70. In general, such multi-phase currents can comprise two-phases, three-phases, or any suitable number of phases. When moveable stage 10 is shown in the particular position shown in FIG. 7, coil traces 32, 34 other than those in groups 66A, 66B, 68A, 68B may be inactive. However, it will be appreciated that as moveable stage 10 moves relative to stator 30, different groups of coil traces 32, 34 may be selected to be active and to impart desired forces on moveable stage 10.

It may be observed that the active coil traces 32, 34 in groups 66A, 66B, 68A, 68B appear to interact with other magnet arrays. For example, when carrying current, x-traces 32 in x-trace group 66B interact with x-magnet array 112C as discussed above, but x-traces 32 in x-trace group 66B also pass under a portion of y-magnet array 112B. One might expect that, the currents in x-trace group 66B might interact with the magnets in y-magnet array 112B and impart additional forces on moveable stage 10. However, because of the aforementioned characteristics of y-magnet array 112B, the forces that might have been caused by the interaction of currents in x-trace group 66B and the magnetization segments 114B of y-magnet array 112B cancel one another out, such that these parasitic coupling forces may be eliminated or kept to a minimal level. More particularly, the characteristics of y-magnet array 112B that eliminate or reduce these cross-coupling forces include: y-magnet array 112B comprises magnetization segments 114B which are generally elongated in the stage-Y direction with varying magnetizations which are oriented orthogonally to the stage-Y direction; the x-dimension width $W_{mx}$ of y-magnet array 112B is $W_{mx}=N_m\lambda_x$ where $N_m$ is an integer and $\lambda_x$ is the magnetic period $\lambda_x$ described above; and y-magnet array 112B is mirror symmetric about a y-z plane 141 that runs through the center of the stage-X dimension of y-magnet array 112B. Similar characteristics of y-magnet array 112D may eliminate or minimize cross-coupling from x-traces 32 in x-trace group 66A. In an analogous manner, the characteristics of x-magnet array 112A may eliminate or reduce cross-coupling forces from y-traces 34 in y-trace group 68A. Such characteristics of x-magnet array 112A include: x-magnet array 112A includes magnetization segments 114A which are generally elongated in the stage-X direction with varying magnetizations which are oriented orthogonally to the stage-X direction; the y-dimension width $W_{my}$ of x-magnet array 112A is $W_{my}=N_m\lambda_y$ where $N_m$ is an integer and $\lambda_y$ is the magnetic period $\lambda_y$ described above; and x-magnet array 112A is mirror symmetric about a x-z plane that is orthogonal to the y-axis and runs through the center of the y-dimension of x-magnet array 112A. Similar characteristics of x-magnet array 112C may eliminate or minimize cross coupling from y-traces 34 in y-trace group 68B.

Further details relating to how currents driven into coil traces 32, 34 impart forces onto moveable stage 10 are described in PCT/CA2012/050751.

Displacement device 50 comprises one or more amplifiers 70 which are connected (e.g. with suitable electrical connections (not expressly shown in FIG. 1)) to drive a plurality of currents into coil traces 32, 34. Amplifiers 70 are controlled by controller 60 which is connected and configured to provide control currents to amplifiers 70. Controller 60 (and components thereof) may comprise hardware, software, firmware or any combination thereof. For example, controller 60 may be implemented on a programmed computer system comprising one or more processors, user input apparatus, displays and/or the like. Controller 60 may be implemented as an embedded system with a suitable user interface comprising one or more processors, user input apparatus, displays and/or the like. Processors may comprise microprocessors, digital signal processors, graphics processors, field programmable gate arrays, and/or the like. Components of controller 60 may be combined or subdivided, and components of controller 60 may comprise sub-components shared with other components of controller 60.

Components of controller 60, may be physically remote from one another. Controller 60 may be connected (e.g. with suitable electrical connections (not expressly shown in FIG. 1)) to deliver control signals to amplifiers 70. Controller 60 may be configured (e.g. using suitable software, logic configuration and/or the like) to use those control signals to control the currents driven by amplifiers 70 into at least some of coil traces 32, 34 to thereby cause moveable stage 10 to track a desired position within relative to stator 30 in working region 36—e.g. a desired position, $(x_r, y_r)$, within working region 36, where $x_r$ is a desired position of moveable stage 10 in the stator-X direction and $y_r$ is a desired position of moveable stage 10 in the stator-Y direction.

Figure 8A:
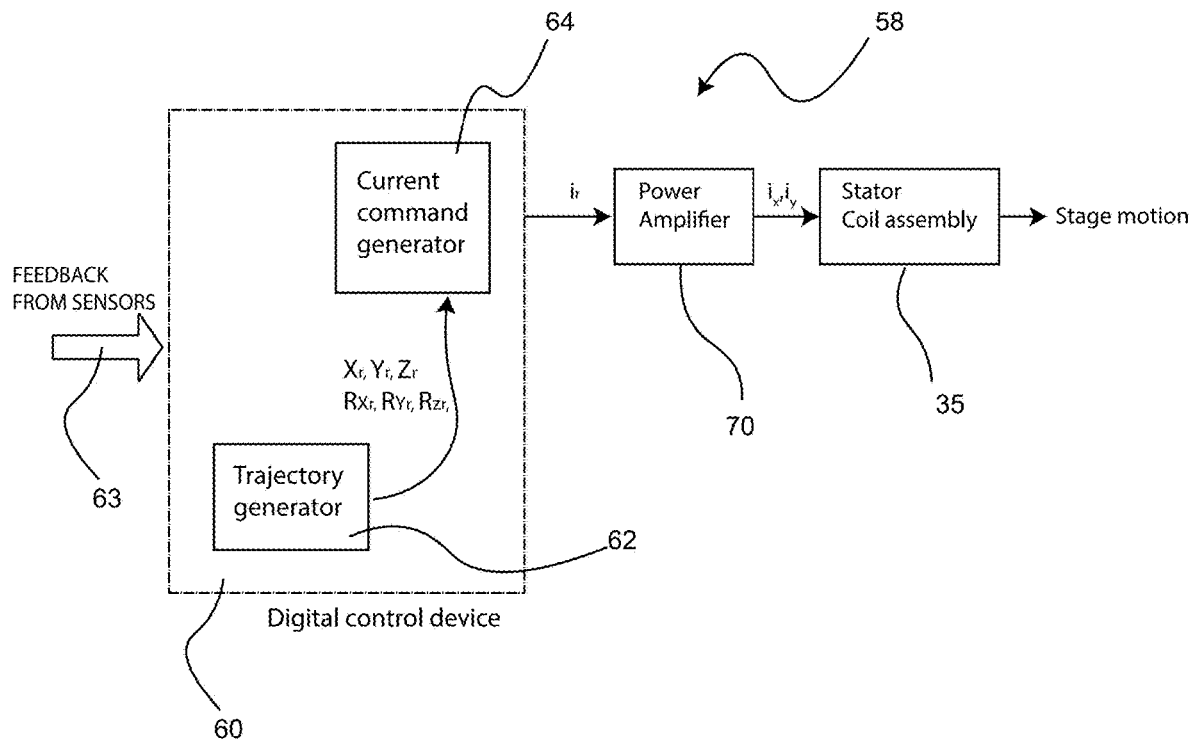
FIGS. 8A and 8B are respectively a schematic block diagram of a control system suitable for use in controlling any of the displacement devices described herein according to a particular embodiment and one possible connection scheme to connect a group of y-traces in one coil trace layer within an excitation region according to a particular embodiment.

FIG. 8A shows a schematic block diagram of a control system 58 suitable for use in controlling any of the displacement devices 50 described herein according to a particular embodiment. Although they may be described as different embodiments, except where otherwise specifically noted, control system 58 and any of the control techniques, embodiments and methods described in the remainder of this description may be used with any of the displacement devices 50 described herein. Control system 58 of the FIG. 8A embodiment comprises controller 60, one or more amplifiers 70 and stator coil assembly 35. Controller 60 may be configured to control (e.g. by providing control signals to) one or more amplifiers 70 (illustrated, in FIG. 8A, as power amplifier 70) to drive currents into the plurality of coil traces in coil trace assembly 35. Such currents can be used by controller 60 to controllably move moveable stage 10 relative to stator 30 via forces associated with the interaction between the magnetic fields generated by currents in the plurality of coil traces and the magnetic fields of the magnet array assembly 16 on moveable stage 10. The currents may be controlled by controller 60 such that these magnetic forces on moveable stage 10 may attract moveable stage 10 toward stator 30 (e.g. in the negative stator-z direction) or may force stage 10 away from stator 30 (e.g. in the positive stator-z direction) at all times when controller 60 is controlling the currents driven by the one or more amplifiers 70.

In the illustrated embodiment, controller 60 is shown as comprising a trajectory generator 62 which generates desired or reference positions for each moveable stage 10. Such reference positions may include any one or more of: a desired or reference stator-X position $x_r$ of moveable stage 10, a desired or reference stator-Y position $y_r$ of moveable stage 10, a desired or reference stator-z position $z_r$ of moveable stage, a desired rotational orientations $rz_r$ of moveable stage 10 about a stage-z oriented axis (e.g. a stage-z oriented axis through the stage-X/stage-Y center of moveables stage 10 or magnet array assembly 16), a desired rotational orientations $rx_r$ of moveable stage 10 about a stage-X oriented axis (e.g. a stage-X oriented axis through the stage-Y/stage-z center of moveables stage 10 or magnet array assembly 16) and a desired rotational orientations $ry_r$ of moveable stage 10 about a stage-Y oriented axis (e.g. a stage-Y oriented axis through the stage-X/stage-z center of moveables stage 10 or magnet array assembly 16). The reference positions $(x_r, y_r, z_r, rx_r, ry_r, rz_r)$ (or any subset thereof) generated by trajectory generator 62 are typically based on user requirements, application requirements and/or stage feedback 63 relating to moveable stage(s) 10. By way of non-limiting example, stage feedback 63 may comprise measured characteristics, such as position, velocity, acceleration and/or orientation of moveable stage(s) 10 which may be obtained from suitable sensors. Stage feedback 63 can originate from any suitable measurement device(s), system(s) and/or method(s). Some non-limiting examples of suitable measurement device(s), system(s) and/or method(s) are described in Patent Cooperation Treaty application Nos. PCT/CA2012/050751 and PCT/CA2014/050739. For brevity, the remainder of this description will refer to controllably moving moveable stage(s) 10 to reference positions $(x_r, y_r)$ without loss of generality that similar principles could be used to control the motion (e.g. position) of moveable stage (10) with the six degrees of freedom corresponding to $(x_r, y_r, z_r, rx_r, ry_r, rz_r)$. In the illustrated embodiment, controller 60 also comprises a current command generator 64. Typically, although not necessarily, the desired position $(x_r, y_r)$ of a moveable stage 10 will vary over time, such that each of the reference positions $x_r, y_r$ is a function of time and may be described herein as $x_r(t), y_r(t)$ at a particular time, t. The evolutions of the desired positions $(x_r, y_r)$ over time may be referred to as a desired or reference trajectory. Generally, each moveable stage 10 has a unique reference trajectory. For brevity, except where otherwise dictated by the context or the description, this description will focus on the trajectory and corresponding control of one moveable stage 10, it being understood that trajectories and control of other moveable stages 10 may be similarly implemented. Current command generator 64 receives the desired position $(x_r, y_r)$ from trajectory generator 62 and stage feedback 63 and, based on this information, creates corresponding current control signals $i_r$ using a suitable motion control technique and a suitable current commutation technique. Some examples of suitable motion control and current commutation techniques are described Patent Cooperation Treaty application No. PCT/CA2012/050751. Current command generator 64 provides current control signals $i_r$ to amplifier(s) 70. It will be appreciated that current control signals $i_r$ may comprise a plurality of control signals. In response to these current control signals $i_r$, amplifier(s) 70 drive currents $i_x$, $i_y$ into at least some of the coil traces 32, 34 of stator coil assembly 35. In some embodiments, first currents $i_x$ may represent the currents driven into a first plurality of coil traces (e.g. stator-X oriented coil traces 32) and second currents $i_y$ may represent the currents driven into a second plurality of coil traces (e.g. stator-Y oriented coil traces 34). Accordingly, the currents $i_x$ may be referred to herein as x-currents and the currents $i_y$ may be referred to herein as y-currents. As discussed above, stator coil assembly 35 may also comprise α-oriented coil traces and amplifier(s) 70 may additionally or alternatively drive currents $i_α$ into these traces. However, except where otherwise dictated by the context, discussion of drive currents $i_α$ is omitted for brevity from the description of motion control.

Figure 8B:
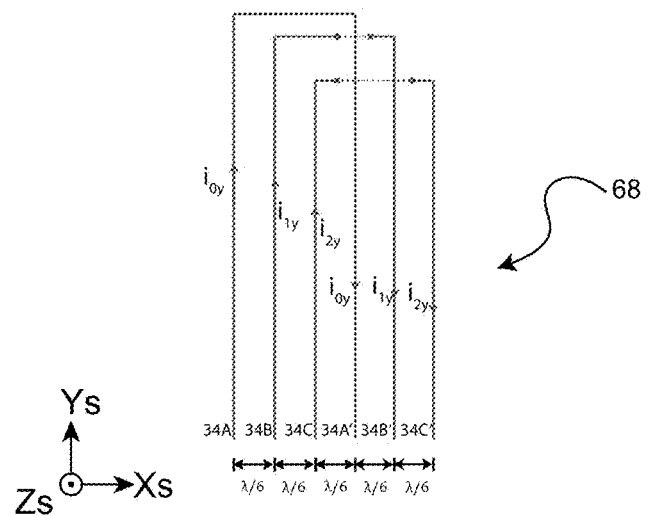

FIG. 8B schematically depicts one possible connection scheme to connect a plurality (e.g. a y-trace group 68) of y-traces 34 in one coil trace layer 42 within an excitation region 43 of stator 30 according to a particular embodiment. It will be appreciated that a plurality (e.g. an x-trace group 66) of x-traces 32 in layer 40 within excitation region 43 of stator 30 may have characteristics analogous to those of y-trace group 66 shown in FIG. 8B. While y-traces 34 shown in FIG. 8B are generally elongated in the stator-Y direction, there may be some terminal connections near the edges of one excitation region 43 which connect different y-traces 34 together. Trace terminating connections sometimes extend through one or more other layer(s) (e.g. another layer in the stator-z direction). The illustrated embodiment of FIG. 8B depicts a three-phase effective current embodiment where the y-currents $i_y$ corresponding to the y-traces 34 of y-trace group 68 comprise three different current phases $i_{jy}$ (j=0,1, 2), each of which flows along a first y-trace 34A, 34B, 34C in a first direction and returns along a second y-trace 34A',

34B', 34C' in an opposite, direction (e.g. current $i_{0y}$ flows in one direction along y-trace 34A and flows in the opposite direction along y-trace 34A'). This current configuration may be achieved by appropriate connection of amplifiers 70 to y-traces 34A, 34B, 34C, 34A', 34B', 34C' in a star configuration.

In the FIG. 8B embodiment, the currents $i_y$ corresponding to the y-traces 34 of y-trace group 68 may be described as comprising three effective current phases, because these currents $i_y$ include three current phases $i_{jy}$ flowing in the first direction and returning in the opposing direction at phases that are 180° out of electrical phase with one another. For example, in FIG. 8B embodiment, the current in trace 34A has the same amplitude as the current in trace 34A', but is flowing in an opposite direction; therefore, the currents in traces 34A, 34A' are not independent and are considered to be one effective current phase. In some embodiments, the currents $i_y$ corresponding to the y-traces 34 of a y-trace group 68 may comprise multi-phase currents comprising a plurality $m_p$ of current phases $i_{jy}$ (j=0,1, ..., $m_p-1$), where $m_p$ is an integer greater than one. Similarly, the currents $i_x$ corresponding to the x-traces 32 of an x-trace group 66 may comprise multi-phase currents comprising a plurality $n_p$ of current phases $i_{kx}$ (k=0,1, ..., $n_p-1$), where $n_p$ is an integer greater than one. The currents $i_x$ may be referred to as first currents $i_x$ or x-currents $i_x$ and their corresponding current phases $i_x$ may be referred to as first current phases $i_{kx}$ or x-current phases $i_{kx}$. The currents $i_y$ may be referred to as second currents $i_y$ or y-currents $i_y$ and their corresponding current phases $i_{jy}$ may be referred to as second current phases $i_{jy}$ or y-current phases $i_{jy}$. In some embodiments, the first currents $i_x$ comprise a plurality of first current phases, $i_{kx}$, where k is an integer from 0 to $n_p-1$ representing a first phase index. Such embodiments may be described has having $n_p$ effective first current phases $i_{kx}$. Similarly, in some embodiments, the second currents $i_y$ comprise a plurality of second current phases, $i_{jy}$, where j is an integer from 0 to $m_p-1$ representing a second phase index, where $m_p$ is the effective number of second current phases.

To control the position of moveable stage 10 relative to stator 30 in displacement device 50, it may be desirable to obtain stage feedback 63 which may comprise, for example, measured characteristics, such as position, velocity, acceleration and/or orientation of moveable stage(s) 10 relative to stator 30 or to some other reference. Stage feedback 63 may be obtained from suitable sensors, measurement systems measurement methods and/or the like. Any suitable sensors, measurement systems measurement methods and/or the like may be used to determine stage feedback 63. Non-limiting examples of suitable sensors which may be used to provide some or all of stage feedback 63 include: laser displacement interferometers, two-dimensional optical encoders, laser triangulation sensors, capacitive displacement sensors, eddy current displacement sensors, reflective surfaces suitable for interferometry, accelerometers, Hall-effect sensors and/or the like. Different position sensing techniques can be combined to provide an overall system. Various suitable stage feedback sensor systems and methods are described in Patent Cooperation Treaty application Nos. PCT/CA2012/050751 and PCT/CA2014/050739.

Figure 9:
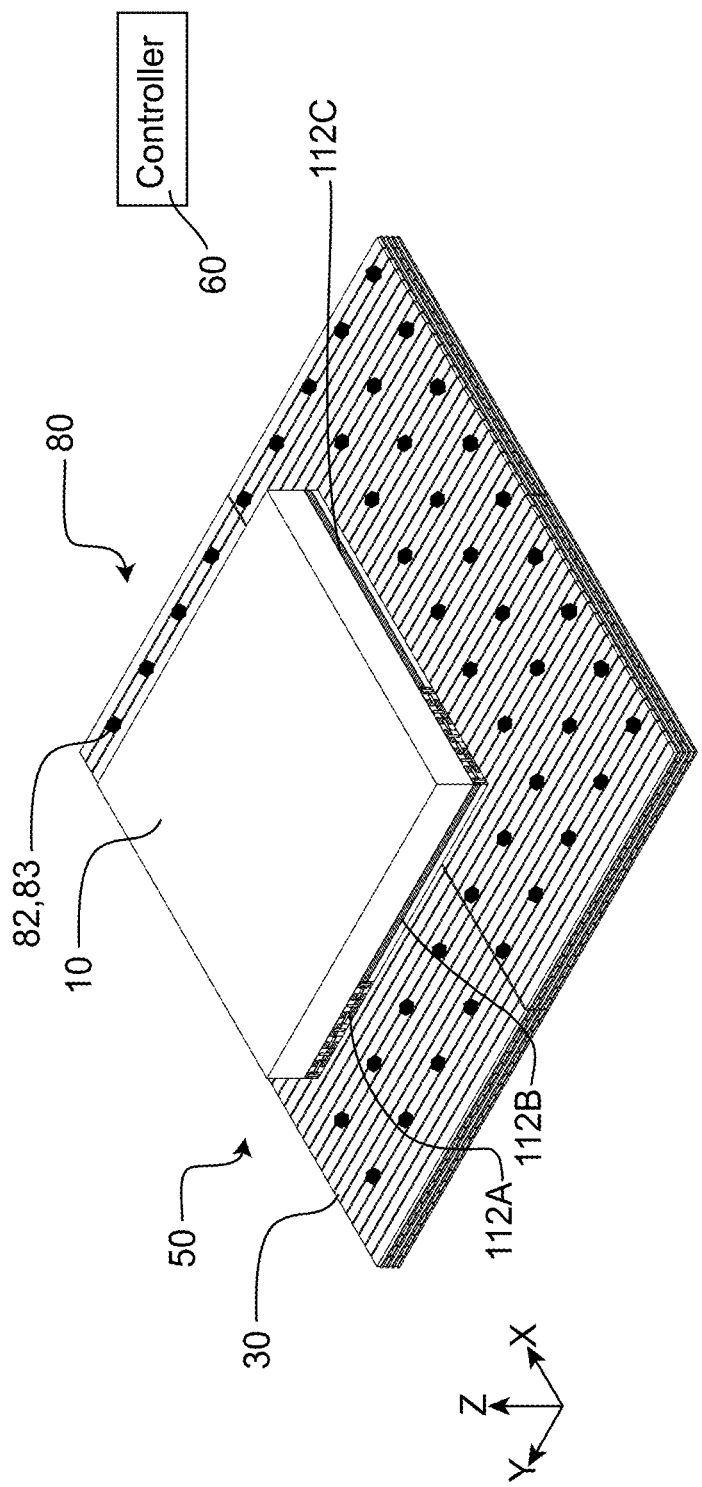
FIG. 9 is a partial schematic isometric view of a displacement device comprising a stage feedback sensing system according to a particular embodiment of the invention.

FIG. 9 depicts an embodiment of displacement device 50 comprising a stage feedback sensing system 80 comprising a plurality of magnetic field sensors 82 distributed in an array 83 in a plane extending in the stator-X direction and the stator-Y direction with a normal direction in the stator z-direction. Sensors 80 may generate stage feedback 63 (see FIG. 8A) which may be used by controller 60 to determine or estimate measured characteristics of moveable stage 50. By way of non-limiting example, controller 60 may determine the position, velocity, acceleration and/or orientation of moveable stage 50 relative to stator 30, relative to some reference on or associated with stator 30 and/or relative to some other reference (e.g. some other static reference). In some embodiments, array 83 of sensors 82 is arranged in stator-X oriented sensor rows and stator-Y oriented sensor columns, where sensors 82 in a stator-X oriented sensor row are generally aligned with one another in the stator-X direction and sensors 82 in a stator-Y oriented sensor column are generally aligned with one another in the stator-Y direction. Magnetic field sensors may comprise hall-effect sensors, magneto-resistive sensing elements, magneto-strictive sensing elements and/or any suitable sensor element that is sensitive to magnetic field flux density. Suitable sensing systems 82 incorporating sensor arrays 83 which may be used to generate stage feedback 63 are described in detail in Patent Cooperation Treaty application No. PCT/CA2014/050739 and may be used with any of the displacement devices described herein.

Multiple Moveable Stages on Rectangular Excitation Regions

Figure 10A:
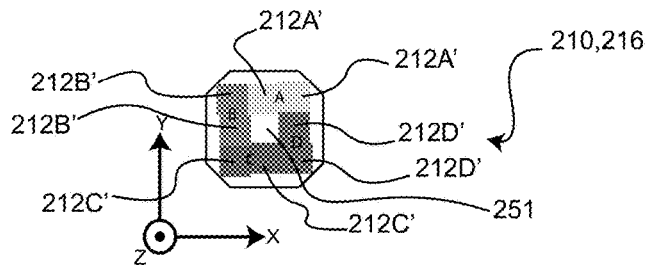
FIG. 10A is a schematic depiction of moveable stage and a magnet array assembly according to a particular embodiment.

FIG. 10A shows a non-limiting embodiment of a moveable stage 210 and a corresponding magnet array assembly 216 according to a particular embodiment. Magnet array assembly 216 comprises a plurality (e.g. four in the illustrated embodiment) of magnet arrays 212A, 212B, 212C, 212D (collectively, magnet arrays 212). For brevity, magnet arrays 212A, 212B, 212C, 212D of the FIG. 10A magnet array assembly 216 may be referred to as magnet arrays A, B, C, D. Magnet array assembly 216 is an elongated segment magnet array assembly 216 comprising a plurality of elongated magnet arrays 212. Magnet array assembly 216 is similar to magnet array assembly 116B (FIG. 3B) described above, except that magnet array assembly 216 is a right-handed magnet array assembly 216, whereas magnet array assembly 116B (FIG. 3B) is a left-handed magnet array assembly 116B. Magnet arrays B and D are elongated in the stage-Y direction, and each comprise a plurality of linearly-elongated magnetization segments 214 (see FIG. 10E) with magnetization directions orthogonal to their stage-Y elongation direction. Magnet arrays A and C are elongated in the stage-X direction, and each comprise a plurality of linearly-elongated magnetization segments 214 (see FIG. 10E) with magnetization directions orthogonal to their stage-X elongation direction. Although FIG. 10E shows a y-magnet array 212B, it should be appreciated that x-magnet arrays A, may have characteristics similar to those of the FIG. 10E y-magnet array 212B, with appropriate modification to the directions.

In the particular case of the illustrated embodiment shown in FIG. 10A, x-magnet arrays A and C are each split by a middle plane oriented in stage-Y/stage-z direction to provide magnet array A with a pair of x-sub-arrays 212A' and to provide magnet array C with a pair of x-sub-arrays 212C'. X-sub-arrays 212A' of the FIG. 10 embodiment are offset from one another in the stage-Y direction by an amount $\lambda/10$ which may tend to attenuate fifth-order harmonic field distortion. X-sub-arrays 212C' of the FIG. 10 embodiment are similarly offset from one another in the stage-Y direction by an amount $\lambda/10$ which may tend to attenuate fifth-order harmonic field distortion on the x-coil traces. Each x-sub-array 212A', 212C' of the FIG. 10 embodiment has a stage-Y-direction width $W_{my}$ of $\lambda$ and a stage-X direction length of $2\lambda$, although this is not necessary. Similarly, in the particular case of the illustrated embodiment shown in FIG.

10A, y-magnet arrays B and D are each split by a middle plane oriented in stage-X/stage-z direction to provide magnet array B with a pair of y-sub-arrays 212B' and to provide magnet array D with a pair of y-sub-arrays 212D'. Y-sub-arrays 212B', 212D' of the FIG. 10 embodiment may offset from one another in the stage-X direction by an amount λ/10 which may tend to attenuate fifth-order harmonic field distortion on the y-coil traces. Each y-sub-array 212B', 212D' of the FIG. 10 embodiment has a stage-X-direction width $W_{mx}$ of λ and a stage-Y direction length of 2λ, although this is not necessary. The division of magnet arrays A, B, C, D into offset sub-arrays 212A', 212B', 212C', 212D' is not necessary. In some embodiments, magnet arrays A, B, C, D are similar to any of the other elongated segment magnet arrays described herein. Magnet array assembly 216 may comprise a space 251 having dimensions Sx=Sy=λ between the adjacent edges of its magnet arrays A, B, C, D and offsets Ox=Oy=λ between corresponding edges of its magnet arrays A, B, C, D. Moveable stage 210 may comprise bumper components (not explicitly enumerated) similar to those described above for moveable stage 10.

Figure 10B:
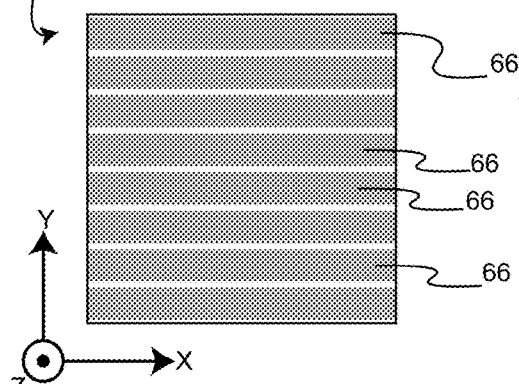
FIG. 10B shows an x-trace layer corresponding to a excitation region of a stator according to a particular embodiment.
Figure 10C:
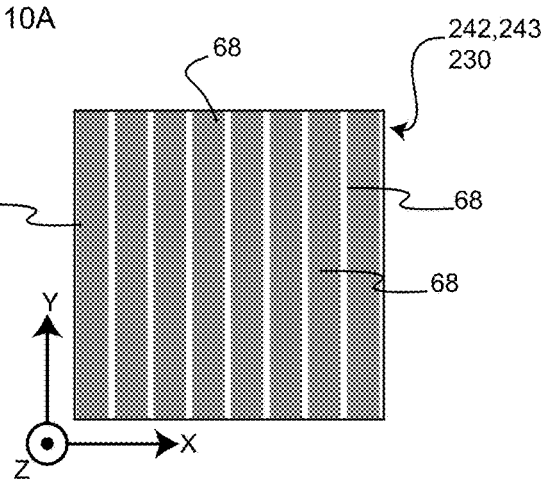
FIG. 10C shows a y-trace layer corresponding to the excitation region of the FIG. 10B stator according to a particular embodiment.
Figure 10D:
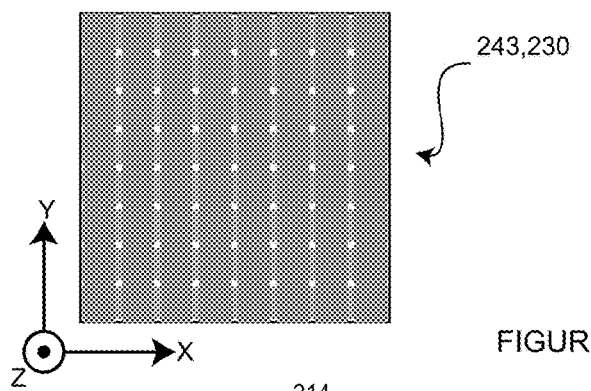
FIG. 10D is a schematic depiction of the entire excitation region incorporating the FIG. 10B x-trace layer and the FIG. 10C y-trace layer.
Figure 10E:
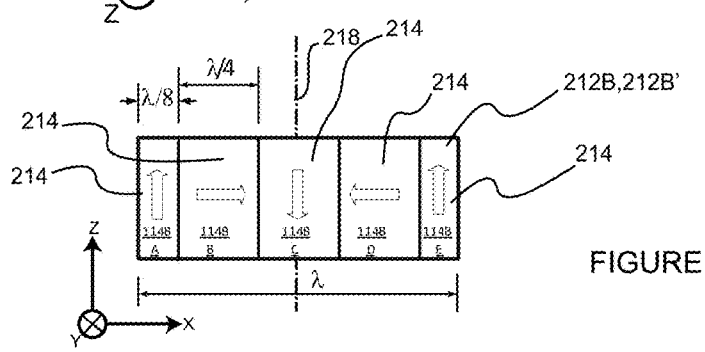
FIG. 10E is a cross-sectional view of one of the y-magnet arrays of the FIG. 10A magnet array assembly.

FIG. 10B shows an x-trace layer 240 in an excitation region 243 of a stator 230 which may be used in conjunction with the FIG. 10A moveable stage 210. X-trace layer 240 of excitation region 243 comprises a plurality of x-trace groups 66, where each x-trace group 66 has a stator-Y direction width $W_{gy}=λ$ and comprises a plurality of x-traces (not explicitly enumerated) which can be energized (i.e. into which currents can be driven) independently of the other x-trace groups 66. In one particular embodiment, each x-trace group 66 comprises six x-traces connected so that current can be driven into the six x-traces by one three-phase amplifier 70 in a manner similar to that described above in connection with FIG. 8B. FIG. 10C shows a y-trace layer 242 in an excitation region 243 of a stator 230 which may be used in conjunction with the FIG. 10A moveable stage 210. Y-trace layer 242 of excitation region 243 comprises a plurality of y-trace groups 68, where each y-trace group 68 has a stator-X direction width $W_{gx}=λ$ and comprises a plurality of y-traces (not explicitly enumerated) which can be energized (i.e. into which currents can be driven) independently of the other y-trace groups 68. In one particular embodiment, each y-trace group 68 comprises six y-traces connected so that current can be driven into the six y-traces by one three-phase amplifier 70 in a manner similar to that described above in connection with FIG. 8B. FIG. 10D shows a top view of an overall excitation region 243 of stator 230, which comprise a plurality of trace layers including x-trace layer 240 (FIG. 10B) and y-trace layer 242 (FIG. 10C). In FIG. 10C, x-trace layer 240 and y-trace layer 242 overlap with one another in the stator z-direction over the extent of excitation region 243 in the stator-X/stator-Y directions. The stator-z direction order of x-trace layer 240 and y-trace layer 242 may be interchanged in some embodiments. Additional x-trace layer(s) 240 and/or y-trace layer(s) may be provided in some embodiments.

FIG. 10E shows a stage-X/stage-z cross-sectional side view of magnet array 212B (or one of its sub-arrays 212B') in the FIG. 10A moveable stage 210. Comparing FIG. 10E to FIG. 3C, it can be seen that magnet array 212B comprises features substantially similar to those of magnet array 112B described above in connection with FIG. 3C. Magnet array 212B contains two edge magnetization segments 214 with widths that are half those of inner magnetization segments 214. In each sub-array 212B' of the FIG. 10E embodiment, there are $N_t=4$ different magnetization directions, and the widths of inner magnetization segments 214 is $λ/N_t$ and the widths of edge magnetization segments 214 is $λ/2N_t$. Generally, $N_t$ can be any integer number greater than 1. Each sub-array 212B' is symmetric about a plane 218 extending in stage-Y and stage-z and passing through the stage-X dimension center of sub-array 212B'. Other magnet arrays 212A, 212C, 212D of magnet array assembly 216 may have similar features. Other than for their locations, the sub-arrays in one magnet array of magnet array assembly 216 may be identical.

Figure 11A:
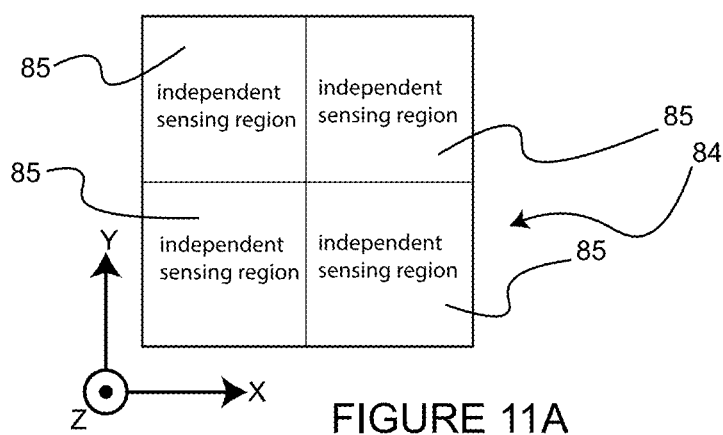
FIG. 11A shows a position sensing layer corresponding to an excitation region of the FIG. 10 stator.
Figure 11B:
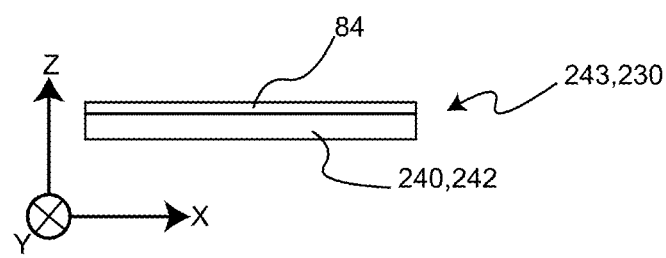
FIG. 11B shows a side of an excitation region, which includes a position sensing layer atop a number of coil trace layers according to a particular embodiment.

FIG. 11A shows a position sensing layer 84 corresponding to an excitation region 243 of the FIG. 10 stator 230. Each position sensing layer 84 corresponding to each excitation region 243 comprises a plurality (e.g. four in the case of the FIG. 11A embodiment) of independent position sensing regions 85. Each position sensing region 85 may comprise a sensing system 80 similar to sensing system 8 described above in connection with FIG. 9. For example, in each position sensing region 85, a plurality of magnetic field sensing elements 82 or other suitable elements are distributed in a matrix format 83 to measure moveable stage 210 positions (or other characteristics, as described above), independently from other position sensing regions 85. FIG. 11B shows a side view of a excitation region 243, which includes a position sensing layer 84 atop a number of coil trace layers 240, 242. Although position sensing layer 84 is shown on the positive stator-z side of coil trace layers 240, 242 in the FIG. 11 embodiment, this is not necessary. In some embodiments, position sensing layer 84 may additionally or alternatively be located on the negative stator-z side of coil trace layers 240, 242 as described, for example, in Patent Cooperation Treaty application No. PCT/CA2014/050739.

Figure 12:
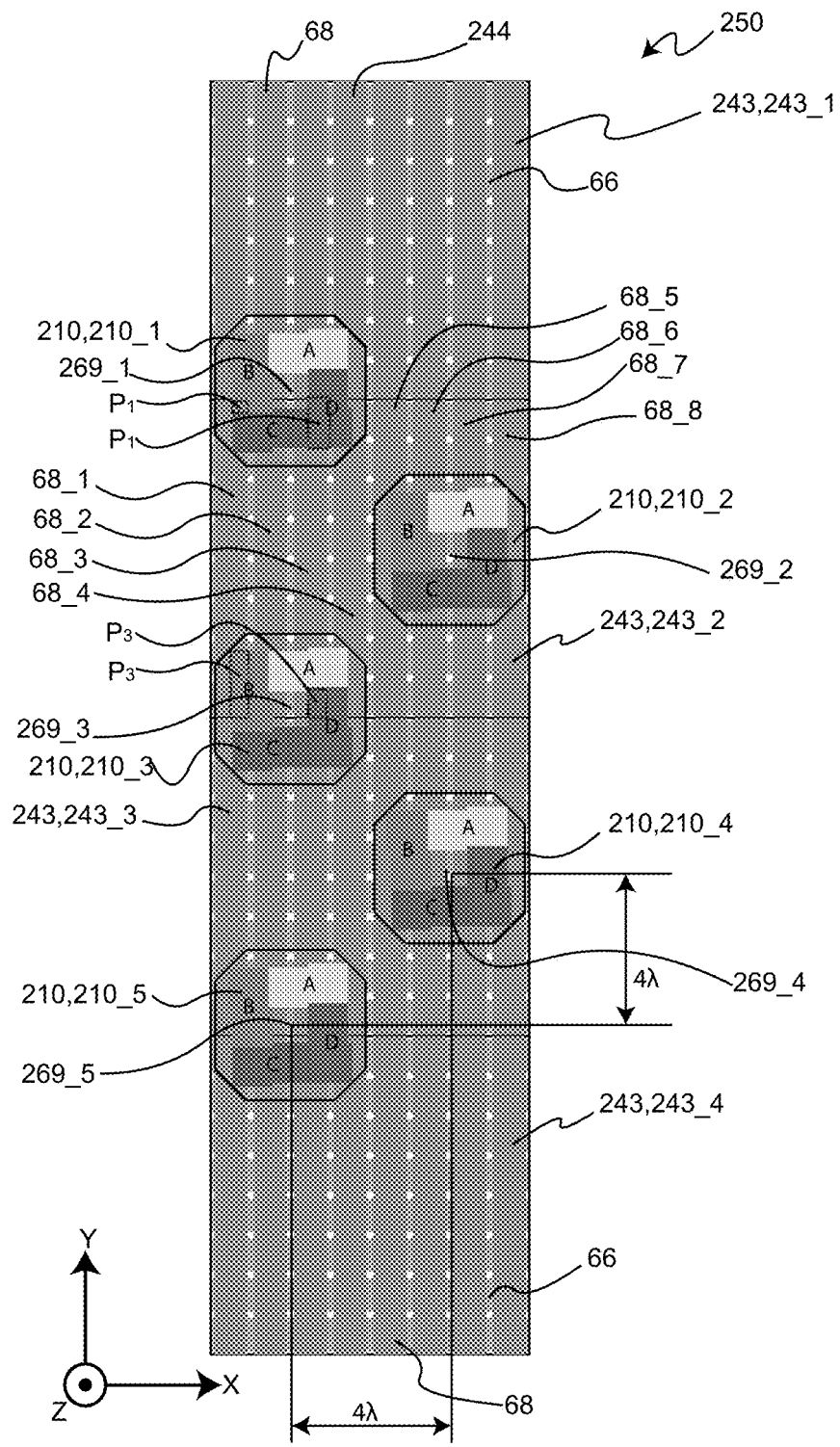
FIG. 12 shows a non-limiting embodiment of a displacement device according to the FIG. 10 embodiment, which comprises a plurality of moveable stages and a plurality of excitation regions.

FIG. 12 shows a non-limiting embodiment of a displacement device 250 according to another particular embodiment of the invention. Displacement device 250 of the illustrated FIG. 12 embodiment comprises a plurality (e.g. five in the case of the illustrated embodiment) of moveable stages 210 and a stator 230 comprising a plurality (e.g. four in the case of the illustrated embodiment) of excitation regions 243. Multiple excitation regions 243 can form a stator lane or other patterns (which may be arbitrary and which may be suited for particular applications). In this description and the accompanying claims, a stator lane (or, for brevity, a lane) may be defined as a plurality of excitation regions 243 arranged edge to edge and adjacent to one another to form a line in the stator-X or stator-Y direction. In the particular case of the FIG. 12 example embodiment, stator 230 comprises a stator lane 244 wherein the x-oriented edges of a plurality of excitation regions 243 are arranged to abut against one another to provide a stator lane 244 that extends in a line in the stator-Y direction. In FIG. 12 and this description, individual moveable stages 210 and individual excitation regions 243 may be indexed by an additional reference number to distinguish individual moveable stages 210 and individual excitation regions 243 from one another, where such distinction is desired. For example, the individual moveable stages 210 shown in the FIG. 12 example embodiment may be individually referred to as moveable stages 210_1, 210_2, 210_3, 210_4 and 210_5 and the individual excitation regions 243 in the FIG. 12 example embodiment may be referred to as excitation regions 243_1, 243_2, 243_3, 243_4.

When any two moveable stages 210 of displacement device 250 are arranged (e.g. by controllable movement) without overlap in the stator-X direction and without overlap in the stator-Y direction (for example, moveable stages 210_2 and 210_3), each moveable stage 210 can be controlled individually and independently in six degrees-of-freedom (DOF)—i.e. translation in x, y, and z and rotation about x, y and z axes. In the particular case of the illustrated FIG. 12 embodiment, each moveable stage 210 comprises a plurality (e.g. 4) magnet arrays 212 and each magnet array 212 is λ wide (across its elongation direction), and each excitation region is 8λ by 8λ with a plurality (e.g. 4) independent position sensing regions 85. In the particular case of the illustrated FIG. 12 embodiment, two moveable stages 210 of displacement device 250 can be completely independently controlled provided that their magnet array assemblies 216 have center-to-center spacing of not less than 4λ in the stator-X direction and not less than 4λ in the stator-Y direction. Moveable stages 210 having this spacing may be referred to herein as being controllably adjacent. For example, moveable stage 210_2 and moveable stage 210_3 are controllably adjacent.

By driving currents into suitable coil traces and thereby driving moveable stage 210 with reduced couplings, two moveable stages 210 may be arranged (e.g. by controllable movement) to be overlapping in the stator-X direction or overlapping in the stator-Y direction in a single excitation region 243 and the motion (e.g. position) of such moveable stages 210 can still be controlled in six degrees of freedom. For example, in the illustrated moveable stage configuration shown in FIG. 12, moveable stage 210_1 and moveable stage 210_3 are overlapping in the stator-Y direction and the motion (e.g. position) of each of moveable stage 210_1 and moveable stage 210_3 can be individually controlled in six degrees of freedom by driving currents into suitable coil traces and driving moveable stages 210_1, 210_3 with reduced couplings. To explain these reduced couplings, we may adopt a convention where a magnet array A, B, C, D of a moveable stage 210_1, 210_2, 210_3, 210_4 may be referred to using a combination of a letter (which refers to a magnet array) and a number which refers to the index of the moveable stage. For example, magnet array B in moveable stage 210_3 may be referred to as magnet array B3.

In the illustrated moveable stage configuration shown in FIG. 12, the stage-X/stage-Y centers 269_1, 269_3 of the magnet array assemblies of moveable stages 210_1 and 210_3 are generally aligned with one another in the stator-Y direction and are spaced apart from one another by a dimension of excitation regions 243 in the stator-Y direction. Even with this alignment in the stator-Y direction, the motion (e.g. position) of each of moveable stage 210_1 and moveable stage 210_3 can be individually controlled in six degrees of freedom, where there is sufficient spacing between the aligned moveable stages 210. For example, in the case of the illustrated FIG. 12 embodiment, the stator-Y direction spacing of the centers 269_1, 269_3 are spaced apart from one another by a dimension of excitation regions 243 in the stator-Y direction (or, in some embodiments, by within 10% of a dimension of excitation regions 243 in the stator-Y direction; or, in some embodiments, by within 20% of a dimension of excitation regions 243 in the stator-Y direction) and this provides sufficient spacing for independent motion control (in six degrees of freedom) of aligned moveable stages 210_1, 210_3. In the case of the example FIG. 12 embodiment, this control may be achieved by driving magnet array A1 (magnet array A in moveable stage 1) with x-traces in excitation region 243_1, magnet array B1 with y-traces in excitation region 243_1, magnet array C1 with x-traces in excitation region 243_2, so that moveable stage 210_1 can be fully controlled in six DOF. Similarly, by driving magnet array A3 with x-traces in excitation region 243_2, driving magnet array B3 with y-traces in excitation region 243_2, and driving magnet array C3 with x-traces in excitation region 243_3, the motion (e.g. position) of moveable stage 210_3 can be fully controlled in six degrees of freedom.

It may be observed from FIG. 12 that there may be some cross-coupling of forces onto magnet arrays B1 and B3 by the currents driven into the two y-trace groups of excitation region 243_2 that exert force on magnet array B3, since a portion of magnet array B1 overlaps this same pair of y-trace groups of excitation region 243_2 in the stator-z direction. Magnet arrays B1 and B3 may be said to "share" these coil trace groups. In general, two magnet arrays 212 elongated in the same direction (e.g. two x-magnet arrays 212 or two y-magnet arrays 212) may be said to "share" a coil trace group if the coil traces in the coil trace group are elongated generally in the same direction as the two magnet arrays 212 and both magnet arrays 212 overlap corresponding portions of the shared coil trace group in the stator-z direction. In some embodiments or applications, the control techniques described herein may be used where the two magnet arrays 212 which share a coil trace group both overlap (in the stator-z direction) at least one individual coil trace within the shared coil trace group. Magnet arrays 212 which share a coil trace group experience forces which are coupled to one another when current is driven into the shared coil trace group. While magnet arrays B1 and B3 share two y-trace groups, the proportion of magnet array B1 that overlaps these y-trace groups of excitation region 243_2 in the stator-z direction is relatively small compared to the proportion of magnet array B3 that overlaps these y-trace groups of excitation region 243_2 in the stator-z direction. Consequently, the force on magnet array B1 caused by the currents in these shared y-traces may be relatively small and suitable control algorithms can be designed to accommodate such small cross-coupling forces. For example, if we consider the y-trace group 68_1 shared by B1 and B3 in FIG. 12, it can be observed that a portion $P_1$ of the area (planar area extending in the stator-X and stator-Y directions) of coil array B1 overlaps shared y-trace group 68_1 in the stator-z direction and that a significantly larger portion $P_3$ of the area of coil array B3 overlaps shared y-trace group 68_1 in the stator-z direction. The currents driven into shared y-trace group 68_1 can be determined based on the positions of both magnet arrays B1 and B3 (or the positions of both of their corresponding moveable stages 210_1, 210_3) as determined by stage feedback 63. However, because of the different amounts of overlap (i.e. the different sizes of $P_1$ and $P_3$) the currents driven into shared y-trace group 68_1 can be determined based, to a relatively large extent, on desired forces for magnet array B3 and, to a relatively small extent, on desired forces for magnet array B1. In one example, currents driven into shared y-trace group 68_1 can be a weighted current $I_w$ given by $$I_w = \frac{P_3}{P_1 + P_3} I_3 + \frac{P_1}{P_1 + P_3} I_1,$$

where $I_1$ is a desired current driven into shared y-trace group 68_1 to generate desired force on magnet array B1 for the position control of 210_1 (determined based on the stage feedback position of moveable stage 210_1 using a suitable stage feedback control method and a suitable commutation law) without considering the coupling from 210_3, and $I_3$ is a desired current driven into shared y-trace group 68_1 to generate desired force on magnet array B3 for the position control of 210_3 (determined based on the stage feedback position of moveable stage 210_3 using a suitable stage feedback control method and a suitable commutation law) without considering the coupling from 210_1. Since there may be multiple phases of coil traces and correspondingly there may be multiple phases of currents, the above weighted current expression should be interpreted as applying to each phase individually. For example, in the case of three phases, the weighted current may be determined as follows:

$$I_{w,j} = \frac{P_3}{P_1 + P_3} I_{3,j} + \frac{P_1}{P_1 + P_3} I_{1,j},$$

where j represents the current phase number (i.e. 0, 1, or 2 in the case of three phases). Examples of suitable commutation algorithm and suitable position feedback control method are discussed in PCT application No. PCT/CA2012/050751. When moveable stages 210_1 and 210_3 are moving in the positive or negative stator-Y direction while maintaining roughly the same stator-Y direction separation, the portions $P_1$ and $P_3$ will also change, and, consequently, so does the relation of $F_W$ to $F_3$ and $F_1$. It will be appreciated by those skilled in the art that magnet arrays B1 and B3 also share y-trace group 68_2 and that a weighted force relationship may be similarly obtained for y-trace group 68_2. More generally, it will also be appreciated that the above weighted force relationship may be suitably modified where different magnet arrays share a coil trace group.

Magnet array D1 and D3 also share two y-trace groups in tile 243_2. Like magnet arrays B1 and B3, any current driven into either of the y-trace groups of excitation region 243_2 shared by magnet arrays D1 and D3 creates coupled forces in magnet arrays D1 and D3. A difference between the situation of magnet arrays D1 and D3 (relative to magnet arrays B1 and B3), is that the portions of magnet arrays D1 and D3 that overlap the shared y-trace groups of excitation region 243_2 in the stator-z direction are relatively similar to one another, whereas the portions of magnet arrays B1 and B3 that overlap the shared y-trace groups of excitation region 243_2 in the stator-z direction are relatively dissimilar. This similarity in the portions of magnet arrays D1 and D3 that overlap the shared y-trace groups of excitation region 243_2 can be seen from FIG. 12 by observing the similarity in the portions $P_1$, $P_3$ of magnet arrays D1, D3 that overlap shared y-trace group 68_3, respectively. In some embodiments or applications, controller 60 may be configured to use a suitable similarity threshold to determine whether the portions of magnet arrays that overlap shared coil trace groups are dis-similar (like magnet arrays B1, B3 of FIG. 12) or similar (like magnet arrays D1, D3 of FIG. 12). Such similarity thresholds may be evaluated based on stage feedback information 63 obtained by controller 60 (see FIG. 8A) relating to the positions of both moveable stages 210 having magnet arrays 212 that share a coil trace group. For example, in the case of the illustrated embodiment of FIG. 12, a similarity threshold evaluation for y-trace group 68_1 may be based on the ratio $P_1/P_3$ and a suitable threshold P*. For example, if $P_1/P_3$ is in a range of 1-P*<$P_1$/$P_3$<1+P*, then the overlapping portions $P_1$, $P_3$ of magnet arrays B1, B3 may be considered to be similar and, otherwise, the overlapping portions $P_1$, $P_3$ of magnet arrays B1, B3 may be considered to be dis-similar. In some embodiments, where the portions of magnet arrays that overlap a shared coil trace group are determined to be dis-similar (like magnet arrays B1, B3 in the FIG. 12 example), currents may be controllably driven into the shared coil-trace group based on the positions of both of the corresponding moveable stages (e.g. from stage feedback). In some embodiments, where the proportions of magnet arrays that overlap shared coil trace groups are determined to be similar (e.g. like magnet arrays D1, D3 in the FIG. 12 example), no current is driven in the corresponding shared coil trace groups. In some embodiments, where the proportions of magnet arrays that overlap shared coil trace groups are determined to be similar (e.g. like magnet arrays D1, D3 in the FIG. 12 example), currents can be driven into the shared coil trace groups by commanding feed-forward (open-loop) currents and corresponding feed-forward (open-loop) forces. Such open-loop currents and the corresponding forces may help to reduce current/force requirements associated with other magnet arrays (e.g. to achieve performance objectives). Since where the proportions of magnet arrays that overlap shared coil trace groups are determined to be similar (e.g. like magnet arrays D1, D3 in the FIG. 12 example), dynamic coupling between such magnet arrays D1, D3 (and their corresponding moveable stages 210_1, 210_3) can be avoided by refraining from using position feedback control for currents driven into shared coil trace groups—i.e. the current control signals output by controller 60 for the coil trace currents corresponding to the shared coil trace groups are determined independently of position feedback related to the position of the moveable stages 210.

Particular embodiments provide methods and systems for controlling a plurality (e.g. first and second) moveable stages 210 on a particular tile. In some embodiments, where a magnet array 212 from a first moveable stage 210 and a magnet array 212 from a second moveable stage 210 both overlap a shared group of coil traces in the stator-z direction, the currents driven into the shared group of coil traces and used to create forces on overlapping magnet arrays 212 of the first and second moveable stages 210 can be controlled based at least in part on the positions of both first and second moveable stages 210. For example, controller 60 may controllably drive currents into the shared group of coil traces which are based at least in part on the positions of both first and second moveable stages 210. In some embodiments, the currents used to create forces on first and second moveable stages 210 can be controlled to cause first and second moveable stages 210 to pass one another on a stator lane 244 comprising a single row or column of one or more excitation regions 243, without using other stator lanes 244 and/or excitation regions 243. Allowing moveable stages 210 to pass one another is particularly important when moveable stage sequence needs to be changed.

FIGS. 13A-13G (collectively, FIG. 13) illustrate a method for controllably moving first and second moveable stages 210_1, 210_2 to pass one another in a stator lane 244 having a width of a single tile 243 (or to pass one another on a single tile) according to a particular embodiment. In addition to referring to individual magnet arrays 212 as magnet arrays A1,B1,C1,D1 and A2,B2,C2,D2 (as discussed above), this description of FIG. 13, for convenience, refers to individual x-trace groups (referred to using reference number 66 at other places herein) as x-trace groups X1, X2, X3, . . . . In the illustrated example embodiment of FIG. 13, excitation region 243 comprises eight x-trace groups, X1, X2, X3, . . . X8. Moveable stage 210_1 may be assumed (without loss of generality) to originally be traveling in the negative stator-Y direction and moveable stage 210_2 may be similarly assumed to be traveling in the positive stator-Y direction and it is assumed that it is desired to have moveable stage 210_1 and 210_2 pass one another in the stator-Y direction (i.e. to change their relative positions in the stator-Y direction). In a first stage or step illustrated in FIG. 13A, first and second moveable stages 210_1, 210_2 do not overlap one another in the stage-X direction. Moveable stage 210_1 moves in the negative stator-Y direction toward meeting plane 246 (extending in the stator-X and stator-z directions and shown as a dashed line in FIG. 13) and moveable stage 210_2 moves in the positive stator-Y direction toward meeting plane 246. Each of moveable stages 210_1, 210_2 may be controllably moved to have the same speed $v_m$, although this is not necessary. In the FIG. 13A configuration, each moveable stage 210_1, 210_2 can be actuated with eight independent forces (i.e. two independent forces (either x and z oriented forces; or y and z oriented forces) on each array 212 of each moveable stage 210).

Figures 13A, 13B:
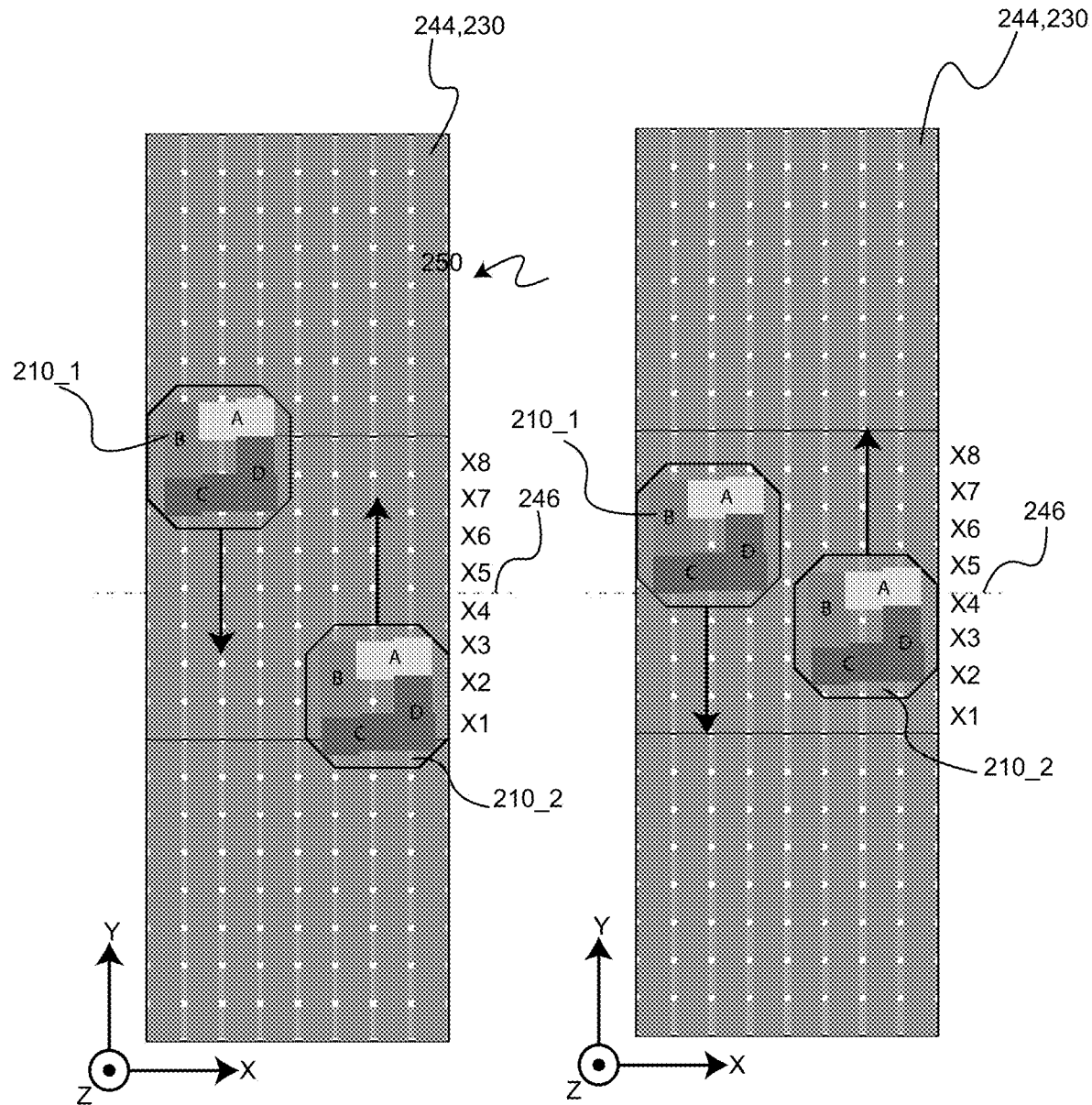
FIGS. 13A-13G (collectively, FIG. 13) illustrate a method for moving first and second moveable stages of the FIG. 10 displacement device to pass one another in a stator lane having a width of a single excitation region (or to pass one another on a single excitation region) according to a particular embodiment.

FIG. 13B illustrates a second stage or step where moveable stages 210_1, 210_2 start to overlap one another in the stator-X direction. In the particular case of the illustrated embodiment of FIG. 13B, magnet arrays A2 and C1 start to overlap one another in the stator-X direction and may share x-trace groups X4 and/or X5. In some embodiments, when magnet arrays A2 and C1 start to overlap one another in the stator-X direction (as is the case in FIG. 13B), only three magnet arrays 212 on each moveable stage 210_1, 210_1 have currents driven into their corresponding coil trace groups. Coil traces or coil trace groups may be said to correspond to a magnet array 212 (or vice versa) when the coil traces or coil trace groups and the magnet array 212 overlap one another in the stator-z direction. In some embodiments, in the particular case of the FIG. 13B configuration, only three magnet arrays 212 on each moveable stage 210_1, 210_2 have currents driven into their corresponding coil trace groups. In particular, currents are driven into the coil trace groups corresponding to magnet arrays A1, B1, D1, B2, C2, D2, and, in some embodiments, no currents are driven into the x-trace groups X4, X5 corresponding to, and shared by, magnet arrays C1, A2, since such currents may cause cross-coupling of forces between magnet arrays C1, A2. In some embodiments, rather than driving no currents into x-trace groups X4, X5, x-trace groups X4, X5 may be driven open-loop with the same non-zero currents (e.g. for the case of three-phase currents, phase A driven into x-trace group X4 is the same current as phase A driven into x-trace group X5; phase B driven into x-trace group X4 is the same current as phase B driven into x-trace group X5; phase C driven into x-trace group X4 is the same current as phase C driven into x-trace group X5). The FIG. 13B configuration may last until magnet arrays A1 and A2 start to overlap one another in the stator-X direction.

Figure 13C:
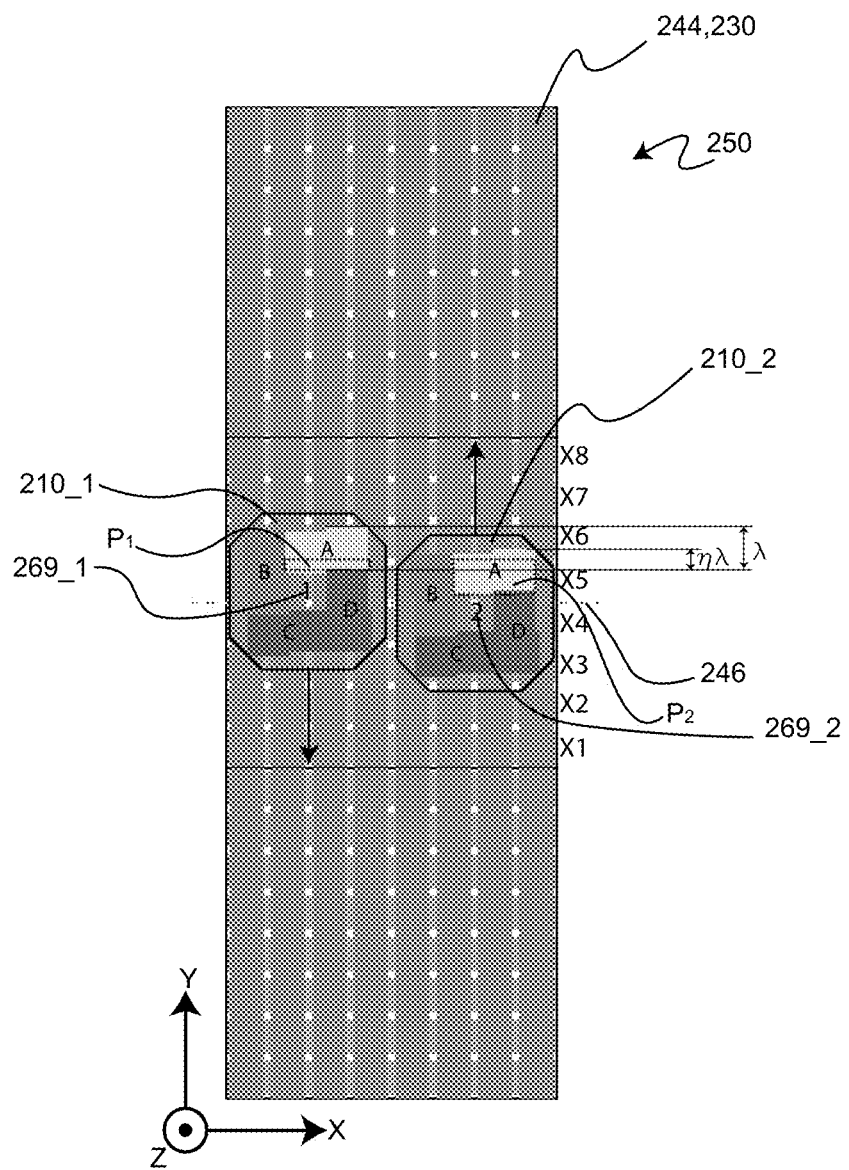

FIG. 13C shows a third step or configuration, where magnet arrays A1 and A2 (and also magnet arrays C1 and C2) start to overlap one another in the stator-X direction. In the particular case of the illustrated embodiment of FIG. 13C, magnet arrays A1, A2 start to overlap one another in the stator-X direction and may share (i.e. overlap in the stator-z direction with) x-trace groups X5 and/or X6 and magnet arrays C1, C2 start to overlap one another in the stator-X direction and may share (i.e. overlap in the stator-z direction with) x-trace groups X3 and X4. As shown in FIG. 13C, while the x/y centers 269_1, 269_2 of both moveable stages 210_1, 210_2 have not yet passed notional meeting line 246, we can define the width (as measured in the stator-Y direction) which magnet arrays A1 and A2 overlap one another in the stator-X direction to be $\eta\lambda$, where $\eta$ is an overlapping factor (either a fraction $0<\eta\leq 1$ or a percentage $0\%<\eta\leq 100\%$) and $\lambda$ is the width (as measured in the stator-Y direction) of magnet array A1 and A2. As noted above, in some embodiments, x-magnet arrays A1, A2 may be provided with y direction widths $W_{my}$ which need not be equal to $\lambda$. In such embodiments, the width (as measured in the stator-Y direction) which magnet arrays A1 and A2 overlap one another in the stator-X direction may be $\eta W_{my}$, where $\eta$ is an overlapping factor (either a fraction $0<\eta\leq 1$ or a percentage $0\%<\eta\leq 100\%$) and $W_{my}$ is the width (as measured in the stator-Y direction) of magnet array A1 and A2. It will be appreciated that $\eta$ is a function of the positions of moveable stages 210_1, 210_2 (or their magnet arrays A1, A2) and is particularly related to their stator-Y positions. For $0<\eta<\eta^*$, where $\eta^*$ is a suitable threshold (e.g. greater than 50% in some embodiments, greater than 70% in some embodiments, greater than 80% in some embodiments and greater than 90% in some embodiments): a proportion $(1-\eta/2)$ of the stage-Y dimension of magnet array A1 corresponds to (i.e. overlaps in the stator-z direction with) x-trace group X6 (see FIG. 13C) and the remaining proportion $(\eta/2)$ of the stage-Y dimension of magnet array A1 corresponds to x-trace group X5; and a proportion $(1-\eta/2)$ of the stage-Y dimension of magnet array A2 corresponds to (i.e. overlaps in the stator-z direction with) x-trace group X5 and the remaining proportion $(\eta/2)$ of the stage-Y dimension of magnet array A2 corresponds to x-trace group X6. In the particular case of the illustrated embodiment shown in FIG. 13C, the entire stage-X dimensions of magnet arrays A1, A2 overlap the shared x-trace groups X5, X6 and, as a result, the above-described proportions of the stage-Y dimensions of magnet arrays A1, A2 correspond to similar proportions of the areas of magnet arrays A1, A2. The threshold $\eta^*$ may be configurable (e.g. operator configurable) in some embodiments.

In the FIG. 13C configuration, currents in x-trace groups X5 and X6 can be controllably driven in such a way that two independent (y and z oriented) forces are generated on magnet array A1 and another two independent (y and z oriented) forces are generated on magnet array A2. In the FIG. 13C configuration, where $0<\eta<\eta^*$, controller 60 determines the currents driven into coil trace groups X5, X6 (i.e. the coil trace groups shared by magnet arrays A1, A2) based on the positions of both moveable stages 210_1 and 210_2 (i.e. the moveable stages comprising the overlapping magnet arrays A1 and A2) and causes these currents to be driven into the shared coil trace groups X5, X6. This contrasts with conventional control of a single moveable stage, where the currents used to controllably move the single moveable stage are based only on the position of the single moveable stage. In the case of the FIG. 13C configuration, in some embodiments, controller 60 may determine the currents to be driven into the shared coil trace group X6 based on a proportion $(1-\eta/2)$ of a stage-Y dimension of magnet array A1 that overlaps with the shared coil trace group X6 in the stator-z direction and based on a proportion $\eta/2$ of a stage-Y dimension of magnet array A2 that overlaps with shared coil trace group X6 in the stator-z direction. Similarly, in the case of the FIG. 13C configuration, in some embodiments, controller 60 may determine the currents to be driven into the shared coil trace group X5 based on a proportion $\eta/2$ of a stage-Y dimension of magnet array A1 that overlaps with the shared coil trace group X5 in the stator-z direction and based on a proportion $(1-\eta/2)$ of a stage-Y dimension of magnet array A2 that overlaps with shared coil trace group X5 in the stator-z direction. The currents driven into shared x-trace groups X5, X6 may be determined based on the desired force to be applied to magnet array A1, the desired force to be applied to magnet array A2 and the positions (e.g. as determined by stage feedback) of moveable stages 210_1, 210_2. The desired forces on magnet arrays A1 and A2 may be determined from their respective position control algorithms which may control the motion of their respective movers 210_1, 210_2 in six degrees of freedom. For example, in the case of shared x-trace group X5, $P_1$ represents the portion of magnet array A1 that overlaps x-trace group X5 and $P_2$ represents the portion of magnet array A2 that overlaps x-trace group X5. It will be appreciated that $P_1$ and $P_2$ depend on the positions of moveable stages 210_1, 210_2. Like the above-described situation in FIG. 12, the currents driven into the shared coil trace X5 can be determined according to a weighted force $$F_w = \frac{P_2}{P_1 + P_2} F_2 + \frac{P_1}{P_1 + P_2} F_1$$

according to a suitable commutation algorithm, where $F_1$ is the desired force on magnet array A1 calculated based on feedback positions of moveable stage 210_1 using a suitable position feedback control method, $F_2$ is the desired force on magnet array A2 calculated based on feedback positions of moveable stage 210_2 using a suitable position feedback control method. Examples of suitable commutation algorithm and suitable position feedback control method are discussed in PCT application No. PCT/CA2012/050751. In general, the current for a coil trace group current may be determined from a desired weighted force $F_w$ according to a commutation law, the weighted force $F_w$ may be determined from $F_1$, $F_2$ (for FIG. 13C case), $F_1$ and $F_2$ are desired forces on magnet arrays A1 and A2 which may be determined from the positions of moveable stages 210_1, 210_2 (e.g. from stage feedback). When moveable stages 210_1 and 210_2 are moving in the negative stator-Y and positive stator-Y directions respectively, $P_1$ and $P_2$ will also change accordingly, and so does the relation of $F_w$ to $F_2$ and $F_1$. In the particular case of the FIG. 13C situation, the entire stage-X dimension lengths of magnet arrays A1, A2 overlap the shared coil trace group X5 and are equal to one another. Consequently, the relative overlapping portions $P_1$, $P_2$ may be reduced to the above-discussed proportions, where $P_1$ is proportional to $\eta/2$ and $P_2$ is proportional to $(1-f/2)$, such that the above weighted force formula for x-trace group X5 reduces to $F_w = (1-\eta/2)F_2 + \eta/2\ F_1$ It will be appreciated that analogous control techniques may be used to determine the currents for the shared x-trace group X6.

Similarly, currents in shared x-trace groups X3 and X4 can be determined based on the positions of moveable stages 210_1, 210_2 and driven in such a way that two independent forces are generated on magnet array C1 and two independent forces are generated on magnet array C2. As a result, in the configuration of FIG. 13C (e.g. with x-magnet arrays A1, A2 overlapping in the stator-X direction and x-magnet arrays C1, C2 overlapping in the stator-X direction), the motion (e.g. positions) of moveable stages 210_1, 210_2 can still be controlled with six degrees of freedom with suitably controlled currents and suitably controlled forces being applied to each of the magnet arrays 212 of each moveable stage 210_1, 210_2. In particular, moveable stage 210_1 can still be controllably forced in the negative stator-Y direction and moveable stage 210_2 can still be controllably forced in the positive stator-Y direction.

Figures 13D, 13E:
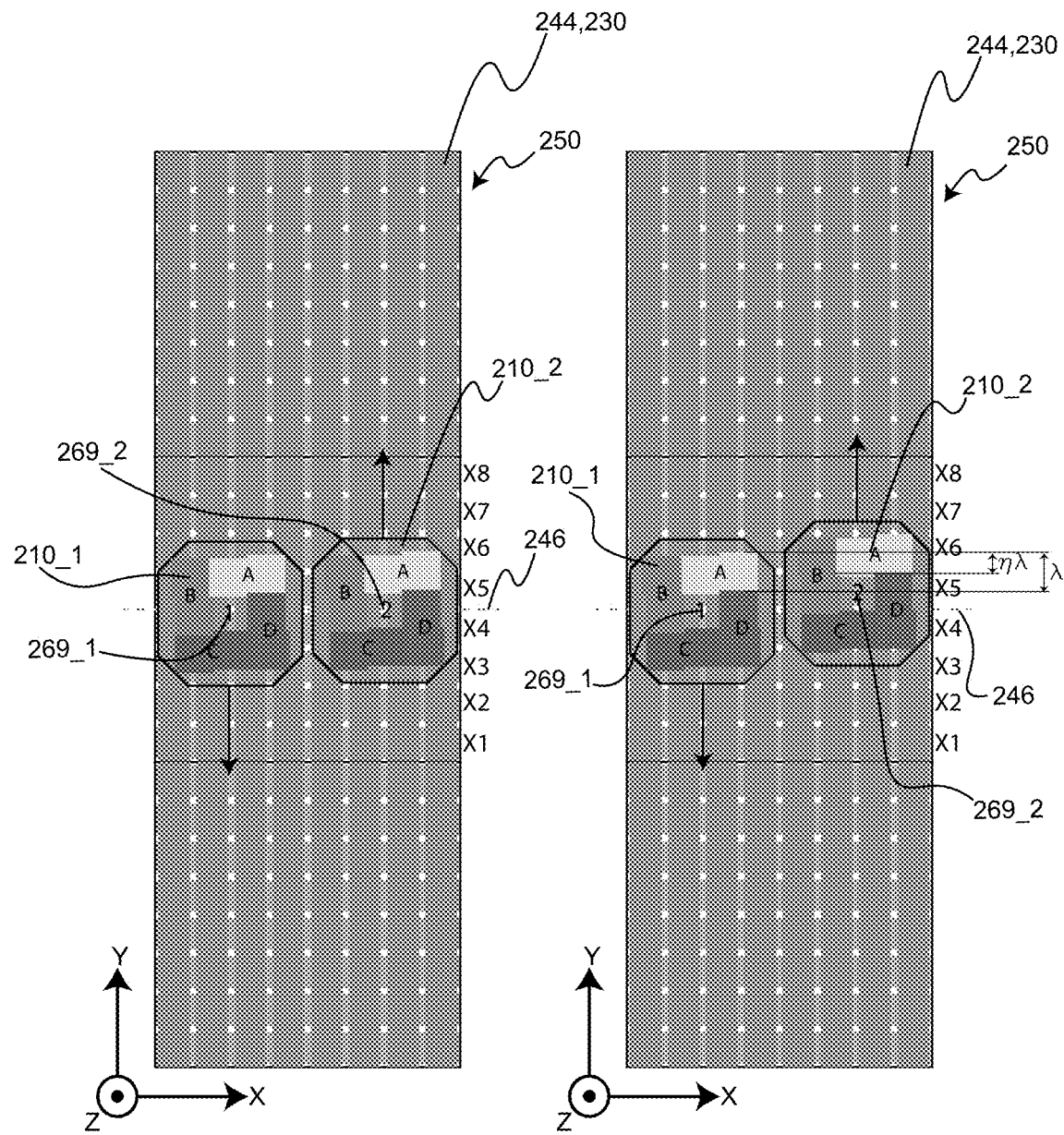

When moved in this manner, moveable stages eventually reach the threshold overlap factor $\eta^*$—i.e. where the overlap factor $\eta$ between magnet arrays A1, A2 or between magnet arrays C1, C2 is in a range of $\eta^* \leq \eta \leq 1$. The configuration corresponding to this next step is schematically illustrated in FIG. 13D. In the FIG. 13D configuration, where $\eta^* \leq \eta \leq 1$, x-trace groups X5 and X6 may be driven open-loop with the same non-zero currents (e.g. for the case of three-phase currents, phase A driven into x-trace group X5 is the same current as phase A driven into x-trace group X6; phase B driven into x-trace group X5 is the same current as phase B driven into x-trace group X6; phase C driven into x-trace group X5 is the same current as phase C driven into x-trace group X6). Driving these same non-zero currents can be used to generate a feed-forward (open-loop) stator-z oriented force as if $\eta = 1$ or $f = 100\%$. Such open-loop currents driven into x-trace groups X5, X6 may be the same (and not changing relative to one another) throughout the FIG. 13D configuration where $\eta^* \leq \eta < 1$. Similarly methods may be used to drive the same open-loop non-zero currents into x-trace groups X3, X4 to thereby drive magnet arrays C1, C2. In some embodiments, for the configuration where $\eta^* \leq \eta \leq 1$, the currents driven into the coil-trace groups (e.g. X5, X6 and/or X3, X4) shared by magnet arrays that overlap one another in a stator direction (e.g. A1, A2 and/or C1, C2) may be set to zero. In the FIG. 13D configuration, where $\eta^* \leq \eta < 1$, first and second moveable stages 210_1, 210_2 may continue to travel in the respective directions that they were traveling prior to the FIG. 13D configuration (e.g. first moveable stage 210_1 may continue to travel in the negative stator-Y direction and second moveable stage 210_2 may continue to travel in the positive stator-Y direction) and may pass each other due to their momentum. During the FIG. 13D configuration, where $\eta^* \leq \eta \leq 1$, controller 60 may continue to controllably drive currents into the y-trace groups corresponding to magnet arrays B1, D1 and B2, D2 and may thereby control the motion (e.g. position) of each moveable stage 210_1, 210_2 with 4 degrees of freedom. For example, in the case of the illustrated embodiment of FIG. 13D, controller 60 could still controllably drive currents into the y-trace groups corresponding to magnet arrays B1, D1 and B2, D2 to control the translation in (x,z) and rotation in $(ry_r, rz_r)$. Further, rotation motion around the y axis (i.e. $ry_r$) may be passively stabilized by the open-loop non-zero currents driven into x-coil trace groups X3, X4, X5, X6.

The FIG. 13D situation continues until $72 = 1$ or $\eta = 100\%$, which corresponds to the situation where magnet arrays A1, A2 substantially completely overlap one another in the stator-X direction and magnet arrays C1, C2 substantially completely overlap one another in the stator-X direction. Due to the continued momentum of moveable stages 210_1, 210_2 may continue to travel in the respective directions that they were traveling prior to the FIG. 13D configuration (e.g. first moveable stage 210_1 may continue to travel in the negative stator-Y direction and second moveable stage 210_2 may continue to travel in the positive stator-Y direction). Accordingly, once the overlap factor reaches $\eta = 1$ or $\eta = 100\%$, the overlap factor $\eta$ will start to reduce as the centers 269_1, 269_2 of moveable stages 210_1, 210_2 pass notional meeting line 246. In the circumstance where $\eta$ is decreasing and $\eta^* \leq \eta < 1$, controller 60 may be configured to use the same current driving techniques as those discussed above for FIG. 13D (i.e. where the only difference is that $\eta$ is increasing in the FIG. 13D context).

At some stage, the overlap factor $\eta$ may again fall back below the threshold value $\eta^*$. This step or configuration is shown in FIG. 13E, where $0 < \eta < \eta^*$. In the FIG. 13E configuration: a proportion $(1-\eta/2)$ of the stator-Y dimension of magnet array A1 corresponds to (i.e. overlaps in the stator-z direction with) x-trace group X5 (see FIG. 13E) and the remaining proportion ($\eta/2$) of the stator-Y dimension of magnet array A1 corresponds to x-trace group X6; and a proportion ($1-\eta/2$) of the stator-Y dimension of magnet array A2 corresponds to (i.e. overlap in the stator-z direction with) x-trace group X6 and the remaining proportion ($\eta/2$) of the stator-Y dimension of magnet array A2 corresponds to x-trace group X5. In the particular case of the illustrated embodiment shown in FIG. 13E, the entire stage-X dimensions of magnet arrays A1, A2 overlap the shared x-trace groups X5, X6 and, as a result, the above-described proportions of the stage-Y dimensions of magnet arrays A1, A2 correspond to similar proportions of the areas of magnet arrays A1, A2. The threshold $\eta^*$ may be configurable (e.g. operator configurable) in some embodiments. In this regard, the FIG. 13E step/configuration is similar to that of FIG. 13C, where currents in x-trace groups X5 and X6 can be controllably determined and driven using techniques analogous to those described above in connection with FIG. 134C and in such a way that two independent (y and z oriented) forces are generated on magnet array A1 and another two independent (y and z oriented) forces are generated on magnet array A2. In the FIG. 13E configuration, where $0<\eta<\eta^*$, controller 60 determines the currents driven into coil trace groups X5, X6 (i.e. the coil trace groups shared by magnet arrays A1, A2) based on the positions of both moveable stages 210_1 and 210_2 (i.e. the moveable stages comprising the overlapping arrays A1 and A2) and causes these currents to be driven into the shared coil trace groups X5, X6. This contrasts with conventional control of a single moveable stage, where the currents used to controllably move the single moveable stage are based only on the position of the single moveable stage. In some circumstances, controller 60 may determine the currents to be driven into the shared coil trace groups X5, X6 based on a proportion ($1-\eta/2$) of a stage-Y dimension of magnet array A1 that overlaps with the shared coil trace group X5 in the stator-z direction and based on a proportion $\eta/2$ of a stage-Y dimension of magnet array A2 that overlaps with shared coil trace group X5 in the stator-z direction. Similarly, currents in shared x-trace groups X3 and X4 can be determined and driven in such a way that two independent forces are generated on magnet array C1 and two independent forces are generated on magnet array C2. As a result, in the configuration of FIG. 13E (e.g. with x-magnet arrays A1, A2 overlapping in the stator-X direction and x-magnet arrays C1, C2 overlapping in the stator-X direction), the motion (e.g. the positions) of moveable stages 210_1, 210_2 can still be controlled with six degrees of freedom with suitably controlled currents and suitably controlled forces being applied to each of the magnet arrays 212 of each moveable stage 210_1, 210_2. In particular, moveable stage 210_1 can still be controllably forced in the negative stator-Y direction and moveable stage 210_2 can still be controllably forced in the positive stator-Y direction.

Figures 13F, 13G:
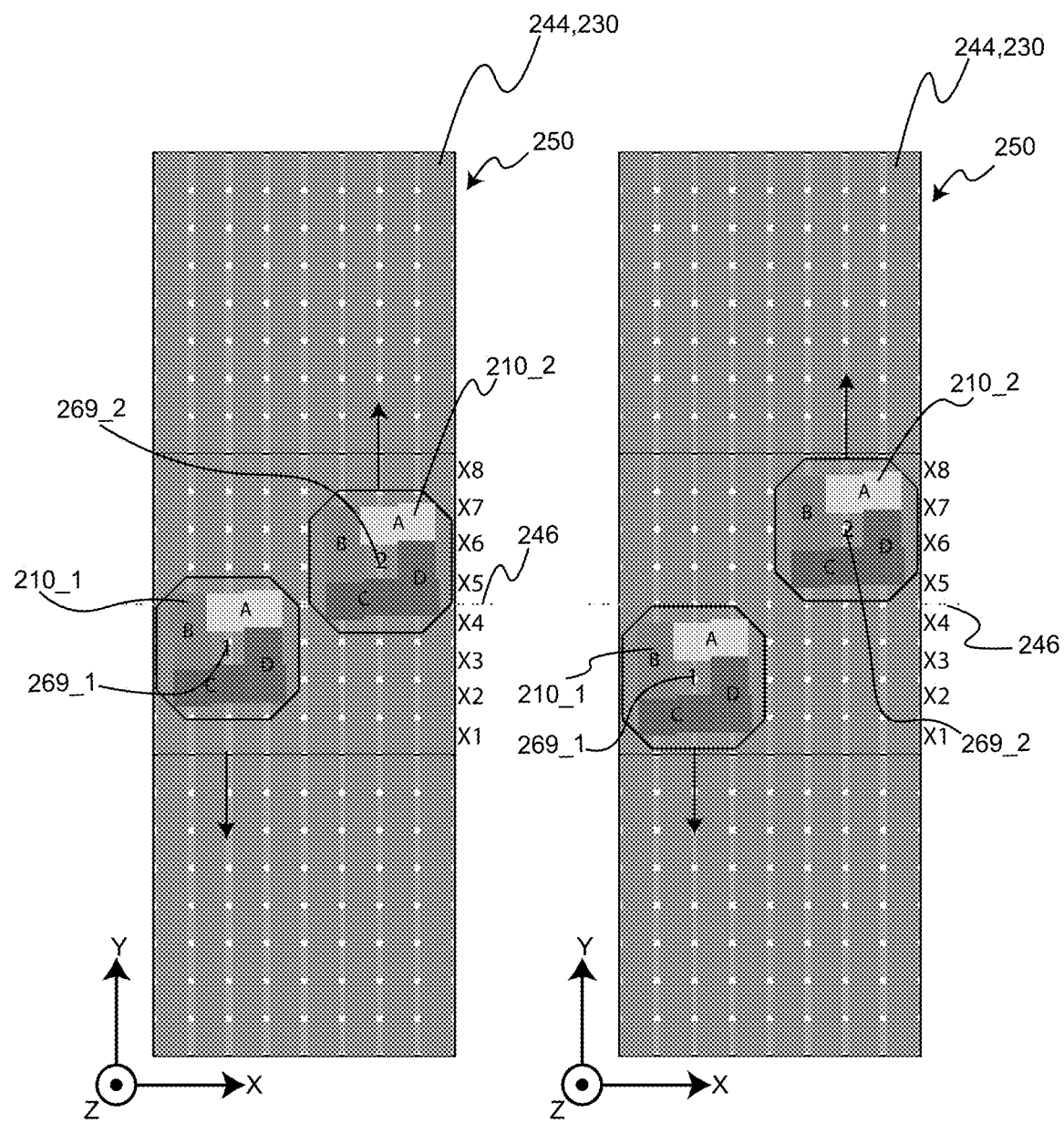

As moveable stage 210_1 continues to move in the negative stator-Y direction and moveable stage 210_2 continues to move in the positive stator-Y direction, moveable stages 210_1, 210_2 may reach the configuration of FIG. 13F, where magnet arrays A1, A2 no longer overlap and magnet arrays C1, C2 no longer overlap, but where magnet arrays A1 and C2 overlap with one another in the stator-X direction. This FIG. 13F step or configuration may be similar to that of FIG. 13B described above, except that rather than magnet arrays C1 and A2 overlapping in the stator-X direction (as was the case in FIG. 13B), magnet arrays A1 and C2 overlap in the configuration of FIG. 13F. Control strategies analogous to those discussed above in connection with FIG. 13B may be employed in the circumstances of FIG. 13F. In particular, in some embodiments, in the FIG. 13F configuration, only three magnet arrays 212 on each moveable stage 210_1, 210_2 have currents driven into their corresponding coil trace groups. In particular, currents are driven into the coil trace groups corresponding to magnet arrays C1, B1, D1, A2, B2, D2, and, in some embodiments, no currents are driven into the x-trace groups X4, X5 corresponding to, and shared by, magnet arrays A1, C2, since such currents may cause cross-coupling of forces between magnet arrays A1, C2. In some embodiments, rather than driving no currents into x-trace groups X4, X5, x-trace groups X4, X5 may be driven open-loop with the same non-zero currents (e.g. for the case of three-phase currents, phase A driven into x-trace group X4 is the same current as phase A driven into x-trace group X5; phase B driven into x-trace group X4 is the same current as phase B driven into x-trace group X5; phase C driven into x-trace group X4 is the same current as phase C driven into x-trace group X5).

While it was not discussed above in connection with the FIG. 13B configuration, in some embodiments, either of the FIGS. 13B and 13F configurations could use a control strategy similar to that described above for the configurations shown in FIGS. 13C, 13D and 13E. For example, an overlap factor $\eta$ and an overlap threshold $\eta^*$ could be defined between the overlapping magnet arrays (C1, A2 in the case of FIG. 13B; and A1, C2 in the case of FIG. 13F) and then control strategies similar to those discussed above for FIGS. 13C, 13D and 13E could be used for the circumstances where $0<\eta<\eta^*$ and $\eta$ is increasing (analogous to FIG. 13C), where $\eta^* \le f \le 1$ (analogous to FIG. 13D) and where $0<\eta<\eta^*$ and $\eta$ is decreasing (analogous to FIG. 13E).

The FIG. 13E configuration may last until magnet arrays A1 and C2 are no longer overlapping one another in the stator-X direction, in which case moveable stages 210_1, 210_2 are in the configuration shown in FIG. 13G, which is analogous to that shown in FIG. 13A, where each moveable stage 210_1, 210_2 can be actuated with eight independent forces (i.e. two independent forces (either x and z oriented forces; or y and z oriented forces) on each array 212 of each moveable stage 210).

FIGS. 14A and 14B (collectively FIG. 14) show queuing formations for multiple moveable stages 210 of the FIG. 10 displacement device 250 and methods for moving such moveable stages 210 into and out of such queuing formations according to particular embodiments. A queuing operation may be considered to comprise moving a plurality of moveable stages 210 into queuing formation where the moveable stages 210 are densely packed. It may be desirable for controller 60 to be able to controllably move individual moveable stages 210 into and out of a queuing formation without external (e.g. human or other machine) intervention. In some embodiments, as shown in the illustrated example of FIG. 14A, four (or even more) moveable stages 210 may be queued on a single excitation region 243 (see moveable stages 210_1, 210_2, 210_3, 210_4 or excitation region 243_1 of FIG. 14A). The motion (e.g. position) of each moveable stage 210 queued on excitation region 243_1 is still fully controllable in six degrees of freedom and can be controllably moved (by controller 60) into and out of the queue on excitation region 243_1 as explained in more detail below. In addition to the high density of moveable stages in the FIG. 14A queue, moveable stages 210 on the periphery of the queue can move out of the FIG. 14A queue from four sides (±stator-X and ±stator-Y) of the overall queue, instead of only two ends in a conventional linear transportation system. Moveable stages 210 can similarly merge into the queue from four sides of the queue.

As shown in FIG. 14B, 4 moveable stages 210_1, 210_2, 210_3, 210_4 are on a single excitation region 243. Moveable stages 210 may be said to be on a excitation region 243 if their magnet array assemblies overlap the excitation region 243 in the stator-z direction. In the FIG. 14 embodiment, moveable stages 210 and excitation regions 243 have the features of moveable stage 210 and excitation region 243 discussed above in connection with FIG. 10. The x-trace groups and y-trace groups of excitation region 243 are respectively referred to as x-trace groups X1, . . . , X8 and y-trace groups Y1, . . . , Y8. Due to space 251 between the x-magnet arrays A, C and the y-magnet arrays B, D (see FIG. 10A), controller 60 can controllably move moveable stages into the queue pattern shown in FIG. 14B. In the queue pattern shown in FIG. 14B, a dedicated coil trace group may be used to drive each magnet array in the four moveable stages 210. In the case of moveable stage 210_3 of the FIG. 14B example, currents driven into x-trace group X7 apply force to magnet array A3, currents driven into x-trace group X5 apply force to magnet array C3, currents driven into y-trace group Y2 apply force to magnet array B3 and currents driven into y-trace group Y4 apply force to magnet array D3. None of these coil trace groups (X7, X5, Y3, Y4) are shared with the magnet arrays 212 of other moveable stages 210_1, 210_2, 210_4. In fact, in the FIG. 14B configuration, no two magnet arrays 212 share a coil trace group. All y-magnet arrays have no overlap in the stator y-direction, and all x-magnet arrays have no overlap in the stator-X direction. As a result, two independent forces (either x and z oriented forces; or y and z oriented forces) can be generated on each magnet array 212 and the motion (e.g. position) of each of moveable stages 210 may be controlled with six degrees of freedom.

In the FIG. 14B configuration, moveable stage 210_1 is an outer peripheral moveable stage in the sense that, of the moveable stages shown in FIG. 14B, moveable stage 210_1 is the furthest in the negative stator-X direction and the furthest in the negative stator-Y direction. Controller 60 may controllably move moveable stage 210_1 in the negative stator-X direction or in the negative stator-Y direction to leave the FIG. 14B queue. In some embodiments, for moveable stage 210_1 to leave the queue in the negative stator-X direction, only magnetic arrays A1, B1, and C1 have current driven into their corresponding coil trace groups X3, Y1, X1. No force is needed on magnet array D1 and, in some embodiments, no current need be driven into the coil trace groups corresponding to magnet array D1. This avoids the potential for magnet arrays B3 and D1 to share coil trace groups. In some embodiments, any of the other techniques for addressing shared coil trace groups described herein may be used to drive current into the coil trace groups corresponding to magnet array D1. In some embodiments, as moveable stage 210_1 is being moved out of the queue in the negative stator-X direction, currents may be driven into the coil trace groups X7, Y4, X5 corresponding to magnetic arrays A3, D3, C3 of moveable stage 210_3. No force is needed on magnet array B3 and, in some embodiments, no current need be driven into the coil trace groups corresponding to magnet array B3. This avoids the potential for magnet arrays B3 and D1 to share coil trace groups. In some embodiments, any of the other techniques for addressing shared coil trace groups described herein may be used to drive current into the coil trace groups corresponding to magnet array B3. Similar techniques could be used to controllably move moveable stage 210_1 out of the queue in the negative stator-Y direction. Controllably moving moveable stages into the queue is analogous to the procedure of moving moveable stages out of the queue.

In the FIG. 14B configuration, moveable stage 210_3 is an inner peripheral moveable stage in both the stator-X and stator-Y directions in the sense that, of the moveable stages shown in FIG. 14B, moveable stage 210_3 is on the periphery of the queue, but moveable stage 210_1 is further in the negative stator-X direction and moveable stage 210_4 is further in the positive stator-Y direction. When it is desired to move moveable stage 210_3 out of the queue in the positive stator-Y direction, the following steps may be used: (1) controllably move outer peripheral moveable stage 210_4 out of the queue in the positive stator-Y direction (e.g. onto a different excitation region 243 (not shown)) using a technique analogous to that discussed above for moving outer peripheral moveable stage 210_1 out of the queue; (2) controllably move inner peripheral moveable stage 210_3 out of the queue in the positive stator-Y direction (e.g. onto a different excitation region 243 (not shown)) using a technique analogous to that discussed above for moving outer peripheral moveable stage 210_1 out of the queue; (3) controllably move moveable stages 210_3 and 210_4 to pass one another in the stator-Y direction as described above in connection with FIG. 13; (4) controllably move moveable stage 210_4 back into the queue.

Generally, the methods described herein corresponding to FIGS. 12-14 can be applied to moveable stages having other suitable magnet array geometries and stators having other suitable coil trace structures, with suitable modification.

In one embodiment of the invention, three out of four magnet arrays overlap in the stator-z direction with their corresponding coil trace groups and currents are controllably driven into these corresponding coil trace groups to generate forces which may be used to control the motion (e.g. the position) of a moveable stage with six degrees of freedom. In some embodiments, no currents are driven in the coil trace groups corresponding to the fourth magnet array and no corresponding force is generated on the fourth magnet array. In some embodiments, others of the techniques for addressing shared coil trace groups described herein may be used in conjunction with the fourth magnet array.

In one embodiment of the invention, four moveable stages are densely accumulated on an excitation region, any two y-magnet arrays of these moveable stages have stator-Y direction overlapping width less than $\frac{1}{5}\lambda$, any two x-magnet arrays of these moveable stages have stator x-direction overlapping width less than $\frac{1}{5}\lambda$; each moveable stage overlaps with at least one moveable stage in the stator-X direction with at least $2\lambda$ width, and overlaps with another moveable stage in the stator-Y direction with at least $2\lambda$ width; the overall size of the stator tile is not greater than $9\lambda$ by $9\lambda$; each moveable stage can be controlled in 6-DOF.

In one embodiment of the invention, four moveable stages are densely accumulated on an excitation region, any two y-magnet arrays of these moveable stages have stator-Y direction overlapping width less than $\frac{1}{5}\lambda$, any two x-magnet arrays of these moveable stages have stator-X direction overlapping width less than $\frac{1}{5}\lambda$; each moveable stage overlaps with at least one moveable stage in the stator-X direction with at least $2\lambda$ width, and overlaps with another moveable stage in the stator-Y direction with at least $2\lambda$ width; the overall size of the stator tile is not greater than $10\lambda$, by $10\lambda$; each moveable stage can be controlled in 6-DOF.

In one embodiment of the invention, four moveable stages are densely accumulated on an excitation region, any two y-magnet arrays of these moveable stages have stator-Y direction overlapping width less than ⅛λ, any two x-magnet arrays of these moveable stages have stator-X direction overlapping width less than ⅛λ; each moveable stage overlaps with at least one moveable stage in the stator-X direction with at least 2λ width, and overlaps with another moveable stage in the stator-Y direction with at least 2λ; the overall size of the stator tile is not greater than 8λ by 8λ; each moveable stage can be controlled in 6-DOF.

In one embodiment of the invention, three moveable stages are densely accumulated on an excitation region, any two y-magnet arrays of these moveable stages have stator-Y direction overlapping width less than ⅛λ, any two x-magnet arrays of these moveable stages have stator-X direction overlapping width less than ⅛λ; each moveable stage overlaps with at least one moveable stage in the stator-X direction or stator-Y direction with at least 2λ width; the overall size of the stator tile is not greater than 9λ by 9λ; each moveable stage can be controlled in 6-DOF.

As discussed above (e.g. in relation to FIG. 12), it may be desirable to employ multiple stator tiles arranged together to form a stator instead of a single large stator tile. This may be desirable to reduce manufacturing costs and complexity, to allow for subsequent expansion of a stator or to allow for uncommon stator shapes. As the size of a stator and the number of stator tiles increases, it may not be practical to employ a single controller for the entire stator. For example, it may be computationally expensive or even infeasible to receive sensor data every sensor across the entire stator, calculate the positions of all of the moveable stages, revise/determine trajectories for all of the moveable stages, calculate the necessary forces to be applied to all of the moveable stages and determine the currents for each of the coil traces in real time.

One aspect of the invention provides systems and method for controllably moving one or more moveable stages relative to a stator. The system comprises a stator which is operationally divided into multiple stator tiles wherein the system (e.g. the movement of the one or more moveable stages) is controlled by a plurality of controllers (each assigned particular control responsibilities) instead of a centralized controller. By de-centralizing control of the stator and moveable stage(s), the computational load on each controller may be reduced. In some embodiments, a controller is provided for (e.g. associated with) each stator tile. In other embodiments, a controller may be provided for each stator sector, where each stator sector comprises a group of one or more stator tiles. A stator sector (or sector for brevity), as discussed herein, may comprise one or more stator tiles and one or more controllers to control the one or more stator tiles. For example, one sector may comprise four stator tiles and four controllers, four stator tiles and one controller, or any other combination of one or more stator tiles and one or more controllers.

One aspect of the invention provides systems and method for controllably moving one or more moveable stages relative to a stator. The system comprises a first moveable stage comprising one or more magnetization elements, each magnetization element having a corresponding magnetization direction. Magnetization elements can have any suitable shapes (e.g. cross-sections which are rectangular, circular, square and/or the like). Magnetization elements can have any suitable size. Magnetization segments described at various locations herein represent non-limiting examples of magnetization elements. The system comprises a stator comprising a plurality of sectors, each sector comprising a plurality of coil traces. The plurality of sectors further comprises a first sector comprising a first plurality of coil traces and a second sector comprising a second plurality of coil traces. The system comprises: a first controller and one or more first amplifiers associated with the first sector, the first controller and the one or more first amplifiers connected to controllably drive first currents in one or more first coil trace groups from among the first plurality of coil traces; and a second controller and one or more second amplifiers associated with the second sector, the second controller and the one or more second amplifiers connected to controllably drive second currents in one or more second coil trace groups from among the second plurality of coil traces. The first and second controllers are in bi-directional communication with one another via a sector link between the first and second controllers. The first controller is configured to determine a particular second current reference command for a particular second coil trace group from among one or more second coil trace groups and to communicate the particular second current reference command to the second controller via the sector link between the first and second controllers. The second controller is configured to determine a particular second final current reference for the particular second coil trace group based at least in part on the particular second current reference command. The second controller and the one or more second amplifiers are connected to drive current into the particular second coil trace group and to cause the current in the particular second coil trace group to track the particular second final current reference and to thereby cause interaction with the one or more magnetization elements of the first moveable stage which causes corresponding movement of the first moveable stage relative to the stator.

Figure 15:
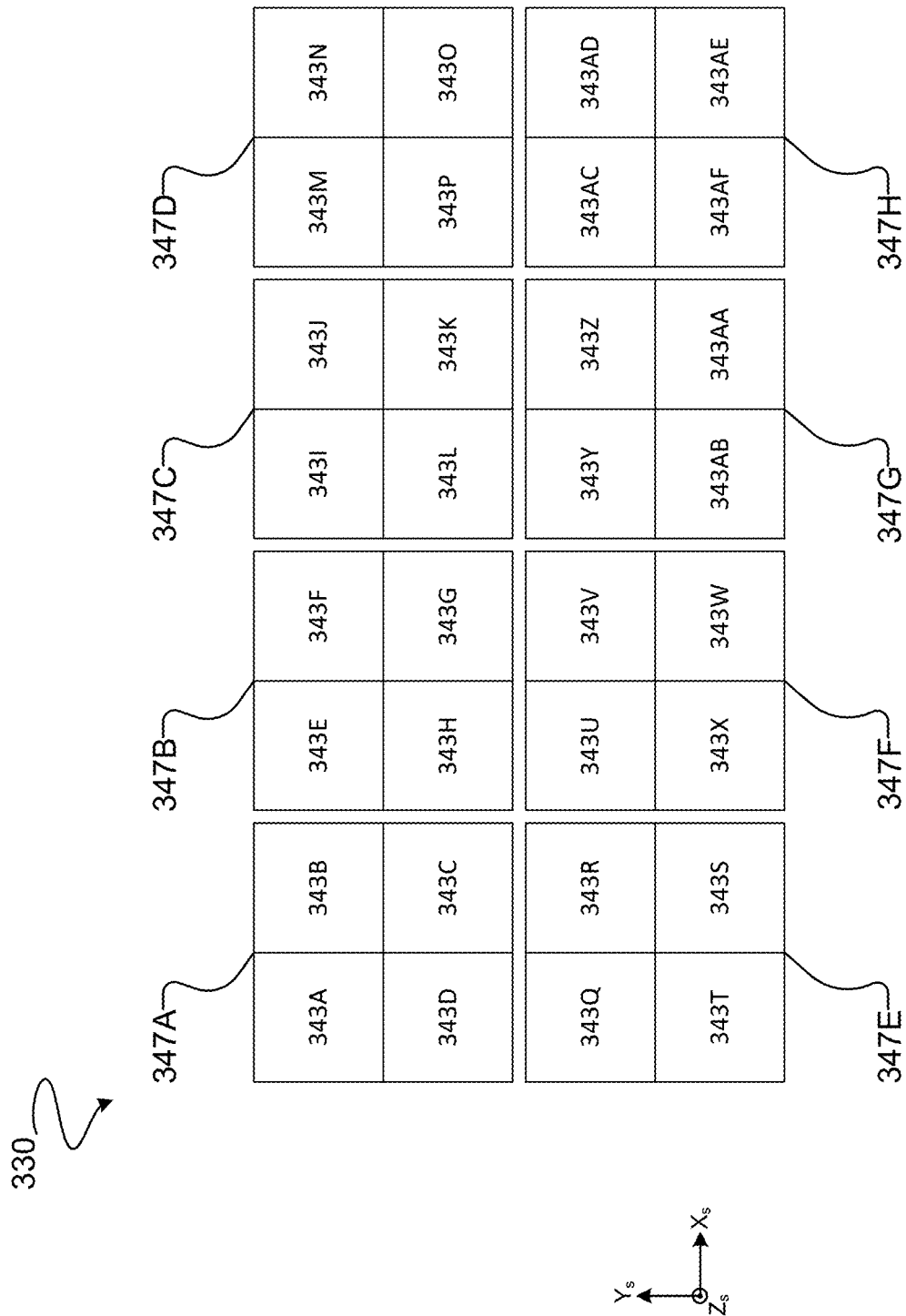
FIG. 15 shows a top plan view of a stator comprising a plurality of stator tiles organized into stator sectors according to a particular embodiment.

FIG. 15 shows a schematic top plan view of a stator 330 operationally divided into tiles and sectors according to a particular embodiment. Stator 330 comprises a plurality of tiles 343 (e.g. tiles 343A-343AE in the illustrated embodiment). Tiles 343A-343AE are organized into sectors 347 (e.g. sectors 347A-347H in the illustrated embodiment). Each sector 347, as illustrated, comprises four tiles 343, although in general, a sector 347 may comprise a group of any suitable number (e.g. one or more) tiles 343. Tiles 343 comprise pluralities of coil traces (not shown in FIG. 15) which may be sub-divided into independently addressable coil trace groups (i.e. groups of one or more coil traces into which current may be independently driven). A coil trace group may comprise one or more generally linearly elongated coil traces as described elsewhere herein. This is not necessary, however. For the purposes of the embodiments disclosed in the remainder of this description, individual coil traces (and corresponding independently addressable coil trace groups) may have other shapes and/or configurations. By way of non-limiting example, stator tiles (e.g. stator tiles 343) in the embodiments disclosed in the remainder of this description may comprise coil traces of the type(s) described in: U.S. Pat. No. 7,948,122 (Compter et al.); U.S. Pat. No. 8,492,934 (Binnard); U.S. Pat. No. 6,452,292 (Binnard); Jansen et al., Modeling of Magnetically Levitated Planar Actuators with Moving Magnets, IEEE TRANSACTIONS ON MAGNETICS, VOL. 43, NO. 1, JANUARY 2007, pp. 15 to 25; Boeij et al., Experimental Verification of Look-Up Table Based Real-Time Commutation of 6-DOF Planar Actuators, 11th International Symposium on Magnetic Bearings, Aug. 6-29, 2008, Nara, Japan, pp. 496-501; and/or any other suitable configuration of coil traces and/or coil trace groups. As depicted in FIG. 15, each sector may be generally square in shape (i.e. in x-y cross-section). This is not necessary. In other embodiments, tiles 343 and sectors 347 can have any suitable shape (in x-y cross-section) such as, but not limited to, rectangles, triangles, hexagons, round disks and/or the like.

Figure 16A:
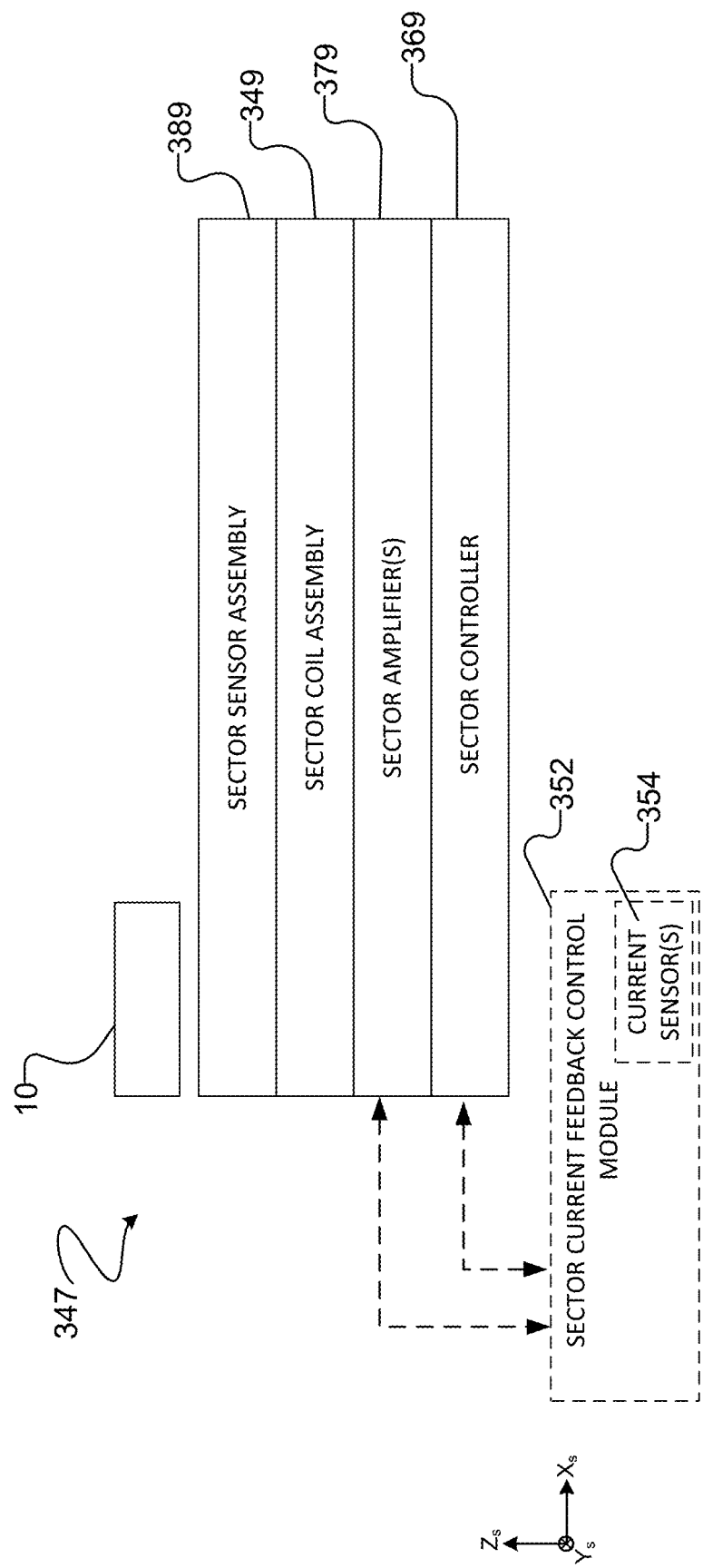
FIG. 16A is a schematic cross-sectional depiction of a stator sector and a moveable stage according to a particular embodiment.

FIG. 16A is a schematic x-z cross-sectional view of a single sector 347 and moveable stage 10 according to one embodiment. Sector 347 of the FIG. 16A embodiment comprises a sector sensor assembly 389, a sector coil assembly 349, a sector amplifier 379 and a local sector controller 369. For convenience, for the purpose of the embodiments disclosed in the remainder of this description, when discussing a particular sector 347, the components of that particular sector 347 may be described as being local to that sector or to one another. For example, a sector 347 may comprise a local sector sensor assembly 389, a local sector coil assembly 349, a local sector amplifier 379 and a local sector controller 369. Further, for the purposes of the description that follows various components of a sector 347 may be described as belonging to or otherwise associated with a particular sector controller 369. For example, the local sector coil assembly 349 of a particular sector controller 369 may be used to refer to the sector coil assembly within the same sector as the particular sector controller 369. Although FIG. 16A depicts sector sensor assembly 389, sector coil assembly 349, sector amplifier 379 and sector controller 369 layered in a particular order (e.g. in the stator-Z direction), the layering sequence may be varied or a particular assembly may be eliminated, as needed. For example, sector sensor assembly 389 may be located above (i.e. in the positive stator-Z direction relative to) sector coil assembly 349 as depicted in FIG. 16A or may located below (i.e. in the negative stator-Z direction relative to) sector coil assembly 349. In other embodiments, layers of sector 347 may be combined. For example, sector sensor assembly 389 may be embedded within sector coil assembly 349. Several non-limiting examples of stator tiles and sensor arrangements and associated systems and methods are described in Patent Cooperation Treaty Application No. PCT/CA/2014/050739 which is hereby incorporated herein by reference.

Sector sensor assembly 389 may comprise position sensors 382 (see FIG. 19A) which generate position sensor outputs (e.g. sensor output signals) usable to determine or otherwise related to the position of one or more moveable stages 10 in one or more degrees of freedom. Position sensors 382 may interact with moveable stage 10 to detect the presence of moveable stage 10 and/or its position with respect to stator 330 in as many as six degrees of freedom (or as few as one degree of freedom). In some embodiments, position sensors 382 may do so without being in physical contact with moveable stage 10. Examples of suitable position sensors 382 include, but are not limited to, magnetic field/flux measurement sensors, inductive sensors, capacitive sensors, eddy current sensors, optical sensors, resistive sensors, ultrasonic sensors, RADAR, and pressure sensors. In some embodiments, sensors 382 comprise Hall Effect sensors. Particular position sensors and methods for determining positions of a moveable stage are described in more detail in Patent Cooperation Treaty Application No. PCT/CA2014/050739 which is hereby incorporated herein by reference. In some embodiments, sensors 382 comprise one or more cameras and appropriate software which generate position sensor outputs (e.g. camera output signals) usable to determine or otherwise related to locations of one or more moveable stages 10.

Sector coil assembly 349 may comprise any type of suitable sector coil assembly. For example, sector coil assembly may be similar to sector coil assembly 35, as described herein. Sector coil assembly 349 may include coil traces 334 (see FIG. 19B) which may be further divided into one or more individually addressable coil trace groups (i.e. groups of one or more coil traces into which current may be independently driven). For the purposes of the embodiments disclosed in the remainder of this description, individual coil traces 334 (and corresponding independently addressable coil trace groups) may comprise one or more generally linearly elongated coil traces 334 (e.g. extending in the stator-X direction and/or the stator-Y direction) or may have any of a wide variety of other shapes and/or configurations, some non-limiting examples of which are provided above.

Sector amplifier 379 (which may be referred to in the singular even though it may comprise a plurality of individually controllable amplifiers) may comprise any type of suitable sector amplifier. For example, sector amplifier 379 may comprise one or more of the following: power transistors (MOSFET, IGBT or BJT), switching output stages, current sensing circuits, power transistor driving circuits, output filters, and/or other power amplification circuit components. The components of power amplifiers which may be used to provide sector amplifier 379 are well known to those skilled in the art. In some embodiments, one or more components of sector amplifier 379 may be integrated into a single integrated circuit or even eliminated, which may help to reduce costs and/or footprint (i.e. size).

Sector 347 may include a sector current feedback control module 352 (FIG. 16A) which may be used to control the current driven into a coil trace group to track a desired current reference for that coil trace group. Sector current feedback module 352 may comprise a current sensor 354 which provides current feedback and corresponding control components which may be implemented in the form of analog control circuits and/or digital control circuits, which may be implemented in the form of DSP controllers, Field Programmable Gate Array controllers, embedded microprocessor, embedded microcontroller and/or the like. In some embodiments, components of sector current feedback control module 352 may be implemented by sector controller 369 and/or by sector amplifier 379 and so FIG. 16A shows sector current feedback control module 352 in dashed lines to indicate that current feedback control module 352 need not be embodied separately from controller 369 and amplifier 379. In some embodiments, sector current feedback control module 352 is not required and sector amplifier 379 may operate in an open-loop configuration without a current feedback control module. In other embodiments, some or all of the components of the current feedback control module may be embodied separately from sector amplifier 379 and/or sector controller 369.

Local sector controller 369 determines final current references for any coil trace groups in its local sector coil trace assembly 349. Local sector controller 369 (in possible combination with current feedback control module 352) controls sector amplifier 379 so that the actual currents flowing in the respective coil trace groups of local sector coil assembly 349 approximately follow (e.g. controllably track) their respective final current references. The currents driven into the coil trace groups cause interaction with the magnetization elements of the moveable stage to controllably move the moveable stage relative to the stator.

Sector controller 369 may comprise any suitable controller capable of functioning as described herein. Sector controller 369 (and components thereof) may comprise hardware, software, firmware or any combination thereof. Sector controller 369 may comprise distributed components which may be located at different physical locations. Components of sector controller 369 may be combined or subdivided, and components of sector controller 369 may comprise subcomponents shared with other components of sector controller 369. For example, sector controller 369 may be implemented on a programmed computer system which may comprise one or more processors, user input apparatus, displays and/or the like. Sector controller 369 may be implemented as an embedded system with a suitable user interface which may comprise one or more processors, user input apparatus, displays and/or the like. Processors may comprise microprocessors, digital signal processors, graphics processors, field programmable gate arrays, and/or the like. Sector controller 369 may comprise analog-to-digital convertors, PWM generators, filters and so on.

Each sector controller 369 may comprise, or be connected to, one or more communication channels (which may be referred to herein as sector links) for transfer of data or signals between itself and one or more other sector controllers 369 associated with other sectors 347. Sector controller 369 may be connected for communication with a system controller 361, as discussed further herein.

Figure 16B:
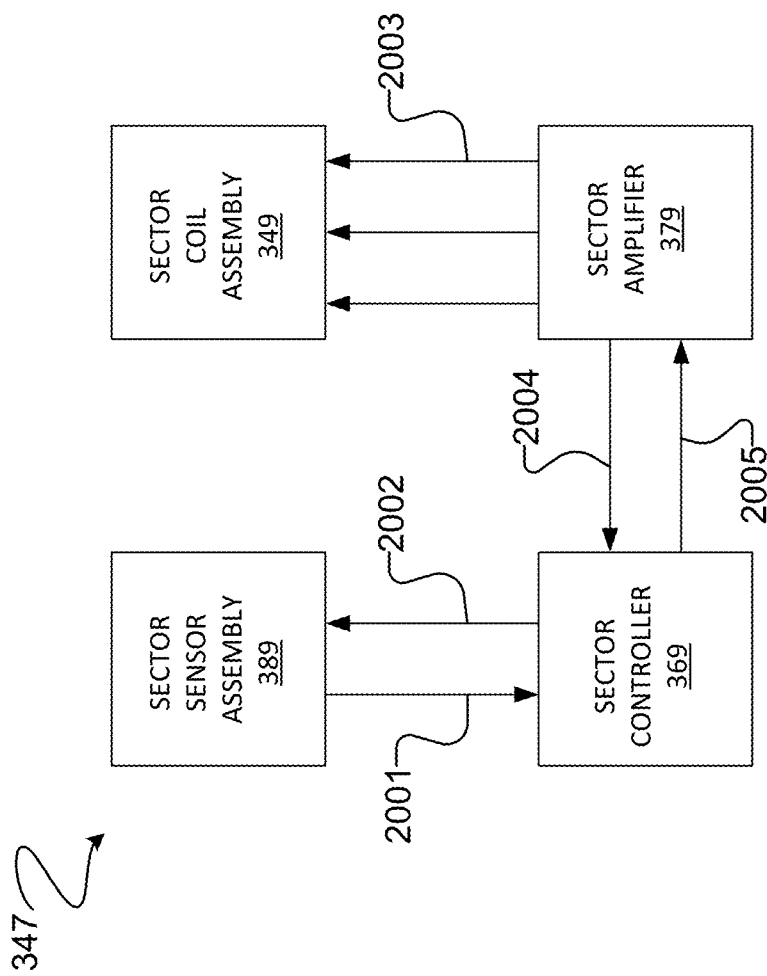
FIG. 16B is a schematic top plan view depiction of a stator sector and the communication between components of the stator sector according to a particular embodiment.

FIG. 16B is a schematic diagram of sector 347 and the communication between components of the stator sector according to a particular embodiment. As is shown in FIG. 16B, sector sensor assembly 389 communicates combined position sensor output 2001 directly to local sector controller 369 by input/output electrical wires or connections. In some embodiments, individual position sensors 382 generate position sensor outputs (e.g. signals) which may be multiplexed by suitable multiplexing circuitry (not shown) to provide combined position sensor output 2001 which is communicated from sector sensor assembly 389 to local sector controller 369. Local sector controller 369 may demultiplex combined position sensor output 2001 to access position sensor outputs from any of the individual sensors 382 in its associated sector sensor assembly 389 and may otherwise process combined position sensor output 2001 to determine the position of one or more moveable stage(s) 10. Some or all of the position sensor outputs, and/or position sensor output information based on some or all of the position sensor outputs, may be communicated to other sector controllers 369 and may be used by such other sector controllers for the purposes of determining the position of a moveable stage 10. Combined position sensor output 2001 may comprise an analog or digital signal. Sector controller 369 may also send sensor control input 2002 to its associated sector sensor assembly 389 and/or to the individual position sensors 382 therein. Sensor control input 2002 may comprise digital or analog input signals for the purpose of controlling the operation of sector sensor assembly 389, such as by way of non-limiting example, triggering, multiplexing, de-multiplexing, synchronization, selecting sensor subgroups and/or the like.

Local sector controller 369 is also directly connected to local sector amplifier 379. Local sector controller 369 may send electrical signals 2005 to local sector amplifier 379 to thereby cause local sector amplifier 379 to drive current into the individual coil trace groups of local sector coil assembly 349. In particular, local sector amplifier 379 and local sector controller 369 (and optionally current feedback control module 352) may be connected or otherwise configured to attempt to drive currents in the individual coil trace groups of local sector coil assembly 349 which will cause the currents to track the final current references (described further elsewhere herein). As discussed above, causing the currents in individual coil trace groups to track final current references may involve the use of a current feedback control module 352 which may be implemented in whole or in part by sector controller 369 or local sector amplifier and which may use feedback from current sensor(s) 354 and suitable control techniques to achieve this result. In some particular embodiments, electrical signals 2005 between local sector controller 369 and local sector amplifier 379 may comprise pulse-width modulation (PWM) pulses, which may be provided in digital or analog formats. In some embodiments, final current references are generated inside the local sector controller 369. As will be discussed in more detail below, in some embodiments or circumstances, final current references may be generated by sector controller 369 based at least in part on information (e.g. current reference commands and/or the like) received from neighbouring sector controllers. In some embodiments, final current references are generated by local sector controller 369 based at least in part on information received from system controller 361. In the illustrated FIG. 16B embodiment, local sector amplifier 379 also provides combined current sensor output 2004 to local sector controller 369. Such combined current sensor output 2004 may comprise feedback from current sensor(s) 354 which may be used to implement current feedback control module 352. In some embodiments, individual current sensors 354 generate current sensor outputs (e.g. signals) which may be directly available to local sector controller 369 or which may be multiplexed by suitable multiplexing circuitry (not shown) to provide combined current sensor output 2004 which may be communicated from current feedback control module to local sector controller 369. Local sector controller 369 may demultiplex combined current sensor output 2004 to access current sensor outputs from any of the individual current sensors 354. As explained in more detail elsewhere herein current sensor outputs may be used by local sector controller 369 to compensate for the effect of local currents on the outputs of position sensors 382 (i.e. sector controller 369 may use current sensor outputs to help determine the position of a moveable stage 10). Some or all of the current sensor outputs, and/or current sensor output information based on some or all of the current sensor outputs, may be communicated to other sector controllers 369 and may be used by such other sector controllers for the purposes of determining the position of a moveable stage 10. Combined current sensor output 2004 may comprise an analog or digital signal.

In the illustrated embodiment of FIG. 16B, local sector amplifier 379 is also connected to local sector coil assemblies 349 via coil terminals 2003 to allow sector amplifier 379 to drive current into the independently addressable coil trace groups of sector coil assemblies 349.

As a moveable stage 10 moves across stator 330 and crosses a boundary between adjacent sectors 347, the local sector position sensor assembly 389 of a single sector 347 may not be sufficient to determine the position of the moveable stage 10 in one or more degrees of freedom. Instead, there may be a desire to use information from the sector sensor assemblies 389 of two or more sectors 347 to determine the position of moveable stage 10 as it crosses from one sector 347 to another sector 347. In some embodiments, the sector controllers 369 of a plurality of sectors 347 (e.g. neighbouring sectors 347) may communicate information to one another (e.g. information from their local sector sensor assemblies 389) to help determine the position of a moveable stage 10. Similarly as a moveable stage 10 moves across stator 330 and crosses a boundary between adjacent sectors 347, the local coil trace assembly 349 of a single sector 347 may not be capable of generating sufficient force/torque for moving the moveable stage 10 in a desired manner Instead, there may be a desire to use currents driven into the coil traces of the sector coil trace assemblies 349 of two or more sectors 347 to impart force/torque on moveable stage 10 as it crosses from one sector 347 to another sector 347. In some embodiments, the sector controllers 369 of a plurality of sectors 347 (e.g. neighbouring sectors 347) may communicate information to one another (e.g. current reference commands, discussed further below) to help determine the final current references to be driven into the coil traces of their respective sector coil trace assemblies 349 to thereby impart desired force/torque on the moveable stage 10.

Figure 17:
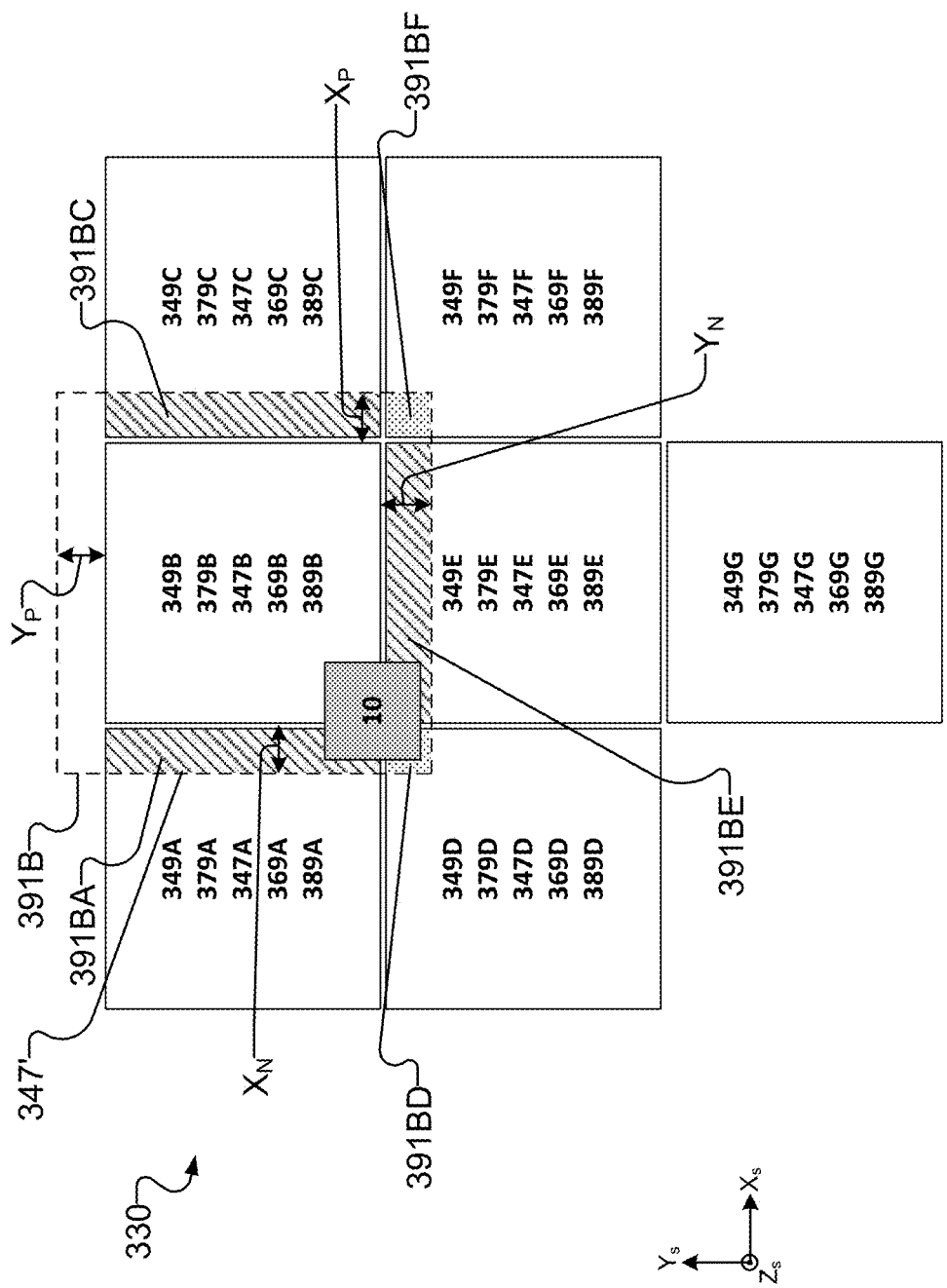
FIG. 17 shows a schematic top plan view of a moveable stage crossing boundaries between a plurality of stator sectors according to a particular embodiment.

FIG. 17 depicts moveable stage 10 as it crosses the boundaries (or is otherwise located to straddle the boundaries) between sectors 347B, 347A, 347D and 347E on a stator 330. Stator 330 shown in FIG. 17 comprises one exemplary, non-limiting, configuration of sectors 347 which is useful for explanatory purposes. As discussed above, sectors 347 may be arranged in any suitable number and in any suitable pattern or geometry. It should be understood that one or more moveable stages 10 may cross (or otherwise be located to straddle) any of the sector boundaries of a stator 330 in any direction and at any angle.

As suggested above, it may be the case that none of sector sensor assemblies 389B, 389A, 389D or 389E on their own are sufficient to determine the position of moveable stage 10 in one or more degrees of freedom. Similarly, it may be the case that none of sector coil assemblies 349B, 349A, 349D or 349E on their own are sufficient to generate the required force or torque to drive moveable stage 10 and thus control the position of moveable stage 10 in one or more degrees of freedom. On the other hand, together, sector sensor assemblies 389B, 389A, 389D and 389E may have sufficient capabilities to determine the position of moveable stage 10 and, together, sector coil assemblies 349B, 349A, 349D and 349E may have sufficient capabilities to control the position of moveable stage 10.

One way for sectors 347 to determine and control the position of moveable stage 10 as it crosses between sectors 347 (or otherwise overlaps multiple sectors in the stator-Z direction) is for each relevant sector 347 (e.g. sectors 347B, 347A, 347D and 347E in FIG. 17) to send its corresponding combined position sensor output 2001 from its corresponding sector sensor assembly 389 to a centralized system controller via a network or communication channel and for the centralized system controller to combine all of the combined position sensor outputs from all of the relevant sectors 347 to determine the position of moveable stage 10 as it crosses between sectors 347 using a suitable algorithm. Once the centralized system controller determines the position of moveable stage 10, it may then determine the current references for relevant groups of coil traces 334 (i.e. those groups of coil traces 334 that may contribute force or torque to moveable stage 10) in relevant sectors 347. Finally, the centralized system controller may send the current references (e.g. in the form of current reference signals) for each of the relevant coil traces back to the sector controllers 369 of the relevant sectors 347. This type of approach may work for a small number of sectors 347. However, as the number of sectors 347 increases and/or as the number of moveable stages 10 increases to a large number such as 100 or 1000, a single centralized system controller may no longer be sufficient (e.g. in terms of speed and/or processing power) to handle all of the data without causing unwanted delays.

An alternative technique for determining and controlling the position of a moveable stage 10 involves the use of de-centralized control. By communicating with the sector controllers 369 of neighbouring sectors 347, a single sector controller 369 may accumulate sufficient position sensor outputs (e.g. from the combined position sensor output 2001 of neighbouring sectors 347) to determine the position of moveable stage 10. Once the position of moveable stage 10 is determined, that same sector controller 369 may communicate with the sector controllers 369 of its neighbouring sectors 347 to control the position of moveable stage 10.

Considering the projection of a stator 330 in the stator x-y plane (e.g. as shown in FIG. 17), a sector 347 may be defined as neighbouring another sector 347 (i.e. being its neighbour) if the sides of the two sectors 347 share a boundary or vertex. A pair of adjacent sectors 347 may be considered to share a boundary or side if each adjacent sector 347 of the pair has a boundary or side that abuts a boundary or side of the other adjacent sector 347 of the pair. In other embodiments, a pair of adjacent sectors 347 may be considered to share a side if the adjacent sides of the pair of adjacent sectors 347 are generally locally parallel and coincide or overlap. In further embodiments, a pair of adjacent sectors 347 may be considered to share a side if the adjacent sides of the pair of adjacent sectors 347 are generally locally parallel and are spaced apart (in a normal direction to the parallel sides) by less than 20 mm or by less than 20% of the linear dimension of moveable stage 10 in the normal direction. In some embodiments, the shared sides or boundaries of a pair of neighbouring sectors 347 are straight, curved, angular etc. A pair of adjacent sectors 347 may be considered to share a vertex if each adjacent sector 347 of the pair has a vertex that abuts a vertex of the other adjacent sector 347 of the pair. In some embodiments, a pair of adjacent sectors 347 may be considered to share a vertex if two vertices (one from each of the pair of adjacent sectors 347) are spaced apart by less than 20 mm. In some embodiments, a pair of adjacent sectors 347 be considered to share a vertex if two vertices (one from each of the pair of adjacent sectors 347) are spaced apart by less than 5 mm. In some embodiments, a pair of adjacent sectors 347 may be considered to share a vertex if two vertices 9 one from each of the pair of adjacent sectors 347) are spaced apart by less than 20% of a maximum linear dimension (e.g. in the stage x or y direction) of moveable stage 10. Two sectors 347 may additionally or alternatively be defined as neighbours if a single moveable stage 10 can overlap (in the stator-Z direction) with at least a portion of each neighbouring sector 347 at the same time.

The sector controllers 369 of neighbouring sectors 347 may be referred to as neighbouring sector controllers 369 or, for brevity, neighboring controllers 369. Communication between neighbouring controllers 369 may be relatively straightforward if there is a direct communication connection (e.g. a physical communication channel) between the neighbouring controllers 369. Such direct communication connections between neighbouring controllers 369 may be referred to herein as sector links 392 (see FIG. 8). Neighbouring controllers 369 (and their corresponding sectors 347) with a direct communication connection (i.e. a single sector link 392) between them may be referred to herein as direct neighbours. As shown in the illustrated embodiment of FIGS. 17 and 18, neighboring controllers 369A, 369B of neighbouring sectors 347A and 347B have a direct communication connection (sector link 392B) between them. Sectors 347A and 347B (and sector controllers 369A, 369B) are therefore direct neighbours. In some embodiments, direct neighbour sectors 347 may share a side boundary, although this is not necessary.

Communication between neighbouring controllers 369 may be relatively less straightforward if there is no direct communication connection (e.g. no single sector link 392)

between the neighbouring controllers 369. Neighbouring controllers 369 (and their corresponding sectors 347) that do not have a direct communication connection (i.e. a single sector link 392) between them may be referred to as indirect neighbours. As shown in the illustrated embodiment of FIG. 18, neighbouring controllers 369B, 369D of neighbouring sectors 347B and 347D do not share a direct communication connection between them. Accordingly, sectors 347B and 347D (and sector controllers 369B, 369D) are indirect neighbours. In some embodiments, indirect neighbour sectors 347 may share a vertex, although this is not necessary. While FIG. 18 does not depict sectors 347B and 347D as direct neighbours, sectors 347B and 347D may be direct neighbours in other embodiments, if their respective controllers 369B, 369D shared a direct communication connection (e.g. a single sector link 392) between them.

In some embodiments, it is desirable for two indirect neighbouring controllers 369 to communicate. For example, as shown in the illustrated embodiment of FIGS. 17 and 18, there may be a desire for sector controller 369B of sector 347B to communicate with sector controller 369D of sector 347D since moveable stage 10 overlaps with both of these sectors 347B, 347D in the stage-Z direction. As described in more detail below, there is a wide variety of information for which it might be desirable to communicate between indirect neighbor controllers 369B, 369D. In some embodiments, indirect neighbour controllers 369 may communicate through mutually direct neighbour controllers 369. A mutually direct neighbour sector 347 is a sector that is a direct neighbour sector 347 with both of the indirect neighbour sectors 347. Similarly, a mutually direct neighbor controller 369 is a sector controller 369 that is a direct neighbour controller 369 with both of the indirect neighbor controllers 369. For example, sector 347A (and sector controller 369A) are direct neighbours of sector 347B (and sector controller 369B) and direct neighbours of sector 347D (and sector controller 369D). Therefore, sector 347A (and sector controller 369A) are mutually direct neighbours of indirect neighbouring sectors 347B and 347D (and their corresponding indirect neighbour controllers 369B, 369D).

As discussed above, sector controller 369D receives combined position sensor output 2001 from sector sensor assembly 389D. Sector controller 369D may condition combined position sensor output 2001 (e.g. by amplifying, scaling, offsetting, filtering, digitizing, calibrating, compensating and/or the like) and may generate position sensor output information based on combined position sensor output 2001. Sector controller 369D may then transmit a portion of this position sensor information to its direct neighbour sector controller 369A (via sector link 392E—FIG. 18) and a portion of this position sensor information through sector controller 369A to its indirect neighbour sector controller 369B (via sector link 392E, sector controller 369A and sector link 392B). Similarly, as will be explained in more detail below, sector controller 369D may determine current reference commands for coil trace groups in sector coil assemblies 349A and 349B of its direct neighbour (sector 347A) and its indirect neighbour (sector 347B). Sector controller 369D may then transmit these current reference commands to its direct neighbour sector controller 369A (via sector link 392E—FIG. 18) and through sector controller 369A to its indirect neighbour sector controller 369B (via sector link 392E, sector controller 369A and sector link 392B). These current reference commands may then be used by sector controllers 369A, 369B to generate final current references for their respective coil trace groups.

Figure 18:
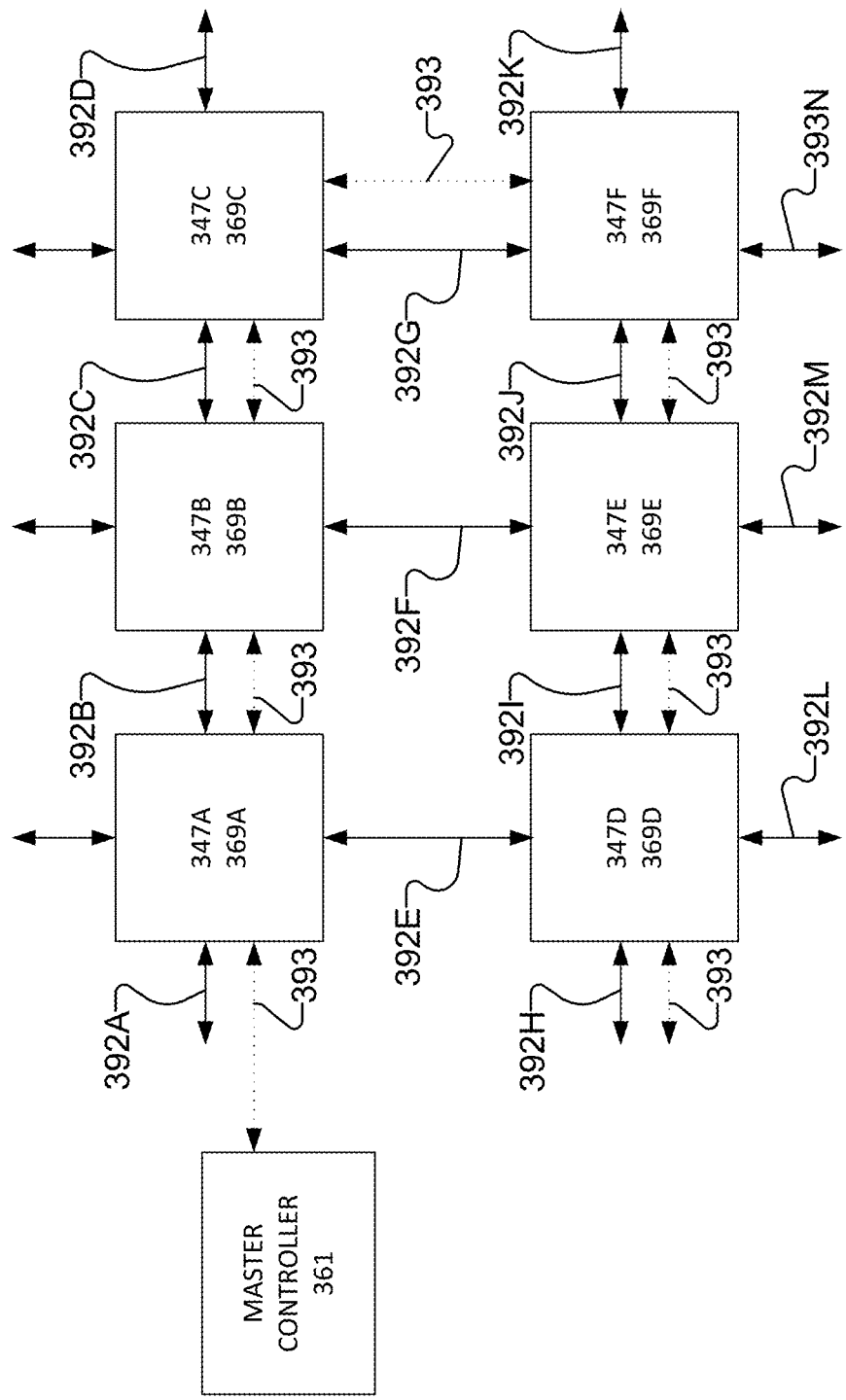
FIG. 18 is a schematic depiction of a communication network between a plurality of stator sectors according to a particular embodiment.

Direct neighbour controllers 369 may be connected for direct communication in various ways. FIG. 18 is a schematic depiction showing communication channels between sectors 347 (and their sector controllers 369) according to one embodiment. Each sector controller 369 may have operational access to one or more communication channels (which may be referred to herein as sector links 392) to exchange information with other sector controllers 369. In the illustrated example, the sector controller 369 of each sector 347 has operational access to four sector links 392. This is not necessary, for example, sector controller 369B could only have access to three sector links (to communicate with sector controllers 369A, 369E and 369C). Alternatively, sector controller 369B could have additional sector links 392 to communicate with sector controller 369D and/or sector controller 369F. Sector links 392 may comprise bi-directional communication channels to allow information to be exchanged between a pair of neighbouring sector controllers 369. As will be described in more detail elsewhere herein, information communicated via sector links 392 may comprise current reference commands, position sensor output information (based on position sensor outputs received from sensor assemblies 389 as combined position sensor outputs 2001), current sensor output information (based on current sensor outputs received from current sensors 354 as combined current sensor outputs 2004), control variables and/or the like. As discussed above, sectors that are connected directly by a sector link 392 are called direct neighbours.

Communication is also possible between the sector controllers 369 of indirect neighbours. For example, controller 369D is an indirect neighbour of controller 369B and may exchange information with controller 369B via either one of sector controllers 369A, 369E. Sectors 347A and 347E (and their sector controllers 369A, 369E) are mutually direct neighbours of indirect neighbour sectors 347B and 347D (and their sector controllers 369B, 369D). Information from sector controller 369B may be transferred by sector link 392B to sector controller 369A and subsequently transferred by sector link 392E to sector controller 369D. Additionally or alternatively, information from sector controller 369B may be transferred by sector link 392F to sector controller 369E and subsequently transferred by sector link 392I to sector controller 369D. Information from sector controller 369F can be transferred to sector controller 369B in a similar manner.

In some embodiments, sector controller 369B and sector controller 369D are directly connected by a sector link 392 and are direct neighbours. In such cases, sector controllers 369B, 369D are treated as any other direct neighbour would be.

Sector links 392 can be physically implemented in various ways. For example, sector links 392 may comprise copper, optical fiber, electromagnetic wave, wireless connections and/or the like. Sector links 392 may employ any suitable communication protocol or communication standard. Non-limiting examples of such communication protocols and communication standards include LVDS, camera link, Infiniband™, Aurora, SATA, Gigabit Ethernet, SFP, other high speed serial/parallel bus and/or the like.

In some embodiments, a global communication system may also be provided. For example, FIG. 18 depicts system network 393. System network 393 may be directly connected to a system controller 361 (also referred to as a master controller 361) for global control of stator 330, as discussed further herein. In some embodiments, sectors 347 are daisy-chained together for communication to and from master controller 361 by system network 393. In some embodiments, system network 393 makes use of sector links 392 or is embedded inside sector links 392 as part of the sector link functionality. As discussed further herein, system network 393 and sector links 392 may work in conjunction with one another to control a plurality of moveable stages 10 on stator 330.

To accommodate moveable stages 10 crossing from one sector 347 to one or more neighbouring sectors 347 (or otherwise overlapping more than one sector in the stator-Z direction), a single sector controller 369 may be chosen (e.g. by master controller 361) to control a particular moveable stage 10. In relation to that particular moveable stage 10, the chosen sector controller 369 may be referred to as the principal sector controller 369 and the particular sector controller may be said to have ownership of that particular moveable stage 10. Each moveable stage 10 may have a single principal sector controller 369 at a given time. However, a single sector controller 369 may have ownership of multiple moveable stages 10A sector controller 369 may be the principal controller for as few as zero moveable stages 10 or could be the principal controller for many moveable stages 10. Furthermore, as a moveable stage 10 moves, its principal sector controller 369 may change.

A moveable stage's principal sector controller 369 may be chosen (e.g. by master controller 361) based on various factors. The sector 347 corresponding to a principal sector controller 369 may be referred to as the principal sector 347. In some embodiments, the principal sector 347 of moveable stage 10 may be selected to be the sector 347 which overlaps (in the stator-Z direction) with a largest portion (e.g. area) of the moveable stage 10 as compared to any other sector 347. For example, in FIG. 17, moveable stage 10 overlaps (in the stator-Z direction) with sector 347B more than with any other sector 347. Accordingly, sector 347B may be selected to be the principal sector for moveable stage 10 when moveable stage 10 is in the location shown in FIG. 17. Such a decision may be made by system controller 361 based on each moveable stage's position with respect to each sector 347. Alternatively, such a decision may be made jointly by a plurality of sector controllers 369 according to an appropriate algorithm. In some embodiments, the principal controller may additionally or alternatively be chosen based on available bandwidth of sector controllers 369 or a global trajectory of moveable stage 10.

When a principal sector controller 369 executes sensing, driving and feedback algorithms, as discussed herein, certain information, referred to as the "control state", is stored in sector controller 369. The control state may comprise one or more control variables. Since the position sensing, coil trace current driving, current control feedback algorithms may be together executed in a periodic way (e.g. in discrete time steps), it may be desirable to have the control states from one or more previous cycles (time steps) may be desired for execution of the sensing, driving and/or feedback algorithms of the next cycle (time step). Accordingly, as ownership of a moveable stage 10 changes from sector controller 369 to another (i.e. as a new sector controller 369 becomes the principal sector controller 369 of moveable stage 10), historical control states of moveable stage 10 (including historical values for one or more control variables, constant or adjustable parameters associated with the moveable stage 10 and/or control thereof, and/or the like) may be transferred to the new principal controller 369. This control state transfer may be done via sector link(s) 392. In some embodiments, the control state may comprise difference or differential equations and/or may be based on state-space control or classical transfer function based control. In addition to control states, other information specific to a particular moveable stage 10 may also be transferred. Such information may include, but is not limited to, moveable stage geometric parameters, calibration parameters (e.g. coefficients and/or bias) for position sensing and/or force/current reference determination, identification numbers of the moveable stage, identification numbers for workpieces carried by the moveable stage, and/or the like.

For the purposes of explanation, we may consider that sector controller 369B may be the principal controller 369B for moveable state 10 when moveable stage 10 is in the location shown in FIG. 17. One of the tasks for the principal controller 369B (e.g. at each time step) is to determine an estimate of the position of its corresponding moveable stage 10. For principal sector controller 369B to determine the position of moveable stage 10, principal sector controller 369B may communicate with neighbouring sectors 347A, 347D and 347E, because moveable stage overlaps (in the stator-Z direction) with each of these neighbor sectors 347A, 347D and 347E. Accordingly, in some embodiments, neighbour controllers 369A, 369D, 369E communicate at least a portion of their respective position sensor output information. As discussed above the position sensor output information for a given sector 347A, 347D, 347E is determined by its sector controller 369A, 369D, 369E (e.g. by suitable processing) based on combined position sensor output 2001 from its respective sector sensor assemblies 389A, 389D and 389E. This position sensor output information may then be used by principal sector controller 369B to determine the position of moveable stage 10. The portions of the position sensor output information for a given sector 347A, 347D, 347E that are communicated to the principal controller 369B may depend on available bandwidth, timing requirements and/or computational resources. In some embodiments (e.g. where the aforementioned conditions permit), all of the position sensor output information for neighbour sectors 347A, 347D, 347E is communicated to the principal controller 369B. In addition to being the principal controller for its moveable stage 10 (and any other moveable stage(s) for which controller 369B may be the principal controller), controller 369B may also (e.g. at the same time) be the non-principal controller for one or more other moveable stages, in which case controller 369B may communicate a portion for its position sensor output information to other principal controller(s) 369 for such other moveable stage(s).

Another one of the tasks for the principal controller 369B (e.g. at each time step) is to control the position of its corresponding moveable stage 10. For the principal controller 369B, controlling the position of moveable stage 10 may comprise (e.g. in each time step) communicating with neighbor controllers 369A, 369D, 369E. Such control-based communication may comprise receiving current reference commands from these neighbor controllers 369A, 369D, 369E, which may be used by the principal controller 369B to determine final current references for the coil trace groups in its coil trace assembly 349. Such control-based communications may also comprise determining current reference commands for neighbor controllers 369A, 369D, 369E and communicating these current reference commands to neighbor controllers 369A, 369D, 369E. These current reference commands for neighbor controllers 369A, 369D, 369E may then be used by neighbor controllers 369A, 369D, 369E to determine the corresponding final current references for the coil trace groups in their respective coil trace assemblies 349A, 349D, 349E. The number of current reference commands that can be communicated between the principal controller 369B and its neighbor controllers 369A, 369D, 369E may depend on available bandwidth, timing requirements and/or computational resources. In some embodiments (e.g. where the aforementioned conditions permit), current reference commands for all of the coil trace groups in neighbor sectors 347A, 347D, 347E may be communicated by principal controller 369B to neighbor controllers 369A, 369D, 369E and current reference commands for all of the coil trace groups in the principal sector 347B are received by principal controller 369B from neighbor controllers 369A, 369D, 369E. In some embodiments, weighting parameters P for particular coil trace groups may be transferred between sector controllers 369 in addition to the current reference commands. For example, principal controller 369B may receive weighting factors P from neighbor controllers 369A, 369D, 369E and principal controller 369B may send weighting factors P to neighbor controllers 369A, 369D, 369E. As explained in more detail elsewhere, such weighting factors P may be used by local sector controllers 369 to determine final current references in circumstances, where there is more than one current reference input for a particular coil trace group.

In some embodiments, to avoid the step of determining which neighbouring sectors 347 have relevant position sensor output information to be transferred and/or which neighbouring sectors 347 require current reference commands, position sensor output information is received from all neighbouring sectors 347 and current reference commands are sent to all neighbouring sectors, although this is not necessary.

Figure 16C:
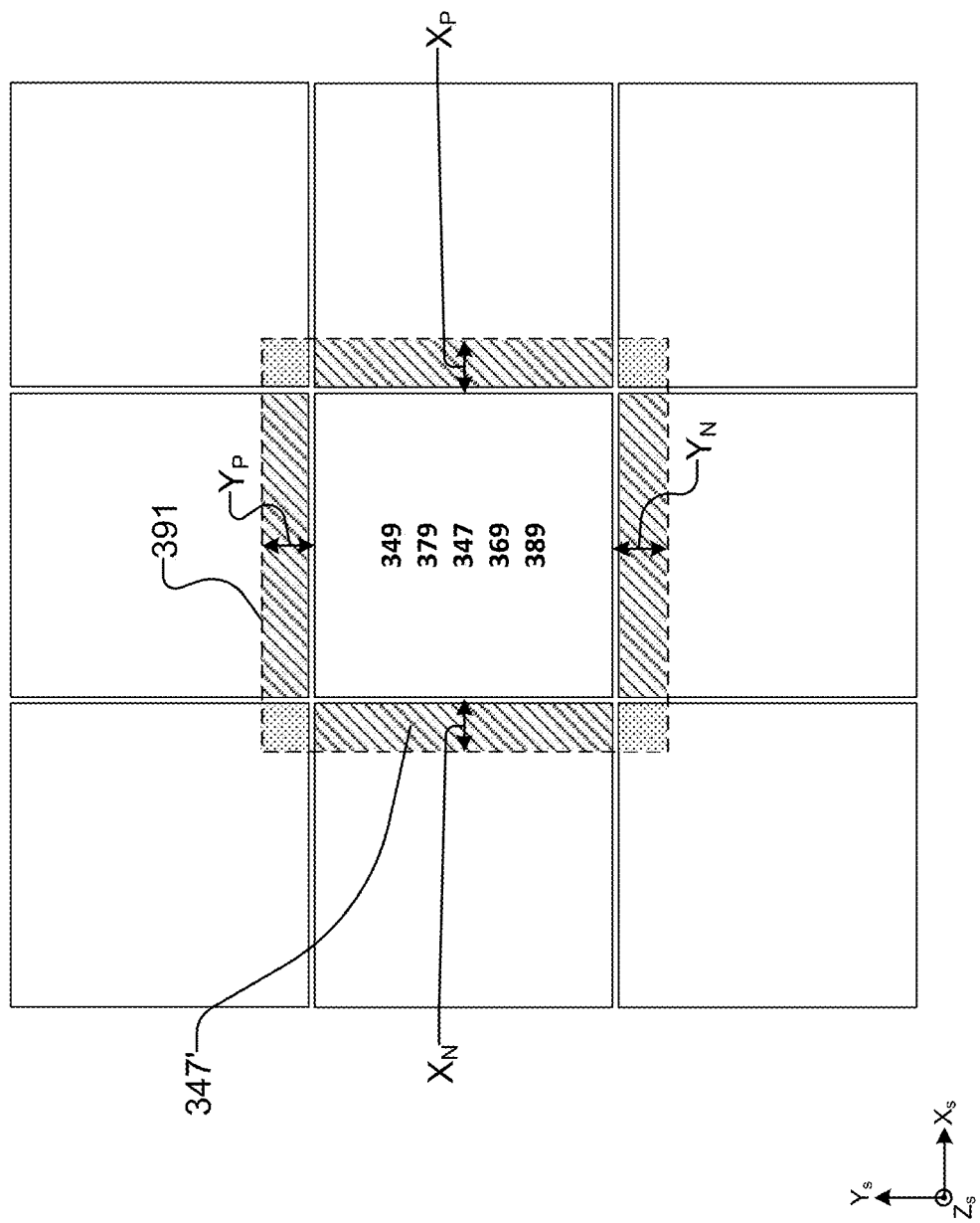
FIG. 16C shows a schematic top plan view of a stator sector and its respective extended boundary projected onto neighbouring sectors according to a particular embodiment.

To reduce unnecessary data transfer between principal controller 369 and neighbouring controllers 369 (e.g. principal controller 369B and neighbouring sector controllers 369A, 369C, 369D, 369E, 369F), the concept of an extended boundary 391 may be employed. An exemplary extended boundary 391 is shown in FIG. 16C. The planar area (in the plane defined by the stator-X direction and stator-Y direction) of extended boundary 391 may be called extended sector 347', which is larger in area than sector 347 itself. As shown in FIG. 16C, extended sector 347' extends past sector 347 in the negative stator-X direction by a distance $X_N$, in the positive stator-X direction by a distance $X_P$, in the negative stator y-direction by a distance $Y_N$, and in the positive stator y-direction by a distance $Y_P$. Although the distances $X_N$, $X_P$, $Y_N$, and $Y_P$ are depicted in the FIG. 16C embodiment as being approximately equal in magnitude, this is not necessary. The distances $X_N$, $X_P$, $Y_N$, and $Y_P$ can be varied as desired and can be different from one another. In some embodiments, one or more of the distances $X_N$, $X_P$, $Y_N$, and $Y_P$ may be zero in magnitude.

When one or more moveable stages 10 is crossing a boundary between two or more sectors 347, the distances $X_N$, $X_P$, $Y_N$, and/or $Y_P$ may be set to a magnitude such that, at any given time, each moveable stage 10 falls within at least one sector's extended boundary 391 (i.e. within one extended sector 347'). For example, the distances $X_N$, and/or $X_P$ may be set as half of the stage-X direction dimension of the one or more moveable stages 10. If the one or more moveable stages 10 are of different sizes, $X_N$, and/or $X_P$ may be set to half of the stage-X direction dimension of the largest moveable stage 10. Similarly, $Y_N$, and/or $Y_P$ may be set as half of the stage-Y direction dimension of the one or more moveable stages 10. If the one or more moveable stages 10 are of different sizes, $Y_N$, and/or $Y_P$ may be set to half of the stage-Y direction dimension of the largest moveable stage 10. In some embodiments, one or more of the distances $X_N$, $X_P$, $Y_N$, and $Y_P$ may be dynamically adjusted (e.g. by master controller 361) to allow for the use of different size moveable stages 10 without having to interrupt use.

As explained in more detail below, extending the size of one or more of distances $X_N$, $X_P$, $Y_N$, and $Y_P$ may come with a trade-off. As the size of extended boundary 391 increases, so does the amount of data that needs to be transferred between sector controllers 369. With the increase in data, computation time will also increase and it may be difficult to provide real-time control.

Referring now to FIG. 17, extended sector 347' of sector 347B overlaps (in the stator-Z direction) with neighbouring sectors 347A, 347D, 347E, 347F and 347C. The overlapping region of extended sector 347' and direct neighbouring sector 347A is region 391BA. The overlapping region of extended sector 347' and indirect neighbouring sector 347D is region 391BD. The overlapping region of extended sector 347' and direct neighbouring sector 347E is region 391BE. The overlapping region of extended sector 347' and indirect neighbouring sector 347F is region 391BF. The overlapping region of extended sector 347' and direct neighbouring sector 347C is region 391BC.

Extended boundary 391 may define which sensors 382 of neighboring sectors 347A, 347D, 347E, 347F and 347C are included in the portions of the position sensor output information that are communicated to principal sector controller 369B. For example, neighboring controllers 369A, 369D, 369E, 369F and 369C may send to principal controller 369B portions of their corresponding position sensor output information which relate to the output of sensors 382 that are within extended boundary 391 (i.e. overlap in the stator-Z direction with the extended sector 347'). Extended boundary 391 may similarly define the coil trace groups for which current reference commands are exchanged between principal controller 369B and its neighboring controllers 369A, 369D, 369E, 369F and 369C. For example, principal controller 369B may send, to neighboring controllers 369A, 369D, 369E, 369F and 369C, current reference commands for coil trace groups that are located outside of stator coil assembly 349B but within extended boundary 391 (i.e. overlap in the stator-Z direction with the extended sector 347'). By analogous example, principal controller 369B may receive, from neighboring controllers 369A, 369D, 369E, 369F and 369C, current reference commands for the coil trace groups of principal sector 347B that are outside of stator coil assemblies 349A, 349D, 349E, 349F, 349C but within the extended boundaries (not shown) of neighboring sectors 347A, 347D, 347E, 347F and 347C. In the illustrated embodiment shown in FIG. 17, there is only one extended boundary 391. However, in some embodiments, the magnitude and/or shape of extended boundary 391 can be different for the purpose of exchanging position sensor output information as between neighboring sectors 347 and for the purpose of exchanging current reference commands between neighbouring sectors 347. In some embodiments, the extended boundary 391 is larger for the former purpose. In some embodiments, the extended boundary 391 is smaller for the former purpose.

Although many of the above concepts were discussed in the context of exemplary FIG. 17 (where sector 347B is the principal sector), it should be understood that such concepts can be expanded to any suitable sector 347 of any suitable stators 330. Such sectors 347 and/or stators 330 may have different sizes and shapes (e.g. containing different numbers of sectors 347 and/or sectors 347 arranged into different geometries) and to any suitable number of moveable stages 10. Each sector 347 may be a principal sector to one or more moveable stages and may have its own direct and indirect neighbouring sectors and its own extended region. Since the relationship between moveable stage(s) 10 and stator 330 is dynamic, the role of each sector 347 may be constantly changing according to the criteria discussed herein.

The concept of the extended boundary 391 may be employed for efficiently extending the sensing capability of principal sector controller 369B to cover situations where moveable stage 10 crosses partly out of principal sector 347B, but remains within extended sector 347', such as is illustrated in FIG. 17. Using bi-directional communication channels, such as sector link 392, principal sector controller 369B may access position sensor output information not only from the position sensors 382 in sector sensor assembly 389B, but also from the position sensors 382 in sector sensor assemblies 389 of neighbouring sectors 347A, 347D, 347E, 347F and 347C.

Referring to FIGS. 17 and 18, principal sector 347B can extend its effective sensing region via sector links 392 to include regions 391BA, 391BD, 391BE, 391BF and 391BC. In particular, local sector controller 369A may transfer, to principal controller 369B, a portion of its position sensor output information based on position sensor outputs from sensors 382 from region 391BA via sector link 392B. Local sector controller 369E may transfer, to principal controller 369B, a portion of its position sensor output information based on position sensor outputs from sensors 382 from region 391BE via sector link 392F. Local sector controller 369C may transfer, to principal controller 369B, a portion of its position sensor output information based on position sensor outputs from sensors 382 from region 391BC via sector link 392C. Local sector controller 369D may transfer, to principal controller 369B, a portion of its position sensor output information based on position sensor outputs from sensors 382 from region 391BD via sector link 392E, controller 369A and sector link 392B. Local sector controller 369F may transfer, to principal controller 369B, a portion of its position sensor output information based on position sensor outputs from sensors 382 from region 391BF via sector link 392G, controller 369C and sector link 392C. Alternatively, sensor output information based on position sensor outputs from sensors 382 in either of regions 391BD and 391BF may be transferred via controller 347E. In some embodiments, each sector controller 369 may constantly be receiving sensor output information based on the sensor outputs from some or all of the sensors 382 within its extended boundary 391 (e.g. from all of the sensors 382 which overlap in the stator-Z direction with its extended boundary 391), or may receive such sensor output information with every cycle (e.g. time step) of the periodic control algorithm.

Figure 19A:
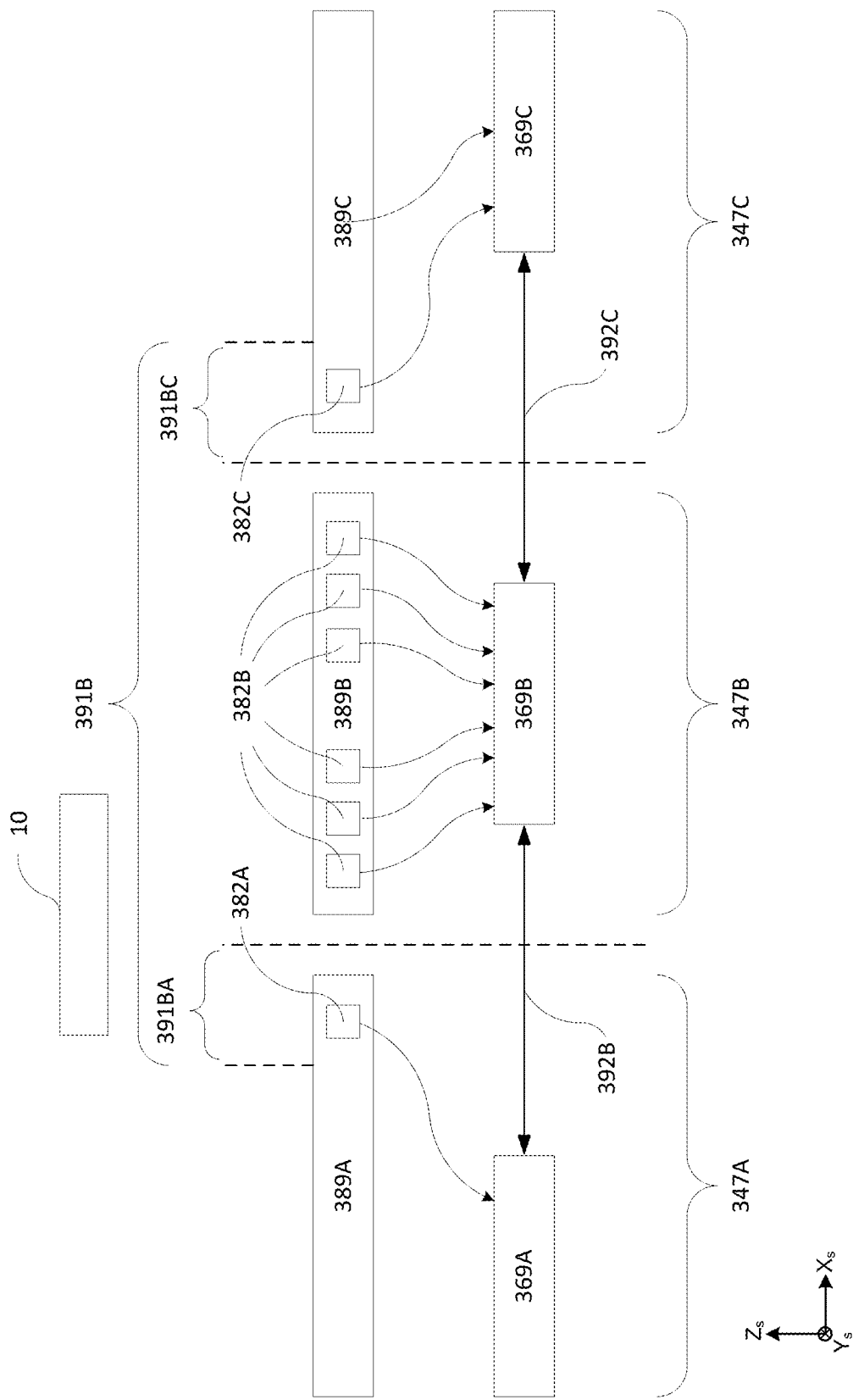
FIG. 19A is a schematic depiction of communication between a plurality of sector sensor assemblies and their respective local sector controllers according to a particular embodiment.

FIG. 19A is a schematic view of sectors 347A, 347B and 347C. Moveable stage 10 is depicted as crossing the boundary between sector 347A and sector 347B. Sector 347B may be the principal sector for the moveable stage 10 shown in FIG. 19A. As can be seen from FIG. 19A, sector controller 369B directly receives sensor output information based on the sensor output from local sensors 382B of local sector sensor assembly 389B. Sector controller 369B may also receive sensor output information based on the sensor output from other sensors 382 within extended boundary 391B via sector links 392. For example, sensor output information based on the sensor outputs from sensors 382A, which is within extended boundary region 391BA, is sent from sector controller 369A of sector 347A to sector controller 369B via sector link 392B. As discussed above, sensor outputs from sensors 382A may be processed by their sector controller 369A (e.g. by amplifying, scaling, offsetting, filtering, digitizing, calibrating, compensating and/or the like) to generate position sensor output information prior to sending this position sensor output information to principal controller 369B. While only a single sensor 382A is schematically depicted within sector 347A, it should be understood that a plurality of sensors 382A may be present within sector 347A and within region 391BA. Position sensor output information based on sensor outputs from other sensors within region 391BA may be accessed by sector controller 369B in a similar manner as described above.

Although the discussion of FIG. 19A focuses on sector 347B as the principal sector and sector 347A as a neighbouring sector, it should be understood that all other sectors 347 may have respective extended boundaries 391. Therefore, by employing sector links 392, each sector controller 369 can access sensors 382 in their respective extended sectors 347' to enable position measurement of moveable stage(s) 10 in a non-interrupted way, even as moveable stage(s) 10 cross sector boundaries between two or more sectors 347.

The concept of the extended boundary 391 may also be employed for efficiently extending the driving (e.g. current control) capability of a principal sector controller 369B to cover situations where moveable stage 10 crosses partly out of principal sector 347B, but remains within extended sector 347', such as is illustrated in FIG. 17. Each sector controller 369 can determine desired current references for all of the coil trace groups in its extended sector 347' (including coil trace groups in neighbouring sectors 347, but within its extended boundary 391). The desired current references for coil trace groups in other sectors 347 can be used as current reference commands which can be communicated to the controllers 369 of such other sectors 347. For example, subject to current reference commands received from other controllers, principal sector controller 369B may directly control the current references for the coil trace groups of its own sector coil assembly 349B, but sector controller 369B may also use the desired currents that it has determined for coil trace groups in sector coil assemblies 349 of neighbouring sectors 347 to generate current reference commands for those coil trace groups and may transmit such current reference commands to neighbouring sector controllers 369. This ability to communicate current reference commands allows a sector controller 369 to directly (i.e. using its own coil traces) or indirectly (using the coil traces of neighboring sectors) generate forces and/or torques on moveable stage(s) 10 for which it is the principal sector 347.

In the case of a single moveable stage 10, the position of moveable stage 10 may be controlled by a single principal sector controller 369 corresponding to its principal sector 347. If moveable stage 10 completely overlaps with its principal sector 347, the local principal sector controller 369 may function to determine final current references (which together with local amplifier 379 and optionally current feedback control module 352) may be used to drive corresponding currents into the coil trace groups of local sector coil assembly 349 to cause the currents to track the current references and to thereby control moveable stage 10 in up to six degrees of freedom. If moveable stage 10 only partially overlaps with its principal sector 347 and also partially overlaps with one or more neighbouring sectors 347 but is within the extended sector 347' of its principal sector, as is the case with respect to moveable stage 10 on principal sector 347B in FIG. 17, it may not be sufficient for the principal local sector controller 369 to drive only the coil trace groups in its own sector coil assembly 349 for suitable control of moveable stage 10 in up to six degrees of freedom. Instead, the principal local sector controller 369 may determine appropriate current references for all of the coil trace groups in its extended sector 347' (including coil trace groups in neighbouring sectors 347, but within its extended boundary 391). The desired current references for coil trace groups in neighboring sectors 347 can be used as current reference commands which can be communicated to the controllers 369 of such neighboring sectors 347 by sector links 392, such that neighbouring sector controllers 369 may drive the coil trace groups in neighbouring sector coil assemblies 349 according to the current reference commands generated by principal sector controller 369.

Figure 19B:
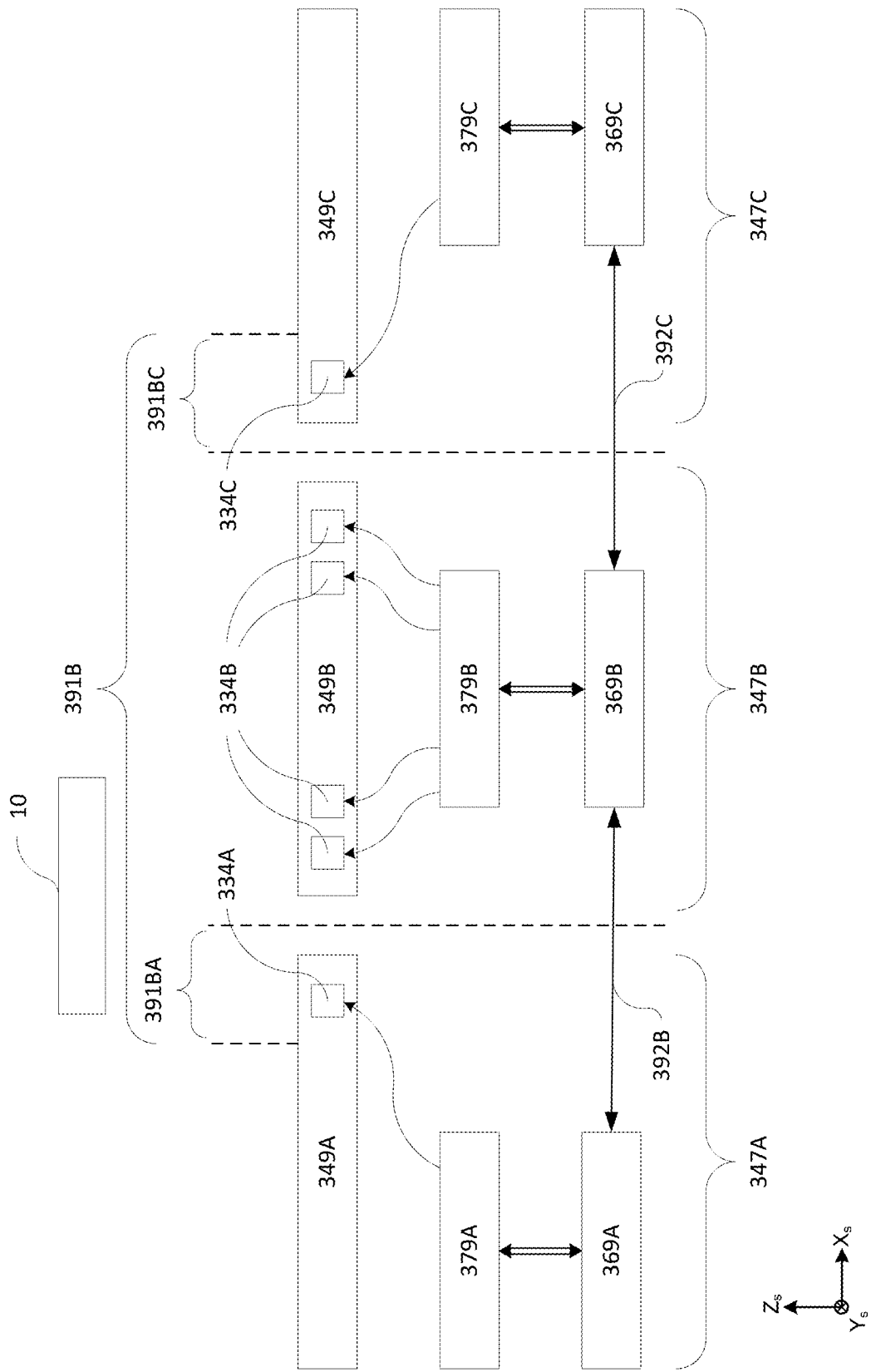
FIG. 19B is a schematic depiction of communication between a plurality of sector coil assemblies and their respective local amplifiers and local sector controllers according to a particular embodiment.

FIG. 19B is a schematic view of sectors 347A, 347B and 347C. Moveable stage 10 is depicted as crossing the boundary between sector 347A and sector 347B. Sector 347B may be the principal sector. As can be seen from FIG. 19B, principal sector controller 369B directly sends current references to its own sector amplifier 379B to drive current into the coil trace groups of sector coil assembly 349B. Sector controller 369B may also indirectly send current reference commands corresponding to other coil trace groups of neighboring sectors, but within extended boundary 391B (i.e. overlapping in the stator-Z direction with extended boundary 391B). For example, sector controller 369B may determine and send current reference commands for coil trace groups 334A within extended boundary region 391BA. Current reference commands for coil trace groups 334A are sent from sector controller 369B to sector controller 369A via sector link 392B. Sector controller 369A uses the current reference commands for coil trace groups 334A to generate final current references which are sent to sector amplifier 379A, such that sector controller 369A and amplifier 379A (and optionally current feedback control module 352) may be used to drive corresponding currents into the coil trace groups 334A of local sector coil assembly 349A to cause the currents to track the final current references and to thereby control moveable stage 10 in up to six degrees of freedom. In some embodiments, sector controller 369A may condition (e.g. by suitable processing) the current reference commands received from principal sector controller 369B to determine the final current references which are sent to sector amplifier 379A. While only a single coil trace group 334A is depicted within sector 347A, it should be understood that a plurality of coil trace groups 334A may be present within sector 347A and within extended boundary region 391BA. Other coil trace groups 334A within extended boundary region 391BA may be accessed by sector controller 369B in a similar manner as described above.

Although the discussion of FIG. 19B focuses on sector 347B as the principal sector and sector 347A as a neighboring sector, it should be understood that all other sectors 347 may have respective extended boundaries 391. Therefore, by employing sector links 392, each sector controller 369 can impact the currents driven into coil trace groups in their respective extended sectors 347' to enable position control of moveable stage(s) 10 in a non-interrupted way, even as moveable stage(s) 10 cross sector boundaries.

Referring back to FIG. 17, a greater amount of moveable stage 10 overlaps (in the stator-Z direction) with sector 347B than with sectors 347A, 347D and 347E. Accordingly, it may be desirable for sector 347B to be the principal sector of moveable stage 10. However, moveable stage 10 also overlaps (in the stator-Z direction) with sector 347A, sector 347D and sector 347E. To control the position of moveable stage 10 in up to six degrees of freedom, principal sector controller 369B may, for each time step (or sampling event), determine current references commands for one or more coil trace groups within extended boundary regions 391BA, 391BD and 391BE and may communicate such current reference commands to respective sector controllers 369A, 369D, 369E via one or more sector links 392. In some embodiments, despite sector controller 369B not being the principal controller for a moveable stage 10 that overlaps (in the stator-Z direction) regions 391BC, 391BF and/or other parts of extended sector 347' outside of sector 347B, sector controller 369B may be configured to constantly (e.g. once for each control time step) determine current reference commands for the entire extended sector 347' outside of sector 347B (e.g. overlapping regions 391BA, 391BD, 391BE, 392BF, 391BC) and communicate these current reference commands to the appropriate neighboring sector controllers 369. In this case, the current reference commands for particular coil trace groups (or their weighting factors) may be zero if controller 369B does not have a need for current in these particular coil trace groups.

Upon receiving current reference commands from principal sector controller 369B, neighboring sector controllers 369A, 369D, 369E may generate final current references based at least in part on these current reference commands Neighboring sector controllers 369A, 369D, 369E (together with sector amplifiers 379A, 379D and 379E (and optionally current feedback control modules 352) may drive currents into their respective coil trace groups which attempt to track these final current references. In the case where sector controllers 369A, 369D and 369E have no other need to control the currents in coil trace groups within regions 391BA, 391BD and 391BE, sector controllers 369A, 369D and 369E may generate their respective final current references based only on the current reference commands determined by principal sector controller 369B and sent to neighboring sector controllers 369A, 369D, 369E (and no other current reference commands).

However, in some cases, sector controllers 369A, 369D and 369E may have additional needs to drive currents in one or more of the coil trace groups within regions 391BA, 391BD and 391BE. For example, one or more of sector controllers 369A, 369D and 369E may be the principal sector controllers for their own moveable stage (not shown) and, consequently, may generate current references (along with corresponding weighting factors discussed in more detail below) for their own moveable stage which may include current references for coil trace groups in one or more of regions 391BA, 391BD and 391BE. Also, it is possible that any one of sector controllers 369A, 369D and 369E could receive other current reference commands (along with corresponding weighting factors discussed in more detail below) from one or more other sector controllers 369 (i.e. in addition to the current sensor commands received from sector controller 369B) and such current reference commands could correspond to coil trace groups from one or more of regions 391BA, 391BD and 391BE. For each time step, each sector controller 369 may determine a final current reference for each coil trace group in its sector coil assembly 349 based at least in part on one or more of: a current reference for the coil trace group that is generated by the sector controller 369 based on the sector controller 369 being the principal controller for one or more moveable stages; and any current reference commands for the coil trace group which may be received from the sector controllers of one or more neighboring sectors (or from the sector controllers of other sectors generally). Each sector controller 369 may also determine a final current reference for each coil trace group in its sector coil assembly 349 on the basis of weighting factors associated with each current reference or received current reference command. For example, in the illustrated case of FIG. 17, sector controller 369A may determine a final current reference for each coil trace group in its sector coil assembly 349A based on: a current reference for the coil trace group that is generated by sector controller 369A based on sector controller 369A being the principal controller for one or more moveable stages (not shown in FIG. 17) along with a weighting factor associated with the coil trace group; a current reference command and a corresponding weighting factor for the coil trace group received from the sector controller 369B of neighboring sector 347B; and current reference commands and corresponding weighting factors for the coil trace group which may be received from the sector controllers 369 of other neighboring sectors 347 (or other sectors 347, generally).

Where a sector controller 369 determines a final reference current for a particular coil trace group based on multiple current reference inputs (e.g. any two or more of: its own current reference and one or more current reference commands from other sector controllers 369), then the sector controller 369 may perform a weighted average of the multiple current reference inputs to determine the final current reference for the particular coil trace group based on a set of weighting factors, wherein the weighting factors are associated with the particular coil trace group and each weighting factor is associated with a corresponding current reference input.

For example, let us consider a scenario where sector controller 369A is determining a final current reference for a particular coil trace group 334A based on three inputs: a current reference $I_A$ that sector controller 369A has determined for a first moveable stage 10A; a current reference command $I_B$ that sector controller 369A has received from sector controller 369B based on sector controller 369B needing to control a corresponding moveable stage 10B; and a current reference command $I_C$ that sector controller 369A has received from sector controller 369C based on sector controller 369C needing to control a corresponding moveable stage 10C. Let us assume further that there are weighting factors $P_A$, $P_B$, $P_C$ respectively associated with current reference $I_A$ and current reference commands $I_B$, $I_C$. In one particular non-limiting embodiment, the weighting factors $P_A$, $P_B$, $P_C$ may be determined based overlap areas (in the stator-Z direction) between one or more magnetization elements associated with the moveable stage 10A, 10B, 10C that is desired to be controlled by a particular controller and the particular coil trace group for which the weighting factor is associated. For example, $P_A$ may be based on the amount of area (i.e. in the stator-X and stator-Y plane) that one or more magnetization elements of moveable stage 10A overlaps (in the stator-Z direction) with the particular coil trace group 334A (e.g. for the purpose of force generation based on the interaction of current in coil trace group 334A and the one or more magnetization elements of moveable stage 10A); $P_B$ may be based on the amount of area that one or more magnetization elements of moveable stage 10B overlaps with the particular coil trace group 334A (e.g. for the purpose of force generation based on the interaction of current in coil trace group 334A and the one or more magnetization elements of moveable stage 10B); and $P_C$ may be given by the amount of area that moveable stage 10C overlaps with the particular coil trace group 334A (e.g. for the purpose of force generation based on the interaction of current in coil trace group 334A and the one or more magnetization elements of moveable stage 10C). Then sector controller 369A may determine the final current reference according to:

$$I_{final\_ref} = \left(\frac{P_A}{P_A+P_B+P_C}\right)I_A + \left(\frac{P_B}{P_A+P_B+P_C}\right)I_B + \left(\frac{P_C}{P_A+P_B+P_C}\right)I_C \quad (1)$$

where the bracketed terms are the weights. In some embodiments, other criteria may be additionally or alternatively used to determine the weighting factors associated with determining the final current reference for a particular coil group.

In some embodiments, weighting factors can be based on the overlap between the whole magnet assembly of the moveable stage and the particular coil trace group. In some embodiments, weighting factors can be based on the overlap between the magnet element (that interacts strongest with the particular coil trace group) and the particular coil trace group. The weighting function in (1) is a linear weighted average, which is not necessary. In some embodiments, other weighted average formulations can also be used. By way of non-limiting example, a squared weighted average of the following form may be used:

$$I_{final\_ref} = \left(\frac{P_A^2}{P_A^2+P_B^2+P_C^2}\right)I_A + \left(\frac{P_B^2}{P_A^2+P_B^2+P_C^2}\right)I_B + \left(\frac{P_C^2}{P_A^2+P_B^2+P_C^2}\right)I_C \quad (2)$$

Other mathematical average can also be applied, in some embodiments. Since, in some embodiments, there multiphases of coil traces within a coil trace group and correspondingly there are multiple phases of currents, the above weighted final current reference expression should be interpreted as weighting operation for each phase individually.

Although the above discussion relates to an exemplary case of three moveable stages 10A, 10B, 10C, each having different principal controllers 369A, 369B, 369C. it should be understood that this weighted summing approach to generating a final current reference based on a plurality of current reference inputs can also applied where a particular controller owns two or more moveable stages 10. For example, consider a scenario where a single sector controller 369A owns multiple moveable stages 10A and 10B and moveable stage 10C has a different principal controller 369C, and the respective controllers 369A, 369C want to drive current in the same coil trace group 334A to control the three moveable stages 10A, 10B, 10C. Assume further that, for the purpose of position control of moveable stage 10A, $I_A$ and $P_A$ are the current reference and weight for coil trace group 334A; for the purpose of position control of moveable stage 10B, $I_B$ and $P_B$ are the current reference and weight for coil trace group 334A; and, for the purpose of position control of moveable stage 10C, $I_C$ and $P_C$ are the current reference command and weight for coil trace group 334A. The final current reference can be similarly determined using an equation of the form of equation (1) or (2). The "sharing" of coil trace group by two or more moveable stage is described in detail elsewhere herein.

Figure 20:
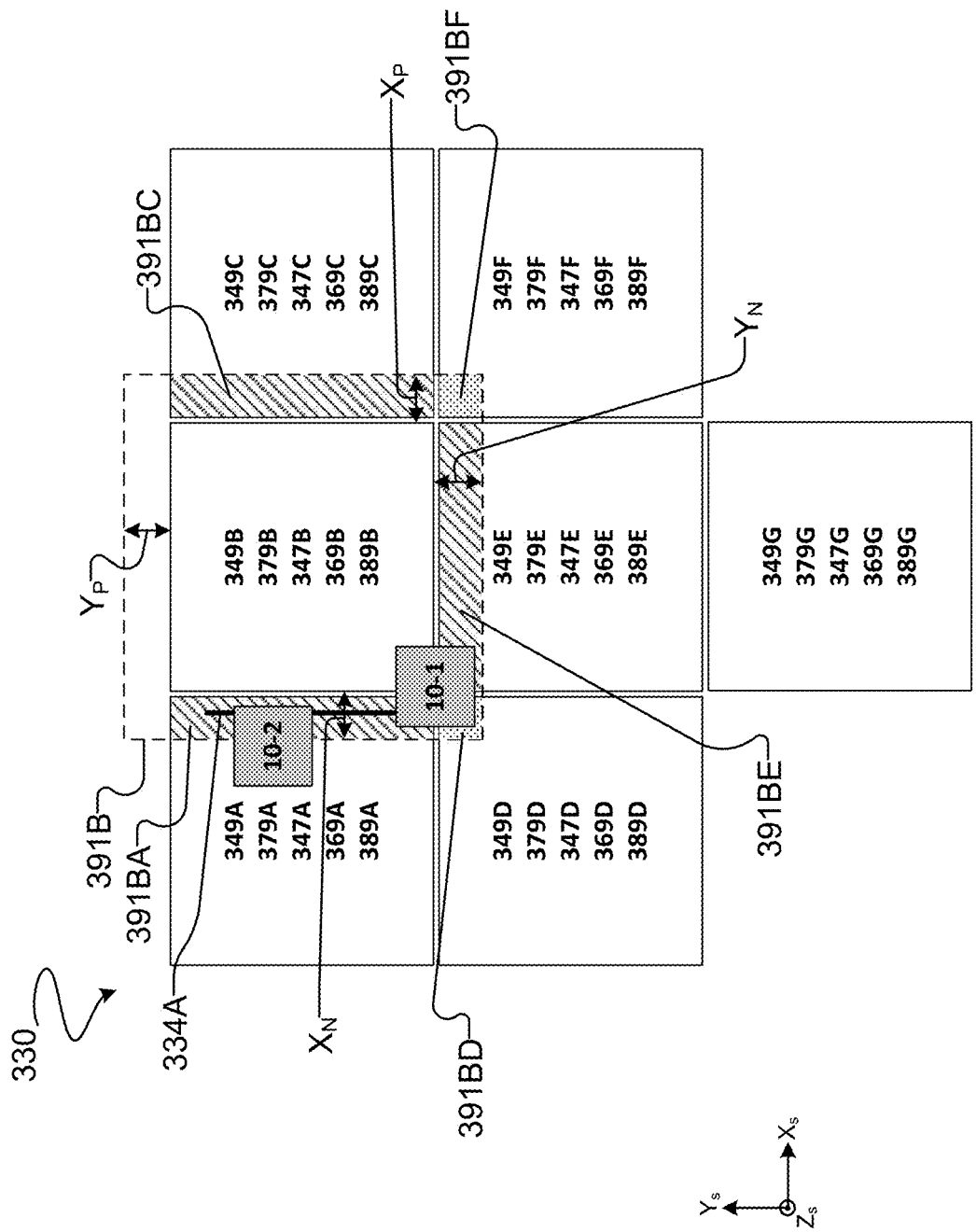
FIG. 20 shows a schematic top plan view of a plurality of moveable stages overlapping with a particular coil trace according to a particular embodiment.

FIG. 20 depicts two moveable stages 10-1 and 10-2 as they move across stator 330. FIG. 20 is similar to FIG. 17 except that an additional moveable stage 10 is depicted and an exemplary coil trace group 334A in sector 347A is depicted. As was the case with the example in FIG. 17, the largest portion of moveable stage 10-1 overlaps (in the stator-Z direction) with sector 347B, so controller 369B may be selected to be the principal controller for moveable stage 10-1. The position of moveable stage 10-1 may be determined in the same manner as described above in relation to moveable stage 10 of FIG. 17. Since moveable stage 10-2 is completely within (non-extended) sector 347A, sector 347A may be selected to be the principal sector of moveable stage 10-2. Subject to current sensor output information received from other sector controllers (which is discussed elsewhere herein), the position of moveable stage 10-2 may be determined by sector sensor assembly 389A and local sector controller 369A without the use of position sensor output information from other sector controllers.

Although the technique for determining the positions of moveable stages 10-1, 10-2 does not change with the number of moveable stages 10, the method for controlling the position of moveable stages 10-1, 10-2 may change when there is more than one moveable stage 10. For example, as can be seen from FIG. 20, both moveable stage 10-1 and 10-2 overlap (in the stator-Z direction) with coil trace group 334A. Therefore, for the purpose of controlling the position of moveable stage 10-1, sector controller 369B may desire to drive a first current through coil trace group 334A and may send to sector controller 369A, a corresponding first current reference command in effort to achieve this desired first current in coil trace group 334A. For the purpose of controlling the position of moveable stage 10-2, sector controller 369A may also desire to drive a second current through coil trace 334A. Controller 369A may determine its own second current reference corresponding to this second current. The first current reference command (sent to controller 369A from controller 369B) and second current reference (determined by controller 369A) are not necessarily the same. A similar circumstance could occur with two moveable stages 10 that are completely within the same sector 347 but still overlap a coil trace group 334A. Such a case may be dealt with in generally the same manner as described herein or according to one or more methods described in PCT/CA2015/050523.

Various ways exist to accommodate the case in which a single coil trace group 334A overlaps (in the stator-Z direction) with more than one moveable stage 10. In some embodiments, the final current reference for a coil trace group 334A in the coil assembly 349A of a sector 347A is determined by sector's own controller 369A and is used in conjunction with local sector amplifier 379A (and optionally current feedback control module 352) to cause the current in coil trace group 334A to track the final current reference signal In the case of coil trace group 334A of FIG. 20, local sector controller 369A may determine the final current reference for coil trace group 334A despite the fact that coil trace group 334A is within extended boundary 391B of sector 347B and despite the fact that sector controller 369B desires to drive a particular current through coil trace group 334A. In some embodiments, the final current reference for coil trace group 334A is based at least in part on the desired first current reference command determined by sector controller 369B and sent to controller 369A and at least in part by the desired second current reference determined by sector controller 369A. Both of these reference current parameters may be inputs for the determination of the final current reference by controller 369A—e.g. as discussed elsewhere herein.

The first current reference command and second current reference used by controller 369A to determine the final current reference for coil trace group 334A may be combined or accommodated in various ways. In some embodiments, an average value of the first current reference command and the second current reference may be employed. In other embodiments, as discussed above in connection with equation (1), a weighted average value of the first current reference command and the second current reference may be employed. The weighting factor may be based on one or more of: the importance of coil trace 334A to the driving of each moveable stage 10-1, 10-2, the amount (e.g. in the stator-X-stator-Y plane) of overlap (in the stator-Z direction) of each moveable stage 10-1, 10-2 with coil trace group 334A, whether or not other coil trace groups driving each moveable stage 10-1, 10-2 are also being shared, and/or the like. Accordingly, when sector controller 369 (e.g. sector controller 369B) sends a current reference command for a coil trace group (e.g. coil trac group 334A) of a neighbouring sector 347 (e.g. sector 347A) to the sector controller 369 (e.g. sector controller 369A) of that neighbouring sector 347, it may also send a parameter that may be used to determine a weighting factor. For example, in the above-described example associated with equation (1), controllers 369B, 369C may send to controller 369A the parameters $P_B$ and $P_C$ in addition to the current reference commands $I_B$, $I_C$.

Once sector controller 369A has determined the final current reference for coil trace group 334A based on: the first current reference command received from controller 369B and the second current reference determined by sector controller 369A, controller 369A, amplifier 379A and optionally current feedback control module 352 may work together to drive current in coil trace group 334A that tracks this final current reference.

Although the above discussion of determining the current reference signal for a coil trace group was solely in relation to coil trace group 334A, it should be understood that a similar process may be used for every coil trace group in every sector 347 for which there are competing current reference inputs. Generally, a plurality of sector controllers 369 (and any moveable stages 10 owned by such controllers 369) may compete for one particular coil trace group when currents flowing into the particular coil trace group have electromagnetic force interaction with the plurality of moveable stages 10. Sometimes, a sector controller 369 may own multiple moving stages 10 which may compete for the same coil trace group. In other words, for every local coil trace group in a sector 347, the local sector controller 369 for that sector 347 may determine, for each control time step, a final current reference based on one or more current reference inputs which may include: current references that are generated by the local sector controller 369 based on the local sector controller 369 being the principal controller for one or more moveable stages; and any current reference commands which may be received from the sector controllers of one or more neighboring sectors (or from the sector controllers of other sectors generally). Furthermore, if any of the moveable stages 10, for which that local sector controller 369 is the principal controller, overlap (in the stator-Z direction) with another sector 347, the local sector controller 369 may send current reference commands for the coil trace groups in its extended boundary 391 to the neighbouring sector controller(s) 369 associated with such coil trace groups. Alternatively, each sector controller 369 may send current reference commands for every coil trace group within its extended boundary 391 to the corresponding neighbouring sector controllers 369 associated with such coil trace groups irrespective of the location of moveable stages 10.

In some embodiments, electromagnetic coupling may occur between sector coil assembly 349 its local sector sensor assembly 389. For example, when currents are driven into the coil traces of coil assembly 349, these currents can impact the readings of position sensors 382 in sensor assembly 389. In some embodiments, similar electromagnetic coupling exists between position sensors 382 of one stator sector 347 and the coil traces in a neighbouring stator sector 347. Such electromagnetic coupling/interference may be understood to include a coupling effect associated with magnetic field coupling, a coupling effect associated with electric field coupling and/or both. Such electromagnetic coupling/interference may affect the outputs of position sensors 382, thereby degrading the performance of the system by introducing output error and/or noise. To compensate for such electromagnetic coupling, the currents driven into coil traces (or coil trace groups) may be measured by current sensors 354 described above and may be used to compensate the position sensor outputs from position sensors 382 before such position sensor outputs are used to determine the position of a moveable stage. The use of current measurements to compensate position sensor outputs according to one non-limiting embodiment is described in more detail in Patent Cooperation Treaty Application No. PCT/CA2014/050739, which is hereby incorporated herein by reference.

Figure 19C:
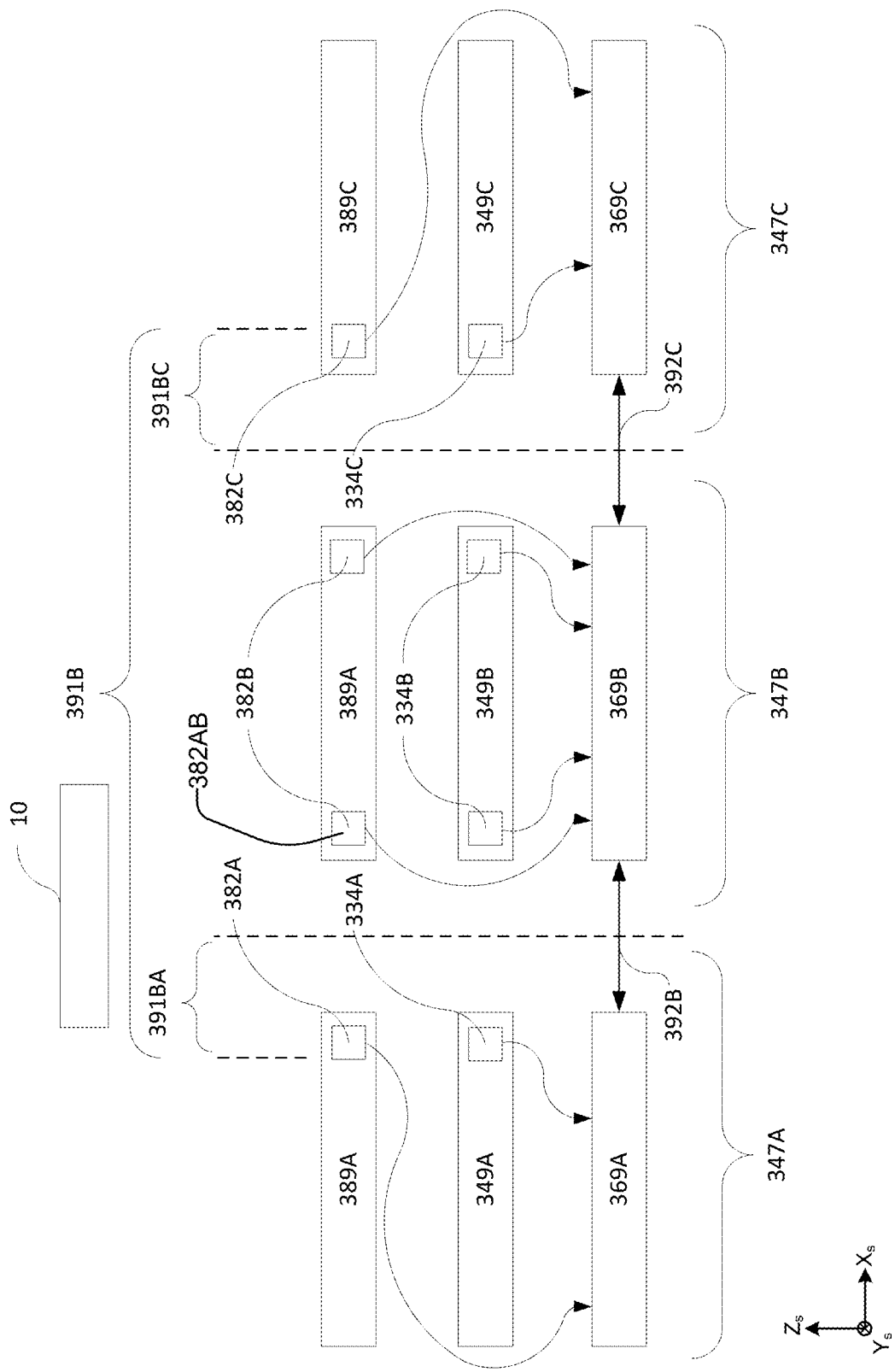
FIG. 19C is a schematic depiction of communication between a plurality of sector coil assemblies, sector sensor assemblies and their respective local sector controllers according to a particular embodiment.

The concept of extended boundaries 391 may also be applied to allow for compensation of position sensor outputs of position sensors 382 to adjust for electromagnetic coupling between currents in the coil traces of one of a pair of neighbouring sectors 347 and position sensor outputs of position sensors 382 in the other of the pair of neighboring sectors 347. Referring to FIG. 19C, position sensor(s) 382AB (which is the position sensor 382B closest to sector 347A) may be affected not only by the current in sector coil assembly 349B but also by the current in one or more coil trace groups 334A of sector coil assembly 349A. Current in coil trace groups 334A in region 391BA may be measured by current sensor(s) 354 to obtain current sensor outputs, collected by local sector controller 369A and transferred as current sensor output information to neighboring sector controller 369B via sector link 392B. In some embodiments, local sector controller 369A may process (e.g. by amplifying, scaling, offsetting, filtering, digitizing, calibrating, compensating and/or the like) the current sensor outputs that it receives from its local current sensors 354 to generate processed current sensor output information based on the current sensor outputs. Controller 369A may then send a portion of this current sensor output information to neighboring controller 369B. Sector controller 369B may then use suitable algorithms (e.g. such as those described in PCT/CA2014/050739, for example) to correct the position sensor outputs from position sensor(s) 382AB based on current sensor output information which is derived from the actual measurements of the currents in local coil trace groups 334B and neighboring coil trace groups 334A (and any other neighboring coil trace groups as may be necessary). Similarly, output from one or more position sensor(s) 382A near sector 347B may be adjusted to accommodate electromagnetic coupling caused by both currents driven in its local sector coil assembly 349A and currents driven into coil trace groups 334B near sector 347A. Effectively, each sector controller 369 can access current sensor output information within its extended boundary 391 for adjusting the position sensor outputs from its local position sensors 382 to compensate electromagnetic coupling from currents driven in its local sector coil assembly 389 and currents driven in its neighbouring sector coil assemblies 389.

For the purpose of using current sensor output information based on measured current sensor outputs to compensate position sensor outputs as described herein, extended boundaries 391 may have the same magnitude and shape as extended boundaries 391 used for exchanging position sensor output information as between neighboring sectors 347 used for exchanging current reference commands between neighbouring sectors 347. This is not necessary. In other embodiments, the size and/or shape of extended boundaries 391 may depend on which sensors 382 experience electromagnetic coupling from which coil traces. The magnitude and/or shape of extended boundary 391 for the purpose of exchanging current sensor output information between neighboring sectors 347 may be dependent on the electromagnetic coupling distance between sensors 382 and coil traces. Accordingly, it should be understood that the magnitude and/or shape of extended boundaries 391 can be different for the purpose of exchanging position sensor output information as between neighboring sectors 347, for the purpose of exchanging current reference commands between neighbouring sectors 347 and for the purpose of exchanging current sensor output information as between neighboring sectors 347. Each extended boundary may be adjusted dynamically (e.g. by master controller 361), as desired.

Figure 21:
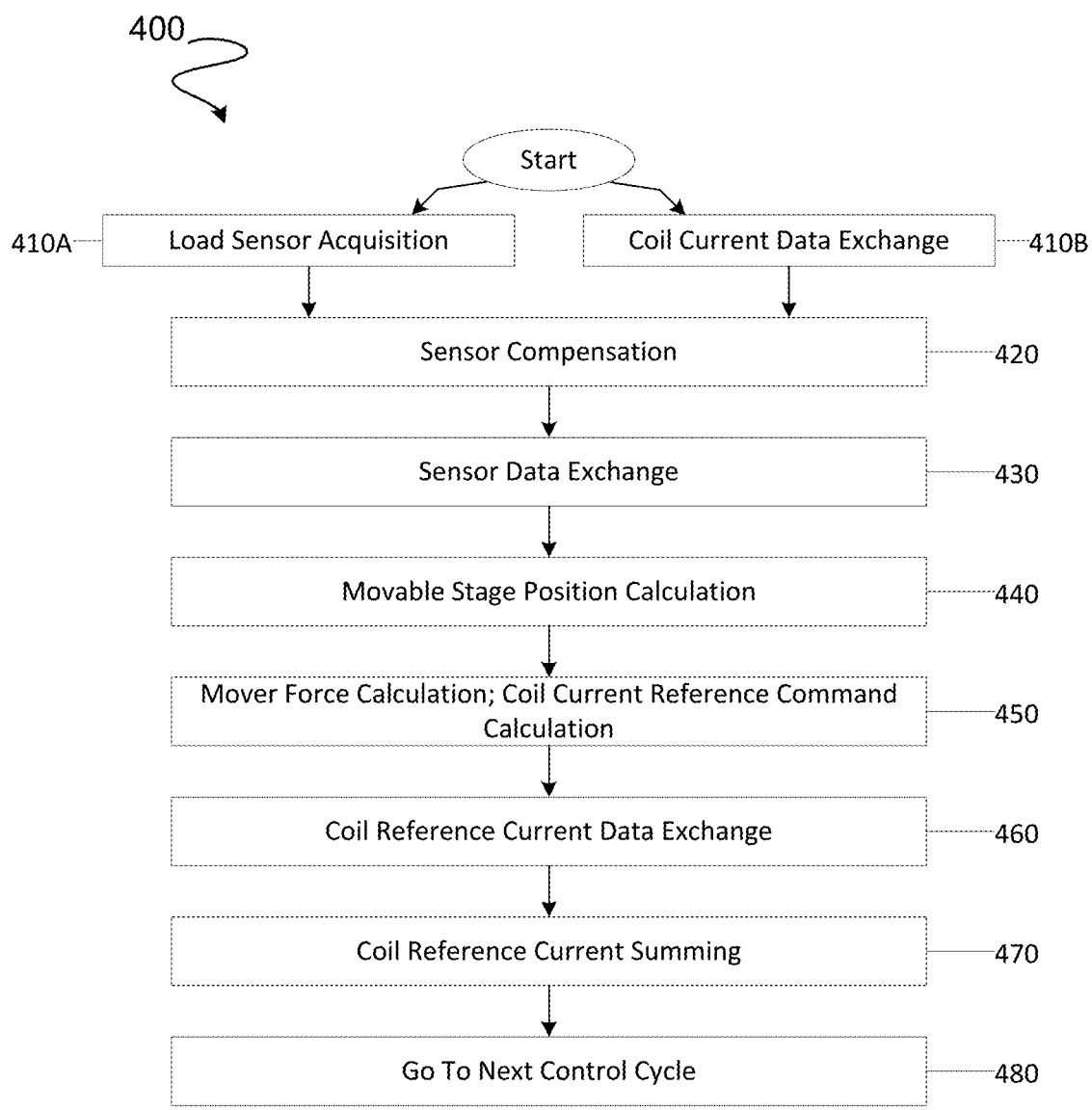
FIG. 21 is a flow chart illustrating a method for controlling one or more moveable stages on a stator according to a particular embodiment.

In practice, the sharing of position sensor output information, current reference commands, control states and/or current sensor output information as between neighboring sectors 347 may be implemented together to decentralize control of one or more moveable stages 10 on stator 330. FIG. 21 depicts one cycle (e.g. a time step) of a control method 400 for one or more moveable stages 10 according to one particular embodiment. By repeating the cycle 400 at discrete time steps, effectively continuous control of one or more moveable stages 10 may be achieved.

At step 410A each individual sector controller 369 may collect position sensor outputs from its corresponding local sector sensor assembly 389 (e.g. in the form of combined position sensor outputs 2001). At step 410B, each individual sector controller 369 may collect current sensor outputs from the currents driven in the coil trace groups in its corresponding local sector coil assembly 349 and current sensor output information related to the currents driven into the coil trace groups in its extended boundary region via sector links 392 from its neighbouring sector controllers 369.

At step 420, using the position sensor outputs (from step 410A) and the current sensor outputs (from step 410B), each sector controller 369 may adjust the step 410A position sensor outputs to compensate for electromagnetic coupling effects from currents driven into local sector coil assembly 349 and currents driven into neighbouring coil traces within extended boundary 391.

At step 430, each sector controller 369 receives the adjusted position sensor output information from position sensors 382 of neighbouring sectors 347, that are within its extended sector 347' and sends, to neighboring sector controllers 369, the adjusted sensor output information corresponding to local sensors 382 that are within the extended boundaries of such neighbouring sectors 347. Such exchange may be done via sector links 392.

At step 440, based on the adjusted position sensor outputs determined at step 420 and the adjusted position sensor output information from extended boundary 391 received at step 430, the position of one or more moveable stages 10 may be determined by any sector controllers 369 which are principal controllers for one or more moveable stages 10. At this stage, the position information may be sent via global network 93 to global controller 361 to determine which controller is the principal controller for each moveable stage 10 going forward (e.g. for the subsequent time step or for the remainder of the current time step). Alternatively, sector controllers 369 may collaboratively determine which sector controller 369 is the principal controller for each moveable stage 10 going forward (e.g. for the subsequent time step or for the remainder of the current time step). If the principal controller for a moveable stage 10 changes, the control states and any additional information that needs to be transferred may also be transferred via sector link 392 or system network 393 at this step 440, as discussed above.

At step 450, each local sector controller 369 that is a principal controller for one or more moveable stage(s) uses the block 440 moveable stage position and a target moveable stage position (which may be received from master controller 361 and/or from an external source (not shown)) to determine desired forces on its moveable stage(s) and current references for each coil trace group within its extended sector 347'. At this stage (i.e. during step 450), the current references determined by each local sector controller 369 do not yet accommodate or account for current references determined by neighbouring sector controllers 369 for their respective extended sectors 347'.

At step 460, the desired current references determined in step 450 by each local sector controller 369 that is a principal controller for one or more moveable stages may be used to determine current reference commands which are shared with its neighboring controllers. For a particular principal sector controller 369, current reference commands may be sent via sector links 392 to neighboring sector controllers (e.g. sector controllers 369A, 369D, 369E, 369F and 369C for sector controller 369B in the FIG. 17 example) associated with its extended sector regions (e.g. extended sector regions 391BA, 391BD, 391BE, 391BF and 391BC for sector controller 369B in the FIG. 17 example). Similarly, in block 460, each local sector controller 369 may receive current reference commands from its neighbouring sector controllers 369 for coil trace assemblies located in their respective extended sectors.

At step 470, once each local sector controller 369 has its own current references for each of its local coil trace groups (if that sector controller 369 is a principal sector controller or if that sector controller 369 otherwise determines its own current references) and the current reference commands (if any) from its neighbour sector controllers 369, the local sector controller 369 may determine the final current references for each of its local coil trace groups using, for example, an averaging or weighted averaging technique as described above. These final current references signals may then be used by local sector controller 369, local sector amplifiers 379 and optionally current feedback control module 352 for driving currents in the coil trace groups of local sector coil assemblies 389 such that such currents track the final current references. In step 480, cycle 400 is restarted.

Figure 22:
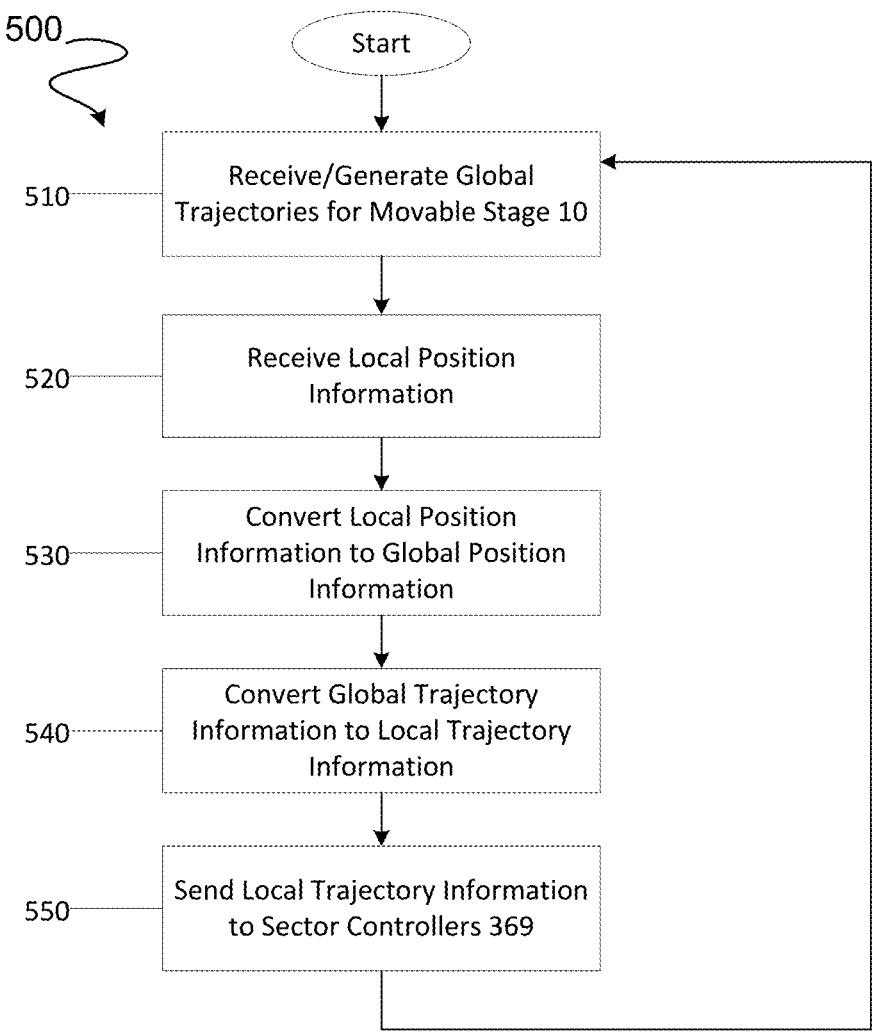
FIG. 22 is a flow chart illustrating a method of collaboration between a system controller and one or more sector controllers according to a particular embodiment.

FIG. 22 depicts a method 500 depicting how system controller 361 may interact with sector controllers 369 to maintain the global trajectories of each moveable stage 10 (i.e. their desired trajectories across stator 330 in reference to the overall stator coordinate frame, as opposed to their local trajectories across each sector 347). System controller 361 may comprise a moveable stage trajectory generation module for generating desired trajectories for each moveable stage 10 on stator 330 at step 510. Alternatively, system controller 361 may receive moveable stage trajectory information at step 510 from an external source (e.g. a user, a suitably configured computer, a suitably configured control interface, a programmable logic array and/or the like).

At step 520, system controller 361 receives local position feedback information for each moveable stage 10 from one or more local sector controllers 369 via system network 393. At step 520, system controller 361 may optionally determine which sector 347 is the principal sector for each moveable stage 10 going forward, based at least in part on one or both of the desired position of each moveable stage and the step 520 position feedback information received at controller 361 for each moveable stage.

At step 530, system controller 361 converts the step 520 local position feedback information into global position feedback information for each moveable stage 10 (i.e. position feedback information of each moveable stage 10 with reference to a global stator coordinate frame). In some embodiments, the principal sector for each moveable stage 10 going forward is determined as a part of step 530 based on the same or similar criteria to those discussed above.

At step 540, system controller 361 determines local trajectories for each moveable stage 10 based on the global position feedback information of step 530 and the global trajectories of step 510.

At step 550, the local trajectory for each moveable stage 10 is transmitted to its respective principal sector controller 369. Method 500 may continue to repeat continuously while the system is operating. In some embodiments, method 500 occurs once for every time step that method 400 occurs. In other embodiments, method 500 occurs less frequently than method 400 to minimize the computational cost for system controller 361.

Sector controllers 369 may also report other local information to system controller 361 via system network 393. Such information may include, but is not limited to, status, states and feedback positions of moveable stages (in reference to local stator coordinate frames). This local information may be converted into global information (in reference to the global stator coordinate frame) for use in trajectory generation, system performance display and diagnostics. System controller 361 may also be employed to synchronize data acquisition, data exchange, position control and other functions of sector controllers 369.

While a number of exemplary aspects and embodiments are discussed herein, those of skill in the art will recognize certain modifications, permutations, additions and sub-combinations thereof. For example:

- In this description and the accompanying claims, elements (such as, by way of non-limiting example, stator layers, coil traces, moveable stages and/or magnet arrays) are said to overlap one another in or along a direction. For example, coil traces 32, 34 from different stator layers 40, 42 may overlap one another in or along the stator-direction. When it is described that two or more objects overlap in or along the z direction, this usage should be understood to mean that a z direction-oriented line could be drawn to intersect the two or more objects.
- In many of the drawings and much of the description provided herein, moveable stages are shown as being static with their stage-x, stage-y and stage-z axes being the same as the stator-X, stator-Y and stator-Z axes of the corresponding stator. This custom is adopted in this disclosure for the sake of brevity and ease of explanation. It will of course be appreciated from this disclosure that a moveable stage can (and is designed to) move with respect to its stator, in which case the stage-x, stage-y, stage-z axes of the moveable stage may no longer be the same as (or aligned with) the stator-X, stator-Y and stator-Z axes of its stator. Directions, locations and planes defined in relation to the stator axes may generally be referred to as stator directions, stator locations and stator planes and directions, locations and planes defined in relation to the stage axes may be referred to as stage directions, stage locations and stage planes.

The description and associated claims herein refer to active portion of current carrying coils as coil traces. Although each coil trace may have a rectangular cross section, this is not necessary. It should be understood that the use of the term "traces" is used for convenience only that that coil traces may have any suitable cross-sectional shapes.

In some cases, the description may refer to driving current into particular coil trace group(s). It should be understand that such current may comprises multi-phase currents and different phases may be driven into particular individual coil traces from among the coil trace group(s).

In the description above, stators comprise current carrying coil traces and moveable stages comprise magnet arrays. It is of course possible that this could be reversed—i.e. stators could comprise magnet arrays and moveable stages could comprise current carrying coil traces. Also, whether a component (e.g. a stator or a moveable stage) is actually moving or whether the component is actually stationary will depend on the reference frame from which the component is observed. For example, a stator can move relative to a reference frame of a moveable stage, or both the stator and the moveable stage can move relative to an external reference frame. Accordingly, in the claims that follow, the terms stator and moveable stage and references thereto (including references to stator and/or stage x, y, z directions, stator and/or stage x, y, z-axes and/or the like) should not be interpreted literally unless the context specifically requires literal interpretation Moreover, unless the context specifically requires, it should be understood that the moveable stage (and its directions, axes and/or the like) can move relative to the stator (and its directions, axes and/or the like) or that the stator (and its directions, axes and/or the like) can move relative to a moveable stage (and its directions, axes and/or the like).

In this description and the accompanying claims, references are made to controlling, controlling the motion of and/or controlling the position of moveable stages in or with multiple (e.g. 6) degrees of freedom. Unless the context or the description specifically indicates otherwise, controlling, controlling the motion of and/or controlling the position of moveable stages in or with multiple degrees of freedom may be understood to mean applying feedback position control in the multiple degrees of freedom, but does not expressly require that there be motion of moveable stage in any such degree of freedom.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A system for controllably moving one or more moveable stages relative to a stator, the system comprising:
   one or more moveable stages, each of the one or more moveable stages comprising one or more magnetization elements and the one or more moveable stages comprising a first moveable stage;
   a stator comprising a plurality of sectors, each sector comprising a plurality of coil traces, the plurality of sectors further comprising a first sector comprising a first plurality of coil traces and a second sector comprising a second plurality of coil traces;
   a first controller and one or more first amplifiers associated with the first sector, the first controller and the one or more first amplifiers connected to controllably drive first currents in one or more first coil trace groups from among the first plurality of coil traces;
   a second controller and one or more second amplifiers associated with the second sector, the second controller and the one or more second amplifiers connected to controllably drive second currents in one or more second coil trace groups from among the second plurality of coil traces;
   the first and second controllers in bi-directional communication with one another via a sector link between the first and second controllers; wherein:
   the first sector comprises one or more first position sensors for sensing a position of the one or more moveable stages;
   the first sector comprises one or more first current sensors for sensing current in the first plurality of coil traces;
   the second sector comprises one or more second current sensors for sensing current in the second plurality of coil traces;
   the first controller is configured to collect first position sensor outputs from the one or more first position sensors and first current sensor outputs from the one or more first current sensors;
   the second controller is configured to collect second current sensor outputs from the one or more second current sensors;
   the second controller is configured to communicate the second current sensor outputs to the first controller via the sector link between the first and second controllers;
   the first controller is configured to determine an electromagnetic coupling-compensated position of the first moveable stage based at least in part on the first position sensor outputs, the first current sensor outputs and the second current sensor outputs.

2. A system according to claim 1 wherein if the electromagnetic coupling-compensated position is located in the first sector, the first controller is configured to controllably drive first currents in a particular first coil trace group from among the one or more first coil trace groups based at least in part on the electromagnetic coupling-compensated position to thereby cause interaction with the one or more magnetization elements of the first moveable stage which causes corresponding movement of the first moveable stage relative to the stator.

3. A system according to claim 1 wherein if the electromagnetic coupling-compensated position is located in whole or in part in a notional first extended region associated with the first sector, the second extended region overlapping in a stator-Z direction with the first sector and overlapping in the stator-Z direction with a portion of the second sector, then:

the second controller is configured to determine a particular first current reference command for a particular first coil trace group from among the plurality of first coil traces based at least in part on the electromagnetic coupling-compensated position of the first moveable stage and to communicate the particular first current reference command to the first controller via the sector link between the first and second controllers; and the first controller is configured to determine a particular first final current reference for the particular first coil trace group based at least in part on the particular first current reference command, and the first controller and the one or more first amplifiers are connected to drive first currents into the particular first coil trace group and to cause the first currents in the particular first coil trace group to track the particular first final current reference to thereby cause interaction with the one or more magnetization elements of the first moveable stage which causes corresponding movement of the first moveable stage relative to the stator.

4. A system according to claim 1 wherein:
the second sector comprises one or more second position sensors for sensing a position of the first moveable stage;
the second controller is configured to collect second position sensor outputs from the one or more second position sensors;
the second controller is configured to communicate the second position sensor outputs to the first controller via the sector link between the first and second controllers;
the first controller is configured to determine the electromagnetic coupling-compensated position of the first moveable stage based at least in part on the first position sensor outputs, the second position sensor outputs, the first current sensor outputs and the second current sensor outputs.

5. A system according to claim 1 comprising a master controller, wherein the master controller is connected to communicate with the first controller and the second controller and the master controller is configured to designate which controller has ownership of the first moveable stage based at least in part on the electromagnetic coupling-compensated position by designating which of the first and second controllers is the first controller and which of the first and second controllers is the second controller.

6. A system according to claim 1 comprising a master controller, wherein the master controller is connected to communicate with the first controller and the second controller and the master controller is configured to change which controller has ownership of the first moveable stage based at least in part on a change of the electromagnetic coupling-compensated position by designating which of the first and second controllers is the first controller and which of the first and second controllers is the second controller.

7. A system according to claim 1 wherein:
the first controller is configured to determine one or more first controller control states related to control of the movement of the first moveable stage relative to the stator and the first controller is configured to communicate at least a portion of the one or more first controller control states to the second controller via the sector link between the first and second controllers; and
the second controller is configured to take ownership of and controllably move the first moveable stage on a subsequent time step based at least in part on the portion of the first controller control states.

8. A system according to claim 1 wherein the one or more moveable stages comprises a second moveable stage and the first controller is configured to determine a second electromagnetic coupling-compensated position of the second moveable stage based at least in part on the first position sensor outputs, the first current sensor outputs and the second current sensor outputs.

9. A system according to claim 1 wherein:
the one or more moveable stages comprises a second moveable stage;
the second sector comprises one or more second position sensors for sensing a position of the first moveable stage;
the second controller is configured to collect second position sensor outputs from the one or more second position sensors;
the first controller is configured to communicate the first position sensor outputs and the first current sensor outputs to the second controller via the sector link between the first and second controllers; and
the second controller is configured to determine a second electromagnetic coupling-compensated position of the second moveable stage based at least in part on the first position sensor outputs, the second position sensor outputs, the first current sensor outputs and the second current sensor outputs.

10. A system according to claim 1 wherein:
the one or more moveable stages comprises a second moveable stage;
the second sector comprises one or more second position sensors for sensing a position of the first moveable stage;
the second controller is configured to collect second position sensor outputs from the one or more second position sensors;
the first controller is configured to communicate the first current sensor outputs to the second controller via the sector link between the first and second controllers; and
the second controller is configured to determine a second electromagnetic coupling-compensated position of the second moveable stage based at least in part on the second position sensor outputs, the first current sensor outputs and the second current sensor outputs.

11. A system according to claim 2 wherein:
the second controller is configured to determine a particular first current reference command for the particular first coil trace group based at least in part on the electromagnetic coupling-compensated position of the first moveable stage and to communicate the particular first current reference command to the first controller via the sector link between the first and second controllers; and
the first controller is configured to determine a particular first final current reference for the particular first coil trace group based at least in part on the particular first current reference command, and the first controller and the one or more first amplifiers are connected to drive the first currents into the particular first coil trace group and to cause the first currents in the particular first coil trace group to track the particular first final current reference to thereby cause the interaction with the one or more magnetization elements of the first moveable stage which causes the corresponding movement of the first moveable stage relative to the stator.

12. A system according to claim 2 wherein the second controller is configured to influence the controllable movement of the first moveable stage relative to the stator when the electromagnetic coupling-compensated position is located in whole or in part in a notional first extended region associated with the first sector, the first extended region overlapping in the stator-Z direction with the first sector and overlapping in a stator-Z direction with a portion of the second sector.

13. A system according to claim 4 wherein if the electromagnetic coupling-compensated position is located in the second sector, the second controller is configured to controllably drive second currents in a particular second coil trace group from among the one or more second coil trace groups based at least in part on the electromagnetic coupling-compensated position to thereby cause interaction with the one or more magnetization elements of the first moveable stage which causes corresponding movement of the first moveable stage relative to the stator.

14. A system according to claim 4 wherein:
the first controller is configured to determine a particular second current reference command for the particular second coil trace group based at least in part on the electromagnetic coupling-compensated position of the first moveable stage and to communicate the particular second current reference command to the second controller via the sector link between the first and second controllers; and
the second controller is configured to determine a particular second final current reference for the particular second coil trace group based at least in part on the particular second current reference command, and the second controller and the one or more second amplifiers are connected to drive the second currents into the particular second coil trace group and to cause the second currents in the particular second coil trace group to track the particular second final current reference to thereby cause the interaction with the one or more magnetization elements of the first moveable stage which causes the corresponding movement of the first moveable stage relative to the stator.

15. A system according to claim 4 herein wherein the first controller is configured to influence the controllable movement of the first moveable stage relative to the stator when the electromagnetic coupling-compensated position is located in whole or in part in a notional second extended region associated with the second sector, the second extended region overlapping in a stator-Z direction with the second sector and overlapping in the stator-Z direction with a portion of the first sector.

16. A system according to claim 4 wherein if the electromagnetic coupling-compensated position is located in whole or in part in a notional first extended region associated with the first sector, the first extended region overlapping in a stator-Z direction with the first sector and overlapping in the stator-Z direction with a portion of the second sector which includes the particular second coil trace group, then:
the second controller is configured to determine a particular first current reference command for a particular first coil trace group from among the plurality of first coil traces based at least in part on the electromagnetic coupling-compensated position of the first moveable stage and to communicate the particular first current reference command to the first controller via the sector link between the first and second controllers; and
the first controller is configured to determine a particular first final current reference for the particular first coil trace group based at least in part on the particular first current reference command, and the first controller and the one or more first amplifiers are connected to drive first currents into the particular first coil trace group and to cause the first currents in the particular first coil trace group to track the particular first final current reference to thereby cause interaction with the one or more magnetization elements of the first moveable stage which causes corresponding movement of the first moveable stage relative to the stator.

17. A system according to claim 6 wherein the portion of the first controller control states comprises the electromagnetic coupling-compensated position.

18. A method for controllably moving one or more moveable stages relative to a stator, the system comprising:
providing one or more moveable stages, each of the one or more moveable stages comprising one or more magnetization elements and the one or more moveable stages comprising a first moveable stage;
providing a stator comprising a plurality of sectors, each sector comprising a plurality of coil traces, the plurality of sectors further comprising a first sector comprising a first plurality of coil traces and a second sector comprising a second plurality of coil traces;
providing a first controller and one or more first amplifiers associated with the first sector, the first controller and the one or more first amplifiers connected to controllably drive first currents in one or more first coil trace groups from among the first plurality of coil traces;
providing a second controller and one or more second amplifiers associated with the second sector, the second controller and the one or more second amplifiers connected to controllably drive second currents in one or more second coil trace groups from among the second plurality of coil traces;
collecting, by the first controller, first position sensor outputs from one or more first sector position sensors and first current sensor outputs from one or more first sector current sensors;
collecting, by the second controller, second current sensor outputs from one or more second sector current sensors;
communicating second current sensor outputs from the second controller to the first controller via a sector link between the first and second controllers;
determining, by the first controller, an electromagnetic coupling-compensated position of the first moveable stage based at least in part on the first position sensor outputs, the first current sensor outputs and the second current sensor outputs.

19. A system for controllably moving one or more moveable stages relative to a stator, the system comprising:
one or more moveable stages, each of the one or more moveable stages comprising one or more magnetization elements, each magnetization element having a corresponding magnetization direction and the one or more moveable stages comprising a first moveable stage;
a stator comprising a plurality of sectors, each sector comprising a plurality of coil traces, the plurality of sectors further comprising a first sector comprising a plurality of first coil traces a plurality of first position sensors and a second sector comprising a plurality of second coil traces and a plurality of second position sensors;
a first local controller and one or more first amplifiers associated with the first sector, the first controller and the one or more first amplifiers connected to controllably drive first currents in the plurality of first coil traces;

a second local controller and one or more second amplifiers associated with the second sector, the second controller and the one or more second amplifiers connected to controllably drive second currents in the second plurality of coil traces;

a global controller, the global controller in bi-directional communication with each of the first and second local controllers; wherein:

the first controller is configured to receive first position sensor outputs from the plurality of first position sensors and communicate the first positon sensor outputs to the global controller;

the second controller is configured to receive second position sensor outputs from the plurality of second position sensors and communicate the second position sensor outputs to the global controller;

the global controller is configured to determine a global position of the first moveable stage on the stator based at least in part on the first position sensor outputs and the second position sensor outputs; and the global controller is configured to determine a local trajectory of the first moveable stage on the first sector based at least in part on the global position of the first moveable stage and a global trajectory of the first moveable stage and to communicate the local trajectory of the first moveable stage to the first local controller.

20. A system according to claim 19 wherein the first controller is configured to controllably drive first currents in a particular first coil trace group from among the plurality of first coil traces based at least in part on the local trajectory of the first moveable stage on the first sector to thereby cause interaction with the one or more magnetization elements of the first moveable stage which causes corresponding movement of the first moveable stage relative to the stator.

* * * * *

UNITED STATES PATENT AND TRADEMARK OFFICE
CERTIFICATE OF CORRECTION

PATENT NO. : 11,196,329 B2
APPLICATION NO. : 16/941475
DATED : December 7, 2021
INVENTOR(S) : Xiaodong Lu It is certified that error appears in the above-identified patent and that said Letters Patent is hereby corrected as shown below:

In the Claims

Claim 18 at Column 70, Lines 14-50 should read:
18. A method for controllably moving one or more moveable stages relative to a stator, the method comprising:
   providing one or more moveable stages, each of the one or more moveable stages comprising one or more magnetization elements and the one or more moveable stages comprising a first moveable stage;
   providing a stator comprising a plurality of sectors, each sector comprising a plurality of coil traces, the plurality of sectors further comprising a first sector comprising a first plurality of coil traces and a second sector comprising a second plurality of coil traces;
   providing a first controller and one or more first amplifiers associated with the first sector, the first controller and the one or more first amplifiers connected to controllably drive first currents in one or more first coil trace groups from among the first plurality of coil traces;
   providing a second controller and one or more second amplifiers associated with the second sector, the second controller and the one or more second amplifiers connected to controllably drive second currents in one or more second coil trace groups from among the second plurality of coil traces;
   collecting, by the first controller, first position sensor outputs from one or more first sector position sensors and first current sensor outputs from one or more first sector current sensors;
   collecting, by the second controller, second current sensor outputs from one or more second sector current sensors;
   communicating second current sensor outputs from the second controller to the first controller via a sector link between the first and second controllers;
   determining, by the first controller, an electromagnetic coupling-compensated position of the first moveable stage based at least in part on the first position sensor outputs, the first current sensor outputs and the second current sensor outputs.

Signed and Sealed this
Twentieth Day of September, 2022

Katherine Kelly Vidal
*Director of the United States Patent and Trademark Office*